United States Patent
Ohsawa et al.

(10) Patent No.: US 12,527,190 B2
(45) Date of Patent: Jan. 13, 2026

(54) DISPLAY PANEL WITH A REDUCED DRIVING VOLTAGE WITHOUT USING AN ALKALI METAL

(71) Applicant: Semiconductor Energy Laboratory Co., Ltd., Kanagawa-ken (JP)

(72) Inventors: Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 725 days.

(21) Appl. No.: 17/536,591

(22) Filed: Nov. 29, 2021

(65) Prior Publication Data
US 2022/0181572 A1 Jun. 9, 2022

(30) Foreign Application Priority Data

Dec. 4, 2020 (JP) .................................. 2020-202050
Dec. 25, 2020 (JP) .................................. 2020-216796
Dec. 29, 2020 (JP) .................................. 2020-219814

(51) Int. Cl.
*H10K 59/35* (2023.01)
*H10K 50/11* (2023.01)
(Continued)

(52) U.S. Cl.
CPC ............. *H10K 59/35* (2023.02); *H10K 50/11* (2023.02); *H10K 50/15* (2023.02); *H10K 59/12* (2023.02);
(Continued)

(58) Field of Classification Search
CPC ... H10K 50/16–167; H10K 50/17–171; H10K 50/19; H10K 50/30–38
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Felipe A. Angel, Rui Gao, Jason U. Wallace, Ching W. Tang; Silver-induced activation of 8-hydroxyquinolinato lithium as electron injection material in single-stack and tandem OLED devices; Organic Electronics, vol. 59, 2018, pp. 220-223, https://doi.org/10.1016/j.orgel.2018.05.023. (Year: 2018).*
(Continued)

*Primary Examiner* — Christine S. Kim
*Assistant Examiner* — Tyler J Wiegand
(74) *Attorney, Agent, or Firm* — Husch Blackwell LLP

(57) ABSTRACT

A novel display panel is provided. The display panel includes a first light-emitting device, a second light-emitting device, and a partition wall. The first light-emitting device includes a first electrode, a second electrode, and a first layer sandwiched therebetween. The first layer contains a first organic compound and a first metal. The first organic compound includes an unshared electron pair. The first metal belongs to Group 5, Group 7, Group 9, Group 11, or Group 13. The second light-emitting device includes a third electrode, a fourth electrode, and a second layer sandwiched therebetween. The second layer contains the first organic compound and the first metal. A first space is provided between the second layer and the first layer. The partition wall has a first opening and a second opening. The partition wall overlaps with the first space between the first opening and the second opening.

16 Claims, 40 Drawing Sheets

(51) Int. Cl.
  *H10K 50/15* (2023.01)
  *H10K 59/12* (2023.01)
  *H10K 101/40* (2023.01)
  *H10K 101/20* (2023.01)

(52) U.S. Cl.
  CPC ..... *H10K 2101/20* (2023.02); *H10K 2101/40* (2023.02)

(56) References Cited

U.S. PATENT DOCUMENTS

| | | | |
|---|---|---|---|
| 10,950,805 | B2 | 3/2021 | Watabe et al. |
| 11,094,903 | B2 | 8/2021 | Ohsawa et al. |
| 11,404,656 | B2 | 8/2022 | Ohsawa et al. |
| 12,058,878 | B2 | 8/2024 | Yamazaki et al. |
| 2002/0072139 | A1 | 6/2002 | Kashiwabara |
| 2007/0040494 | A1* | 2/2007 | Su ................. H10K 50/15 313/506 |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0001620 | A1* | 1/2013 | Sugisawa ......... H10K 59/122 257/E33.062 |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2013/0299789 | A1 | 11/2013 | Yamazaki et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0019972 | A1 | 1/2017 | Kimura et al. |
| 2017/0141167 | A1 | 5/2017 | Naganuma |
| 2017/0256754 | A1 | 9/2017 | Defranco et al. |
| 2018/0005668 | A1 | 1/2018 | Shionoiri et al. |
| 2018/0190908 | A1 | 7/2018 | Ke et al. |
| 2019/0378859 | A1 | 12/2019 | Kawashima et al. |
| 2020/0203662 | A1 | 6/2020 | Mollard et al. |
| 2021/0005814 | A1 | 1/2021 | Watabe et al. |
| 2021/0242220 | A1 | 8/2021 | Yamazaki et al. |
| 2021/0311341 | A1 | 10/2021 | Kawashima et al. |
| 2024/0397741 | A1* | 11/2024 | Yamazaki ............ H10K 65/00 |

FOREIGN PATENT DOCUMENTS

| | | |
|---|---|---|
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2018-201012 A | 12/2018 |
| JP | 2019-179696 A | 10/2019 |
| JP | 2020-160305 A | 10/2020 |
| TW | 202033054 | 9/2020 |
| WO | WO 2019/123190 A1 | 6/2019 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.

Eki.R et al., "A 1/2.3inch 12.3Mpixel with On-Chip 4.97TOPS/W CNN Processor Back-Illuminated Stacked CMOS Image Sensor", ISSCC 2021 (Digest of Technical Papers, IEEE International Solid-State Circuits Conference), Feb. 13, 2021, pp. 154-155, 155a.

Taiwanese Office Action (Application No. 110143906) Dated Aug. 19, 2025.

* cited by examiner

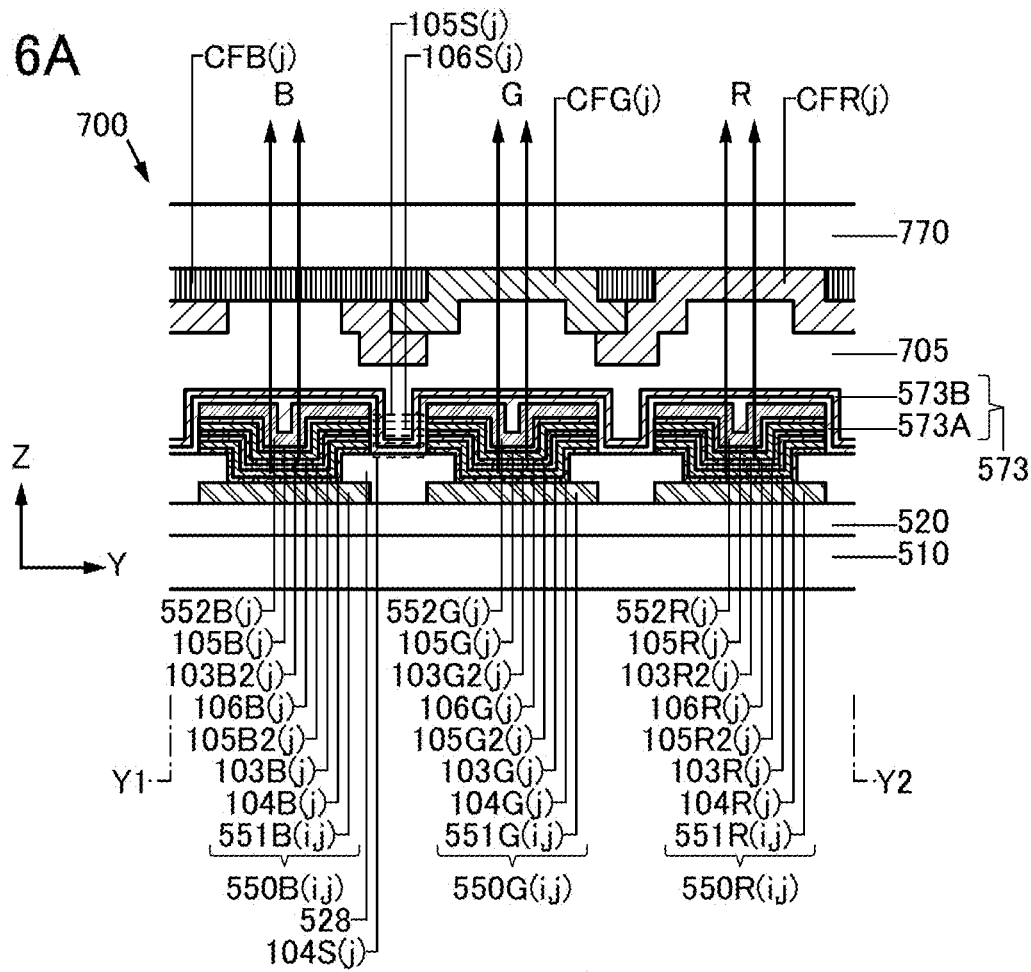
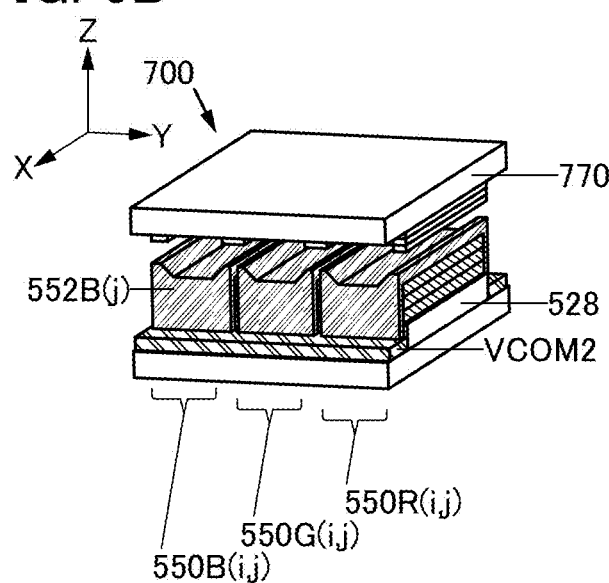
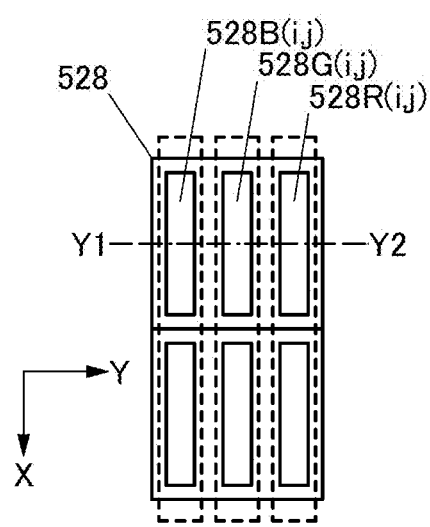
FIG. 6A
FIG. 6B
FIG. 6C

FIG. 43

| | Point 1 | Point 2 | Point 3 | Point 4 | Point 5 | Point 6 |
|---|---|---|---|---|---|---|
| Initial time | | | | | | |
| Emission area ratio | 100% | 100% | 100% | 100% | 100% | 100% |
| Comparative light-emitting device 1 (48 hours later) | | | | | | |
| Emission area ratio | 0% | 0% | 0% | 0% | 0% | 0% |
| Light-emitting device 1 (48 hours later) | | | | | | |
| Emission area ratio | 74% | 47% | 57% | 72% | 81% | 77% |

(Point 3 cell labeled with non-emission area and emission area)

DISPLAY PANEL WITH A REDUCED DRIVING VOLTAGE WITHOUT USING AN ALKALI METAL

BACKGROUND OF THE INVENTION

1. Field of the Invention

One embodiment of the present invention relates to a display panel, a method for manufacturing a display panel, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A method for manufacturing an organic EL display in which a light-emitting layer can be formed without using a fine metal mask is known. As an example, there is a method for manufacturing an organic EL display (Patent Document 1) having a step of forming a first light-emitting layer as a continuous film crossing a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film crossing a display region by deposition of a second luminescent organic material, which contains a mixture of a host material and a dopant material but differs from the first luminescent organic material, over the first light-emitting layer; and a step of forming a counter electrode over the second light-emitting layer.

A light-emitting device (Patent Document 2) is known which includes an electron-injection layer between a cathode and a light-emitting layer, in which the electron-injection layer is a mixed film of a transition metal and an organic compound including an unshared electron pair, and the transition metal atom and the organic compound form a singly occupied molecular orbital (SOMO).

A light-emitting device (Patent Document 3) with low driving voltage and high reliability is known which includes an electron-injection layer between a cathode and a light-emitting layer, in which the electron-injection layer is a mixed film of a metal and an organic compound having a function of interacting with the metal as a tridentate or tetradentate ligand, and the metal atom and the organic compound form a SOMO.

REFERENCE

[Patent Document 1] Japanese Published Patent Application No. 2012-160473
[Patent Document 2] Japanese Published Patent Application No. 2018-201012
[Patent Document 3] PCT International Publication No. WO2019/123190 pamphlet

SUMMARY OF THE INVENTION

An object of one embodiment is to provide a novel display panel that is highly convenient, useful, or reliable. Another object of one embodiment of the present invention is to provide a novel method for manufacturing a display panel that is highly convenient, useful, or reliable. Another object is to provide a novel data processing device that is highly convenient, useful, or reliable. Another object is to provide a novel display panel, a novel method for manufacturing a display panel, a novel data processing device, or a novel semiconductor device.

Note that the description of these objects does not preclude the existence of other objects. One embodiment of the present invention does not have to achieve all these objects. Other objects will be apparent from and can be derived from the description of the specification, the drawings, the claims, and the like.

(1) One embodiment of the present invention is a display panel including a first light-emitting device, a second light-emitting device, and a partition wall (an insulating spacer).

The first light-emitting device includes a first electrode, a second electrode, and a first layer. The second electrode overlaps with the first electrode. The first layer includes a region sandwiched between the second electrode and the first electrode.

The first layer contains a first organic compound and a first metal. The first organic compound includes an unshared electron pair. The first metal belongs to Group 5, Group 7, Group 9, Group 11, or Group 13.

The second light-emitting device includes a third electrode, a fourth electrode, and a second layer. The fourth electrode overlaps with the third electrode. The second layer includes a region sandwiched between the fourth electrode and the third electrode.

The second layer contains the first organic compound and the first metal. A first space (gap or distance) is provided between the second layer and the first layer.

The partition wall has a first opening and a second opening. The first opening overlaps with the first electrode, and the second opening overlaps with the third electrode. The partition wall overlaps with the first space between the first opening and the second opening.

(2) Another embodiment of the present invention is a display panel including a first light-emitting device, a second light-emitting device, and a partition wall.

The first light-emitting device includes a first electrode, a second electrode, and a first layer. The second electrode overlaps with the first electrode. The first layer includes a region sandwiched between the second electrode and the first electrode.

The first layer contains a first organic compound and a first metal. The first organic compound and the first metal form a SOMO. The first organic compound includes an unshared electron pair. The first metal belongs to Group 5, Group 7, Group 9, Group 11, or Group 13.

The second light-emitting device includes a third electrode, a fourth electrode, and a second layer. The fourth electrode overlaps with the third electrode. The second layer includes a region sandwiched between the fourth electrode and the third electrode.

The second layer contains the first organic compound and the first metal. A first space is provided between the second layer and the first layer.

The partition wall has a first opening and a second opening. The first opening overlaps with the first electrode, and the second opening overlaps with the third electrode. The partition wall overlaps with the first space between the first opening and the second opening.

(3) Another embodiment of the present invention is the display panel in which the first light-emitting device includes a first unit and a third layer.

The first unit includes a region sandwiched between the first layer and the first electrode. The third layer includes a region sandwiched between the first unit and the first electrode.

The third layer contains a first hole-transport material (a material having a hole-transport property) and a first acceptor substance (a substance having an acceptor property). The third layer has an electrical resistivity greater than or equal to $1 \times 10^2$ [Ω·cm] and less than or equal to $1 \times 10^8$ [Ω·cm].

The second light-emitting device includes a second unit and a fourth layer. The second unit includes a region sandwiched between the second layer and the third electrode.

The fourth layer includes a region sandwiched between the second unit and the third electrode. The fourth layer contains the first hole-transport material and the first acceptor substance. A second space is provided between the fourth layer and the third layer. The partition wall overlaps with the second space between the first opening and the second opening.

(4) Another embodiment of the present invention is the display panel in which the first light-emitting device includes a third unit and a first intermediate layer.

The third unit includes a region sandwiched between the second electrode and the first unit. The first intermediate layer includes a region sandwiched between the third unit and the first unit.

The first intermediate layer contains a second hole-transport material and a second acceptor substance. The first intermediate layer has an electrical resistivity greater than or equal to $1 \times 10^2$ [Ω·cm] and less than or equal to $1 \times 10^8$ [Ω·cm].

The second light-emitting device includes a fourth unit and a second intermediate layer. The fourth unit includes a region sandwiched between the fourth electrode and the second unit. The second intermediate layer includes a region sandwiched between the fourth unit and the second unit.

The second intermediate layer contains the second hole-transport material and the second acceptor substance. A third space is provided between the second intermediate layer and the first intermediate layer. The partition wall overlaps with the third space between the first opening and the second opening.

(5) Another embodiment of the present invention is the display panel, in which the first light-emitting device includes a fifth layer.

The fifth layer includes a region sandwiched between the first intermediate layer and the first unit. The fifth layer contains a second organic compound and a second metal. The second organic compound includes an unshared electron pair. The second metal belongs to Group 5, Group 7, Group 9, Group 11, or Group 13.

The second light-emitting device includes a sixth layer. The sixth layer includes a region sandwiched between the second intermediate layer and the second unit, and contains the second organic compound and the second metal. A fourth space is provided between the sixth layer and the fifth layer. The partition wall overlaps with the fourth space between the first opening and the second opening.

Thus, for example, driving voltage of the display panel can be reduced without using an alkali metal for the light-emitting device. Even when etching is performed, manufacturing facilities are not contaminated by an alkali metal. Adjacent light-emitting devices can be separated by etching. A phenomenon in which current flows between the first electrode and the fourth electrode through the first intermediate layer and the second intermediate layer can be prevented. A phenomenon in which current flows between the third electrode and the second electrode through the first intermediate layer and the second intermediate layer can be prevented. In addition, occurrence of crosstalk between the first light-emitting device and the second light-emitting device can be prevented. As a result, a novel display panel that is highly convenient, useful, or reliable can be provided.

(6) Another embodiment of the present invention is a display panel including a first light-emitting device, a second light-emitting device, and a partition wall.

The first light-emitting device includes a first electrode, a second electrode, a first layer, and a second layer. Note that the second electrode overlaps with the first electrode.

The first layer includes a region sandwiched between the second electrode and the first electrode. The first layer contains a first organic compound and a first metal. The first organic compound includes an unshared electron pair. The first metal belongs to Group 5, Group 7, Group 9, Group 11, or Group 13.

The second layer includes a region sandwiched between the second electrode and the first layer. The second layer contains a second hole-transport material and a second acceptor substance. The second layer has an electrical resistivity greater than or equal to $1 \times 10^2$ [Ω·cm] and less than or equal to $1 \times 10^8$ [Ω·cm].

The second light-emitting device includes a third electrode, a third layer, and a fourth layer. The fourth layer includes a region sandwiched between the second electrode and the third electrode.

The third layer includes a region sandwiched between the fourth layer and the third electrode. The third layer contains the first organic compound and the first metal. A first space is provided between the third layer and the first layer.

The fourth layer contains the second hole-transport material and the second acceptor substance. A second space is provided between the fourth layer and the second layer.

The partition wall has a first opening and a second opening. The first opening overlaps with the first electrode, and the second opening overlaps with the third electrode. The partition wall overlaps with the first space and the second space between the first opening and the second opening.

(7) Another embodiment of the present invention is a display panel including a first light-emitting device, a second light-emitting device, and a partition wall.

The first light-emitting device includes a first electrode, a second electrode, a first layer, and a second layer. Note that the second electrode overlaps with the first electrode.

The first layer includes a region sandwiched between the second electrode and the first electrode. The first layer contains a first organic compound and a first metal. The first organic compound and the first metal form a SOMO.

The second layer includes a region sandwiched between the second electrode and the first layer. The second layer contains a second hole-transport material and a second acceptor substance. The second layer has an electrical resistivity greater than or equal to $1\times10^2$ [Ω·cm] and less than or equal to $1\times10^8$ [Ω·cm].

The second light-emitting device includes a third electrode, a third layer, and a fourth layer. The fourth layer includes a region sandwiched between the second electrode and the third electrode.

The third layer includes a region sandwiched between the fourth layer and the third electrode. The third layer contains the first organic compound and the first metal. A first space is provided between the third layer and the first layer.

The fourth layer contains the second hole-transport material and the second acceptor substance. A second space is provided between the fourth layer and the second layer.

The partition wall has a first opening and a second opening. The first opening overlaps with the first electrode, and the second opening overlaps with the third electrode. The partition wall overlaps with the first space and the second space between the first opening and the second opening.

(8) Another embodiment of the present invention is the display panel in which the first light-emitting device includes a fifth layer.

The fifth layer includes a first region and a second region. The first region is sandwiched between the second electrode and the second layer. The second region is sandwiched between the second electrode and the fourth layer. The fifth layer contains a third hole-transport material.

(9) Another embodiment of the present invention is the display panel in which an energy level of the singly occupied molecular orbital (SOMO) is lower than an energy level of the lowest unoccupied molecular orbital (LUMO) of the first organic compound within a range greater than or equal to −1.5 eV and less than 0 eV.

(10) Another embodiment of the present invention is the display panel in which the concentration of an alkali metal in the first layer is lower than the concentration of the first metal in the first layer.

(11) Another embodiment of the present invention is the display panel in which the first organic compound has an electron deficient heteroaromatic ring, and the first metal is silver.

Thus, for example, driving voltage of the display panel can be reduced without using an alkali metal for the light-emitting device. Adjacent light-emitting devices can be separated by etching. Even when etching is performed, manufacturing facilities are not contaminated by an alkali metal. As a result, a novel display panel that is highly convenient, useful, or reliable can be provided.

(12) Another embodiment of the present invention is the display panel in which the second hole-transport material is an aromatic amine compound or an organic compound having a π-electron rich heteroaromatic ring, and the second acceptor substance is a transition metal oxide or an organic compound containing fluorine or a cyano group.

With this structure, adjacent light-emitting devices can be separated by etching, for example. Furthermore, a change in characteristics of the light-emitting device caused by the etching step can be suppressed. As a result, a novel display panel that is highly convenient, useful, or reliable can be provided.

(13) Another embodiment of the present invention is the display panel including an insulating film.

The insulating film fills the first space and fills a space between the first unit and the second unit.

(14) Another embodiment of the present invention is the display panel including a first coloring layer and a second coloring layer.

Each of the first light-emitting device and the second light-emitting device emits white light.

The first coloring layer overlaps with the first light-emitting device. The second coloring layer overlaps with the second light-emitting device. The second coloring layer and the first coloring layer transmit light of different colors.

(15) Another embodiment of the present invention is a data processing device including at least one of a keyboard, a hardware button, a pointing device, a touch sensor, an illuminance sensor, an imaging device, an audio input device, an eye-gaze input device, and an attitude sensing device, and the above display panel.

(16) Another embodiment of the present invention is a method for manufacturing a display panel having the following first to twelfth steps.

In the first step, a first electrode and a second electrode are formed.

In the second step, a partition wall is formed between the first electrode and the second electrode.

In the third step, a first layer containing a hole-transport material and an acceptor substance is formed over the first electrode and the second electrode.

In the fourth step, a first unit is formed over the first layer.

In the fifth step, a second layer containing a first organic compound and a first metal is formed over the first unit.

In the sixth step, a first conductive film is formed over the second layer.

In the seventh step, a first light-emitting device is formed by removing the first layer, the first unit, the second layer, and the first conductive film over the second electrode by photoetching In the eighth step, a third layer containing the hole-transport material and the acceptor substance is formed over the first light-emitting device and the second electrode.

In the ninth step, a second unit is formed over the third layer.

In the tenth step, a fourth layer containing the first organic compound and the first metal is formed over the second unit.

In the eleventh step, a second conductive film is formed over the fourth layer.

In the twelfth step, the third layer, the second unit, the fourth layer, and the second conductive film over the first light-emitting device is removed by photoetching, whereby the first light-emitting device and a second light-emitting device are formed.

(17) Another embodiment of the present invention is a method for manufacturing a display panel having the following first to tenth steps.

In the first step, a first electrode and a second electrode are formed.

In the second step, a partition wall is formed between the first electrode and the second electrode.

In the third step, a first hole-transport material and a first acceptor substance is formed over the first electrode and the second electrode.

In the fourth step, a first unit is formed over the first layer.

In the fifth step, a second layer containing a first organic compound and a first metal is formed over the first unit.

In the sixth step, a third layer containing a second hole-transport material and a second acceptor substance is formed over the second layer.

In the seventh step, a second unit is formed over the third layer.

In the eighth step, a fourth layer containing a second organic compound and a second metal is formed over the second unit.

In the ninth step, a conductive film is formed over the fourth layer.

In the tenth step, a first light-emitting device and a second light-emitting device are formed by removing the first layer, the first unit, the second layer, the third layer, the second unit, the fourth layer, and the conductive film over the partition wall by photoetching.

Thus, a display panel including a plurality of light-emitting devices can be manufactured without using a metal mask. Adjacent light-emitting devices can be separated by etching, for example. As a result, a method for manufacturing a novel display panel that is highly convenient, useful, or reliable can be provided.

Although the block diagram attached to this specification shows components classified by their functions in independent blocks, it is difficult to classify actual components according to their functions completely, and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components, such as a case where part of a wiring serves as an electrode. The term "connection" in this specification also means such a case where one conductive film has functions of a plurality of components.

In this specification, one of a first electrode and a second electrode of a transistor refers to a source electrode and the other refers to a drain electrode.

One embodiment of the present invention can provide a novel display panel that is highly convenient, useful, or reliable. A novel method for manufacturing a display panel that is highly convenient, useful, or reliable can be provided. A novel data processing device that is highly convenient, useful, or reliable can be provided. A novel display panel, a novel method for manufacturing a display panel, a novel data processing device, or a novel semiconductor device can be provided.

Note that the description of these effects does not preclude the existence of other effects. One embodiment of the present invention does not necessarily have all these effects. Other effects will be apparent from and can be derived from the description of the specification, the drawings, the claims, and the like.

BRIEF DESCRIPTION OF THE DRAWINGS

FIGS. 6A to 6C illustrate a structure of a display panel in Embodiment.

FIG. 43 is an optical image showing emission states of light-emitting devices in Example before and after 48-hour preservation at 65° C. and a humidity of 95%.

DETAILED DESCRIPTION OF THE INVENTION

Figure 1A:
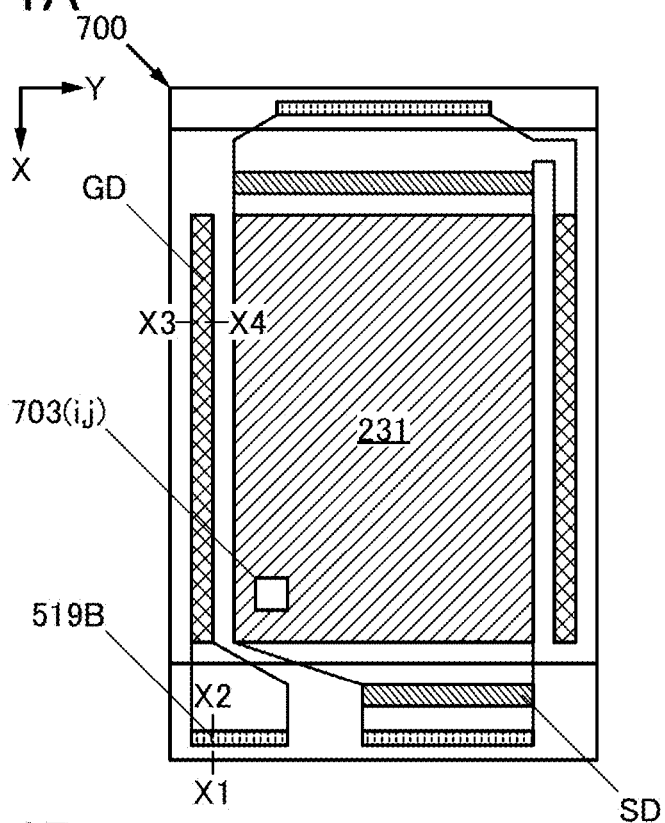
FIGS. 1A and 1B illustrate a structure of a display panel in Embodiment.

A display panel of one embodiment of the present invention includes a first light-emitting device, a second light-emitting device, and a partition wall. The first light-emitting device includes a first electrode, a second electrode, and a first layer. The second electrode overlaps with the first electrode. The first layer includes a region sandwiched between the second electrode and the first electrode. The first layer contains a first organic compound and a first metal. The first organic compound includes an unshared electron pair. The first metal belongs to Group 5, Group 7, Group 9, Group 11, or Group 13. The second light-emitting device includes a third electrode, a fourth electrode, and a second layer. The fourth electrode overlaps with the third electrode. The second layer includes a region sandwiched between the fourth electrode and the third electrode. The second layer contains the first organic compound and the first metal. A first space is provided between the second layer and the first layer. The partition wall has a first opening and a second opening. The partition wall overlaps with the first space between the first opening and the second opening.

Thus, for example, driving voltage of the display panel can be reduced without using an alkali metal for the light-emitting device. Adjacent light-emitting devices can be separated by etching. Even when etching is performed, manufacturing facilities are not contaminated by an alkali metal. As a result, a novel display panel that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and the description thereof is not repeated.

Embodiment 1

In this embodiment, a structure of a display panel of one embodiment of the present invention will be described with reference to FIGS. 1A and 1B to FIG. 14.

Figure 1B:
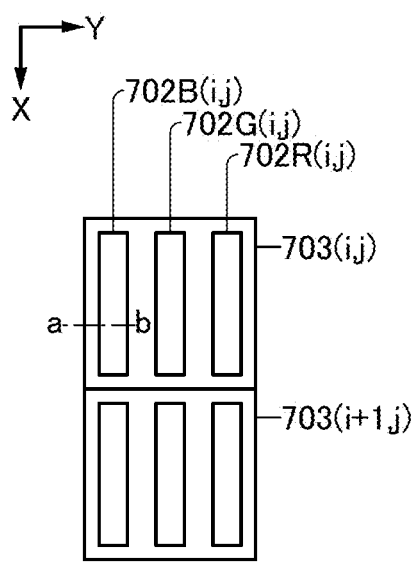

FIGS. 1A and 1B are top views illustrating a structure of a display panel of one embodiment of the present invention. FIG. 1A is a top view illustrating the display panel of one embodiment of the present invention, and FIG. 1B is a top view illustrating part of the display panel.

Figure 2:
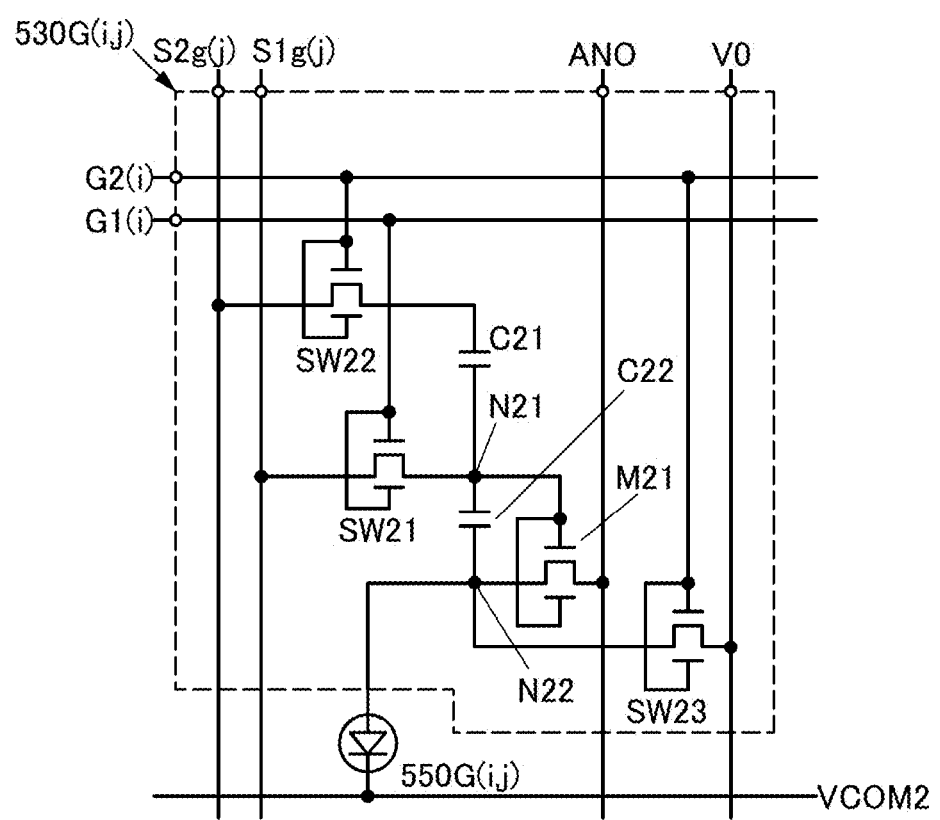
FIG. 2 is a circuit diagram illustrating a pixel of a display panel in Embodiment.

FIG. 2 is a circuit diagram illustrating a pixel in the display panel of one embodiment of the present invention.

Figure 3A:
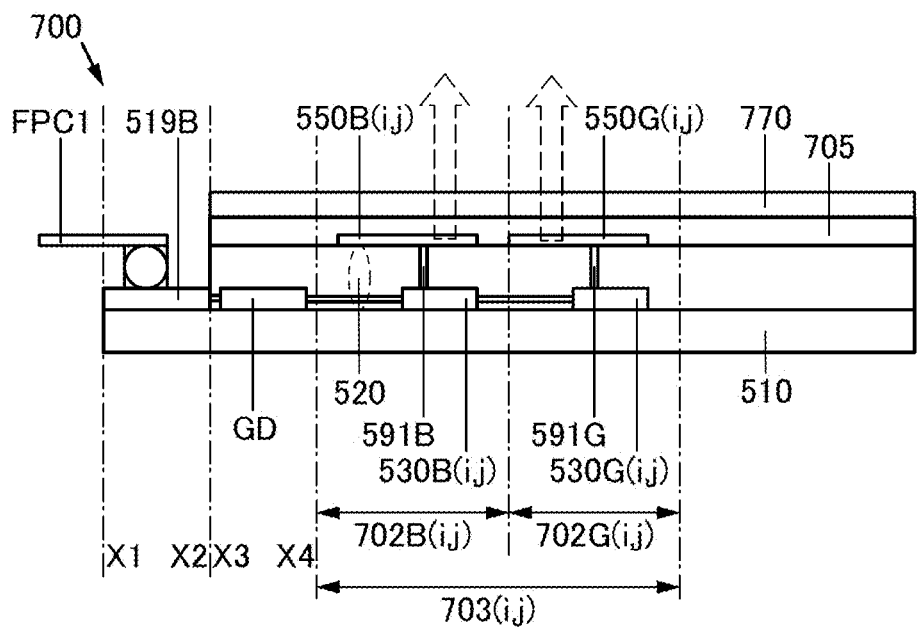
FIGS. 3A to 3D illustrate a structure of a display panel in Embodiment.
Figure 3B:
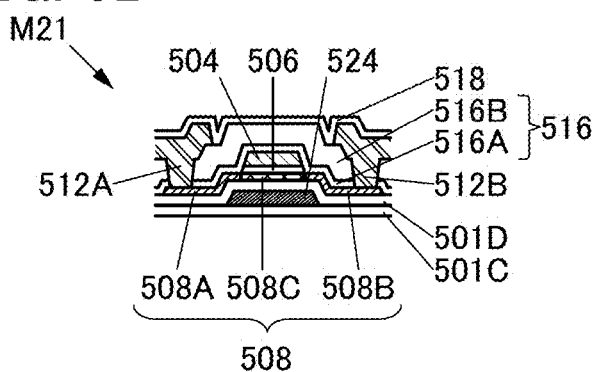
Figure 3C:
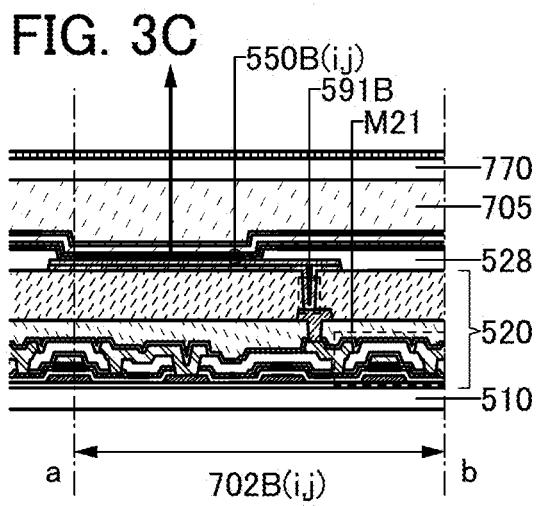
Figure 3D:
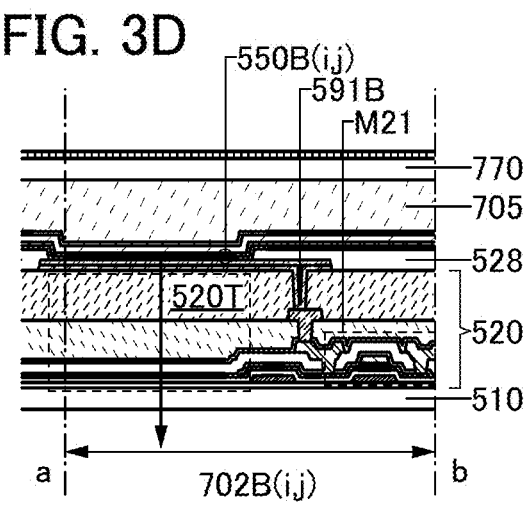

FIGS. 3A to 3D are cross-sectional views illustrating the structure of the display panel of one embodiment of the present invention. FIG. 3A illustrates cross sections taken along the cutting lines X1-X2 and X3-X4 in FIG. 1A and a cross section of a set of pixels 703(i,j). FIG. 3B is a cross-sectional view illustrating a transistor that can be used in the display panel of one embodiment of the present invention. FIG. 3C is a cross-sectional view taken along the cutting line a-b in FIG. 1B and shows a direction of light emitted from the display panel of one embodiment of the present invention. FIG. 3D is a cross-sectional view showing a direction of light emitted from a display panel of one embodiment of the present invention, which is different from the display panel of one embodiment of the present invention in FIG. 3C.

Figure 4A:
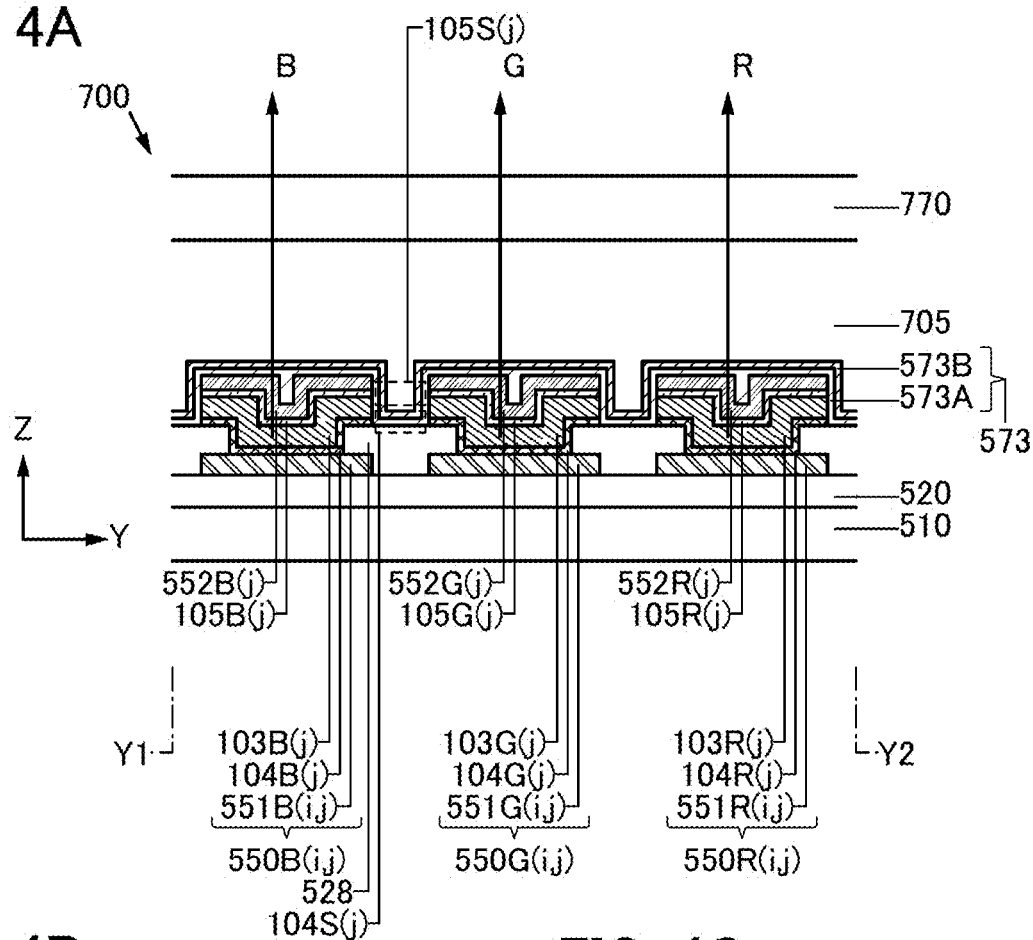
FIGS. 4A to 4C illustrate a structure of a display panel in Embodiment.
Figure 4B:
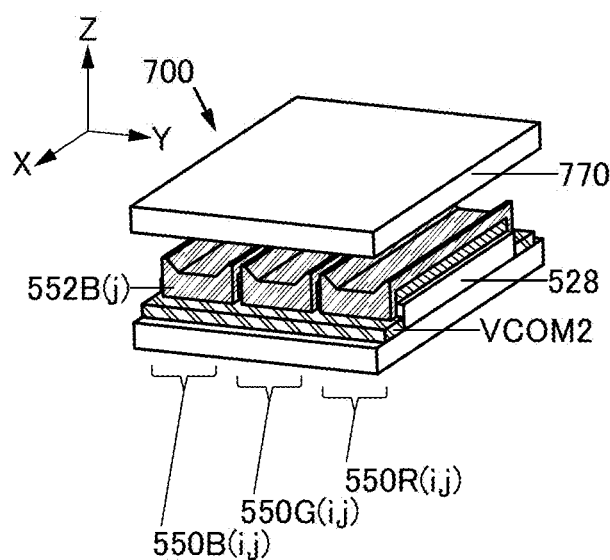
Figure 4C:
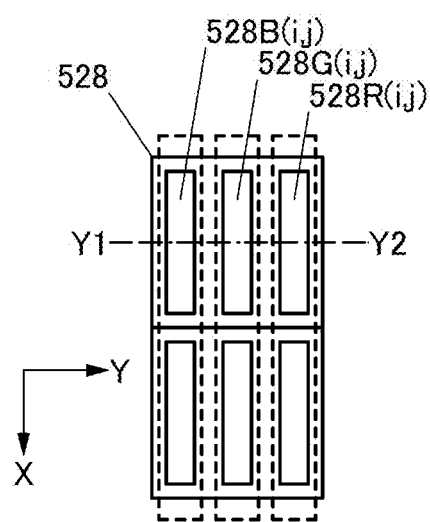

FIGS. 4A to 4C illustrate a structure of a display panel of one embodiment of the present invention. FIG. 4A is a cross-sectional view of a pixel in a display panel of one embodiment of the present invention, FIG. 4B is a perspective view of the pixel in FIG. 4A, and FIG. 4C is a top view of the pixel in FIG. 4A. Note that insulating films are omitted in FIGS. 4B and 4C in order to avoid complexity of the drawings.

Figure 5A:
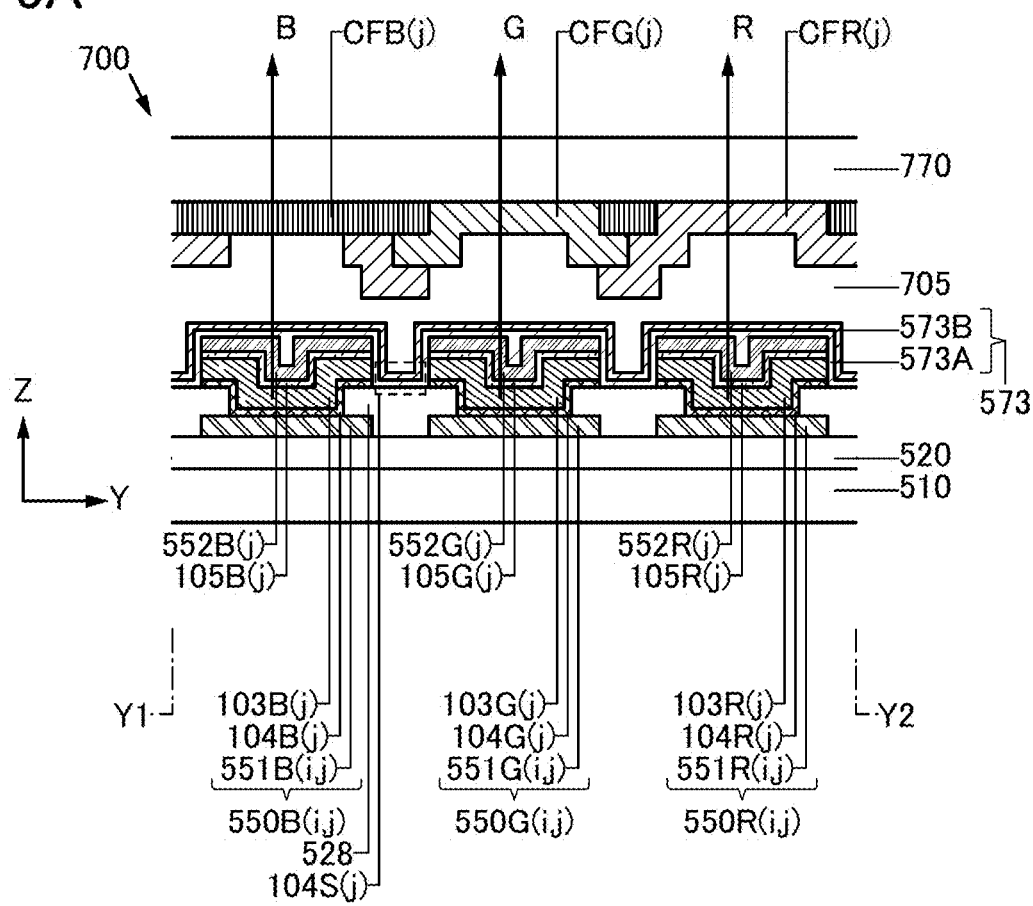
FIGS. 5A and 5B illustrate a structure of a display panel in Embodiment.
Figure 5B:
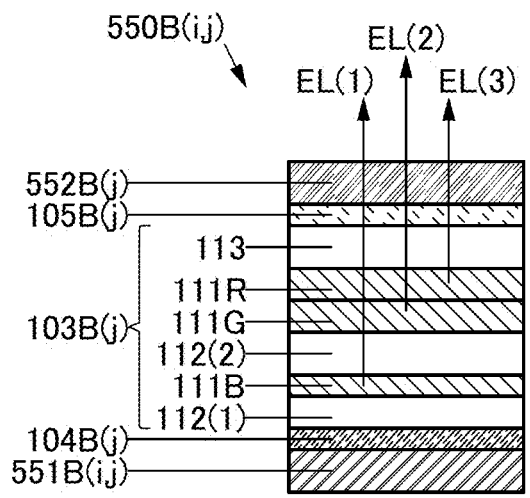

FIGS. 5A and 5B are cross-sectional views illustrating a display panel of one embodiment of the present invention, which is different from the display panel of one embodiment of the present invention in FIGS. 4A to 4C. FIG. 5A is a cross-sectional view of a pixel in the display panel of one embodiment of the present invention, and FIG. 5B is a cross-sectional view illustrating a structure of a light-emitting device (also referred to as a light-emitting element) illustrated in FIG. 5A.

FIGS. 6A to 6C illustrate a display panel of one embodiment of the present invention, which is different from the display panel of one embodiment of the present invention in FIGS. 4A to 4C or FIGS. 5A and 5B. FIG. 6A is a cross-sectional view of a pixel in a display panel of one embodiment of the present invention, FIG. 6B is a perspective view of the pixel in FIG. 6A, and FIG. 6C is a top view of the pixel in FIG. 6A. Note that insulating films are omitted in FIGS. 6B and 6C in order to avoid complexity of the drawings.

Figure 7:
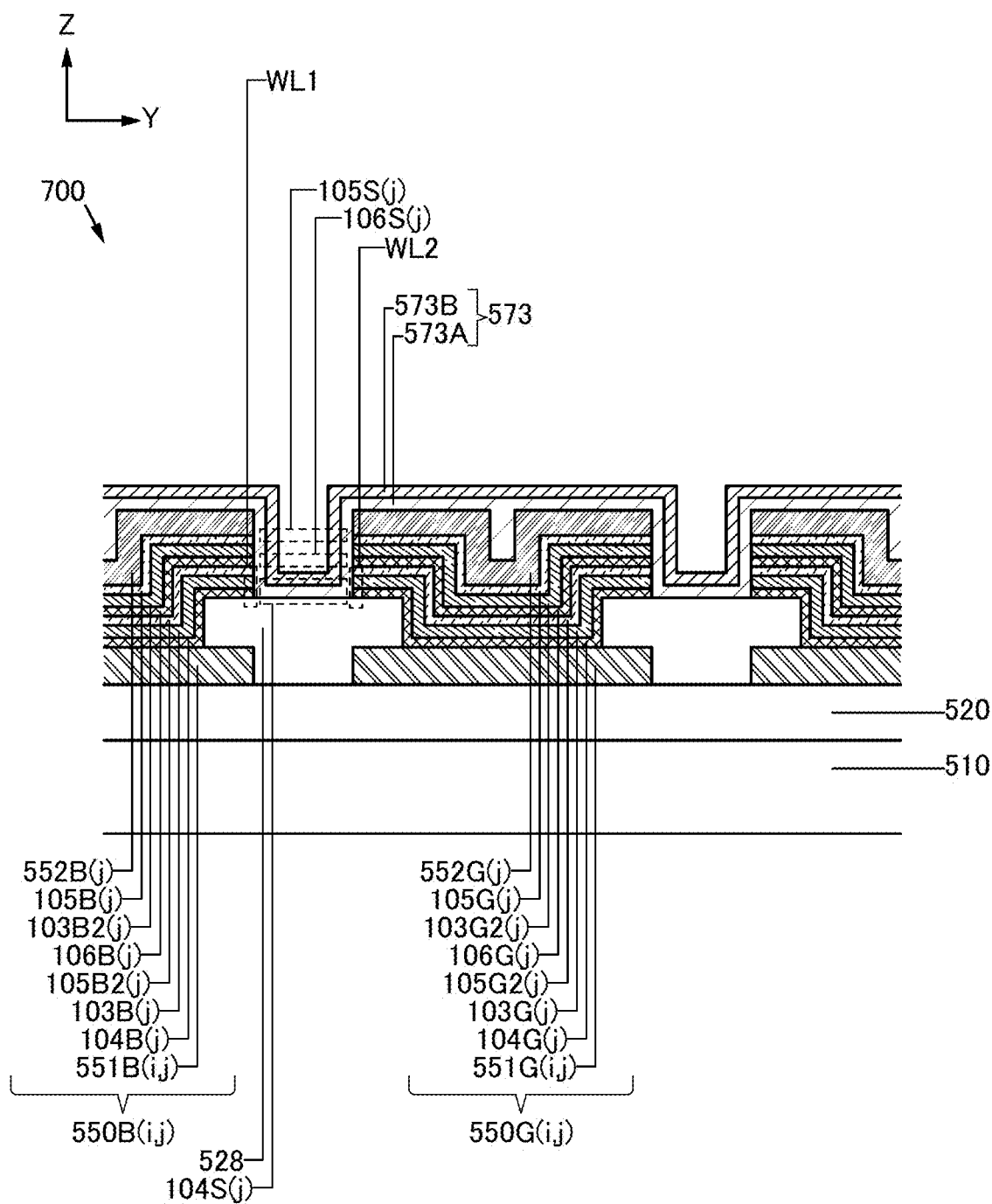
FIG. 7 illustrates part of FIG. 6A.

FIG. 7 illustrates part of the display panel of one embodiment of the present invention in FIGS. 6A to 6C.

Figure 8:
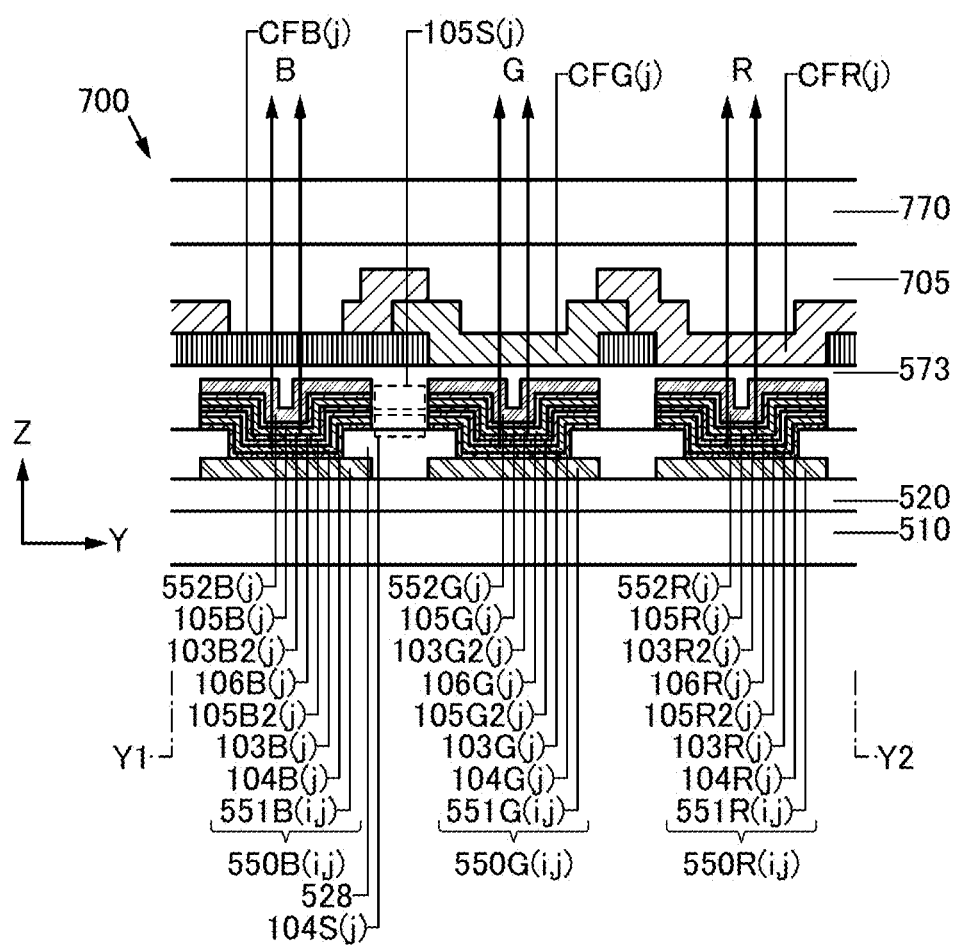
FIG. 8 illustrates a structure of a display panel in Embodiment.

FIG. 8 is a cross-sectional view illustrating a display panel of one embodiment of the present invention, which is different from the display panels of embodiments of the present invention in FIGS. 4A to 4C to FIG. 7.

Figure 9A:
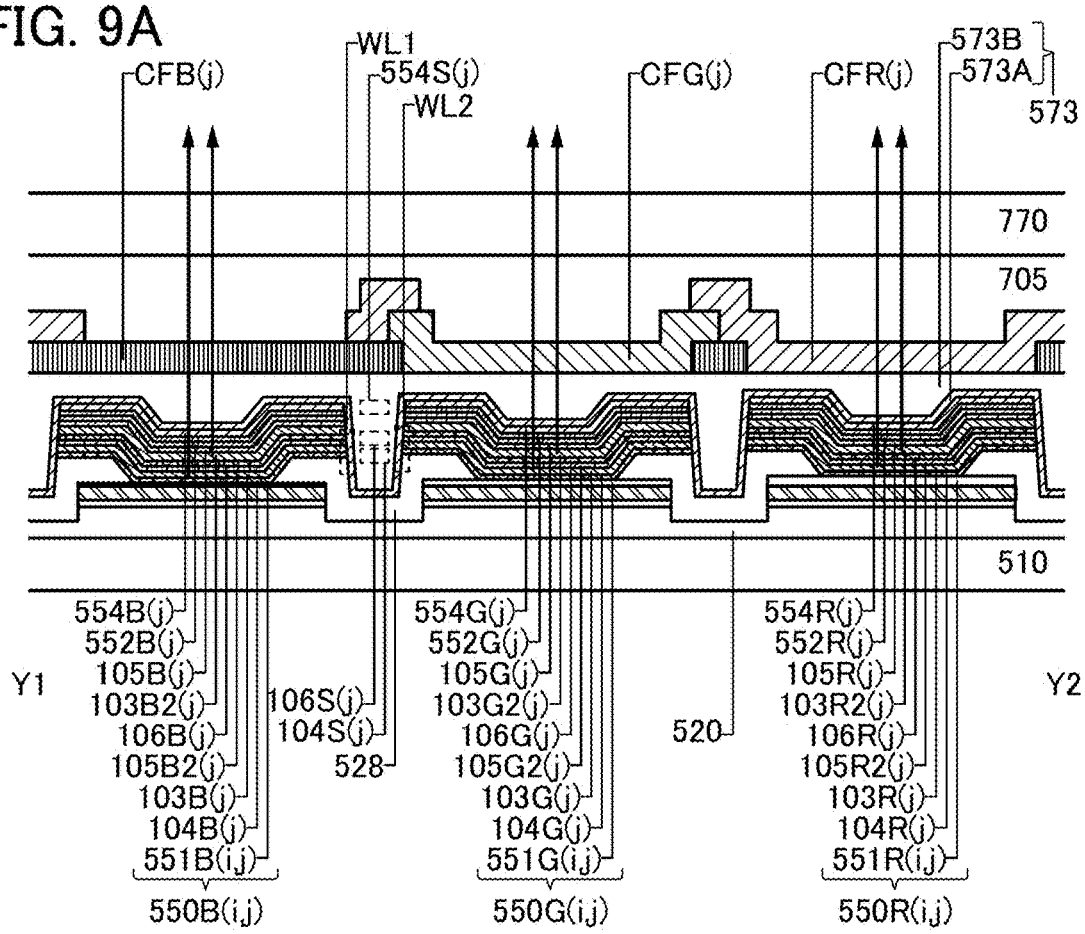
FIGS. 9A and 9B illustrate a structure of a display panel in Embodiment.
Figure 9B:
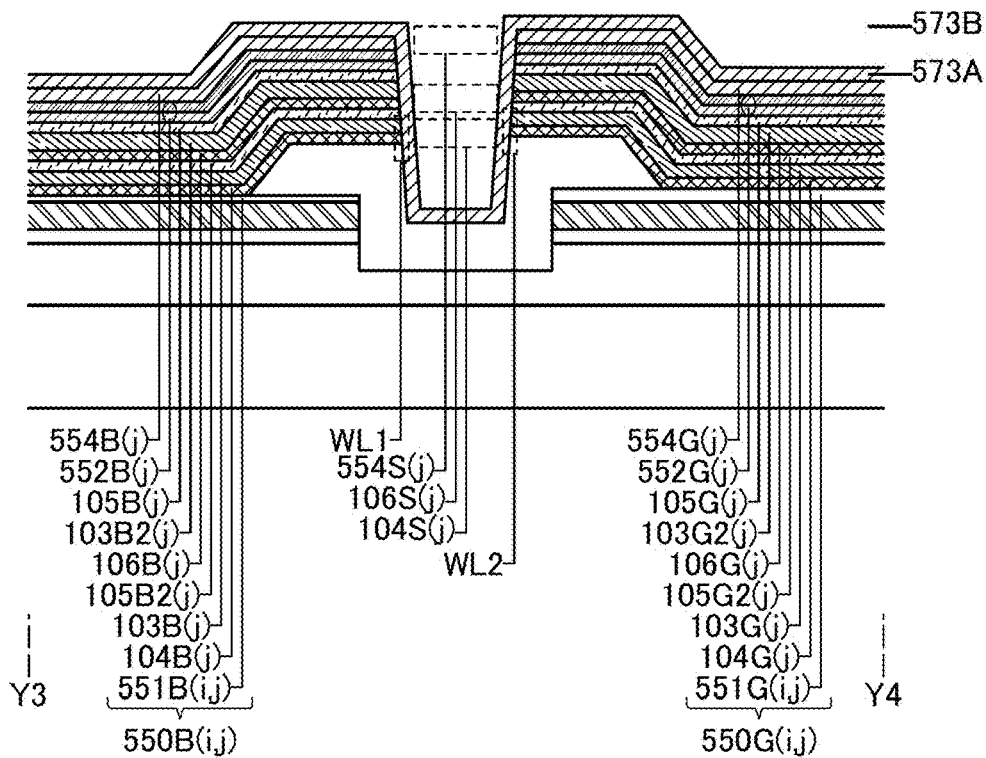

FIGS. 9A and 9B are cross-sectional views illustrating a display panel of one embodiment of the present invention, which is different from the display panels of embodiments of the present invention in FIGS. 4A to 4C to FIG. 8. FIG. 9A is a cross-sectional view of a pixel in the display panel of one embodiment of the present invention, and FIG. 9B illustrates part of FIG. 9A.

Figure 10A:
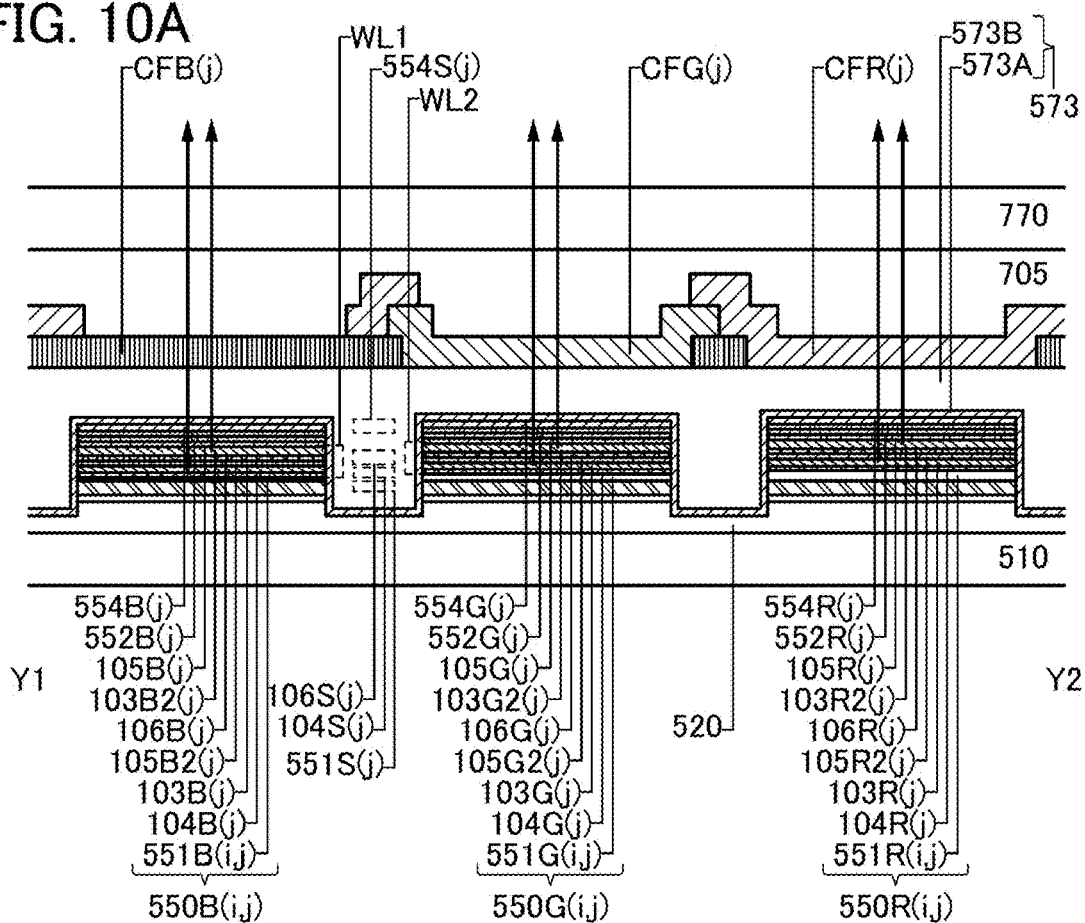
FIGS. 10A and 10B illustrate a structure of a display panel in Embodiment.
Figure 10B:
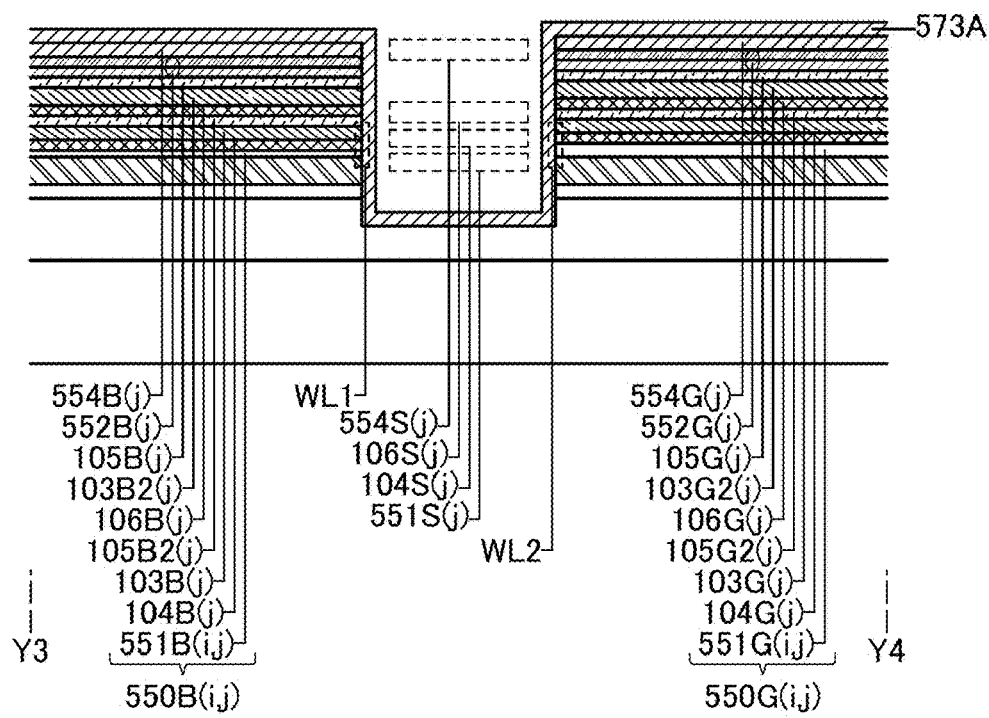

FIGS. 10A and 10B are cross-sectional views illustrating a display panel of one embodiment of the present invention, which is different from the display panels of embodiments of the present invention in FIGS. 4A to 4C to FIGS. 9A and 9B. FIG. 10A is a cross-sectional view of a pixel in the display panel of one embodiment of the present invention, and FIG. 10B illustrates part of FIG. 10A.

Figure 11:
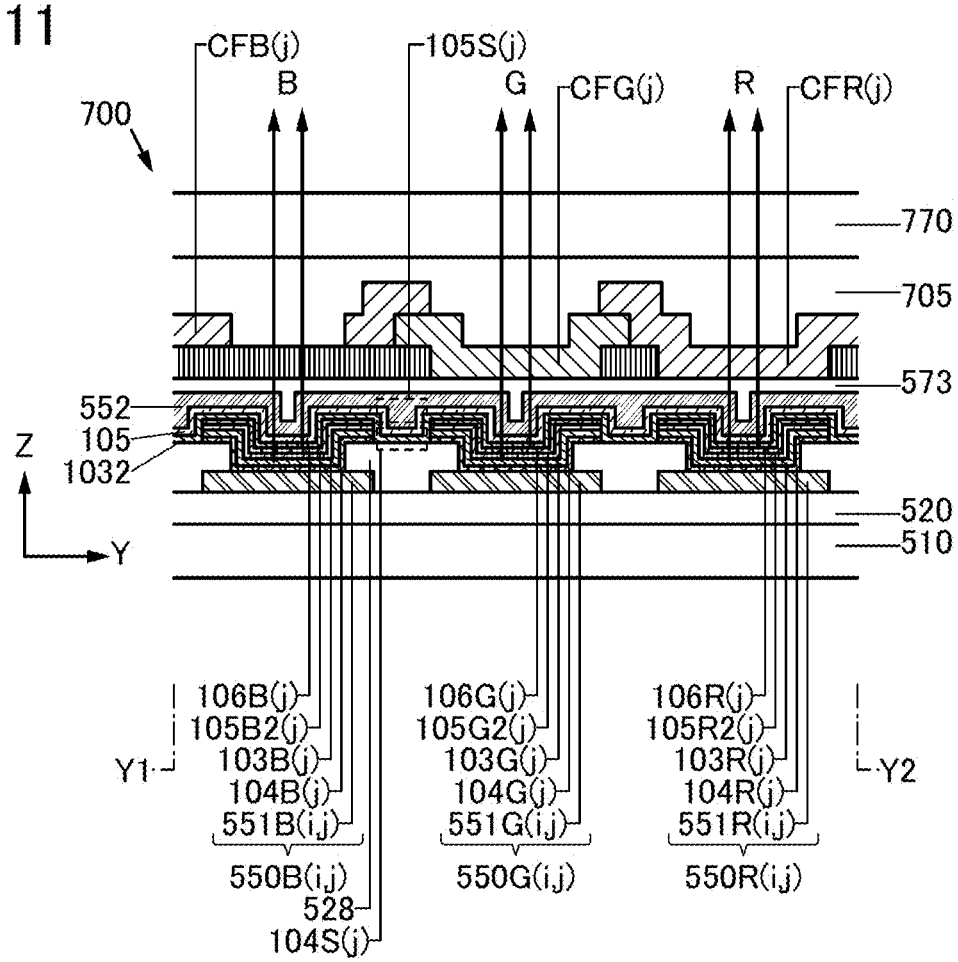
FIG. 11 illustrates a structure of a display panel in Embodiment.

FIG. 11 is a cross-sectional view illustrating a display panel of one embodiment of the present invention, which is different from the display panels of embodiments of the present invention in FIGS. 4A to 4C to FIGS. 10A and 10B.

Figure 12A:
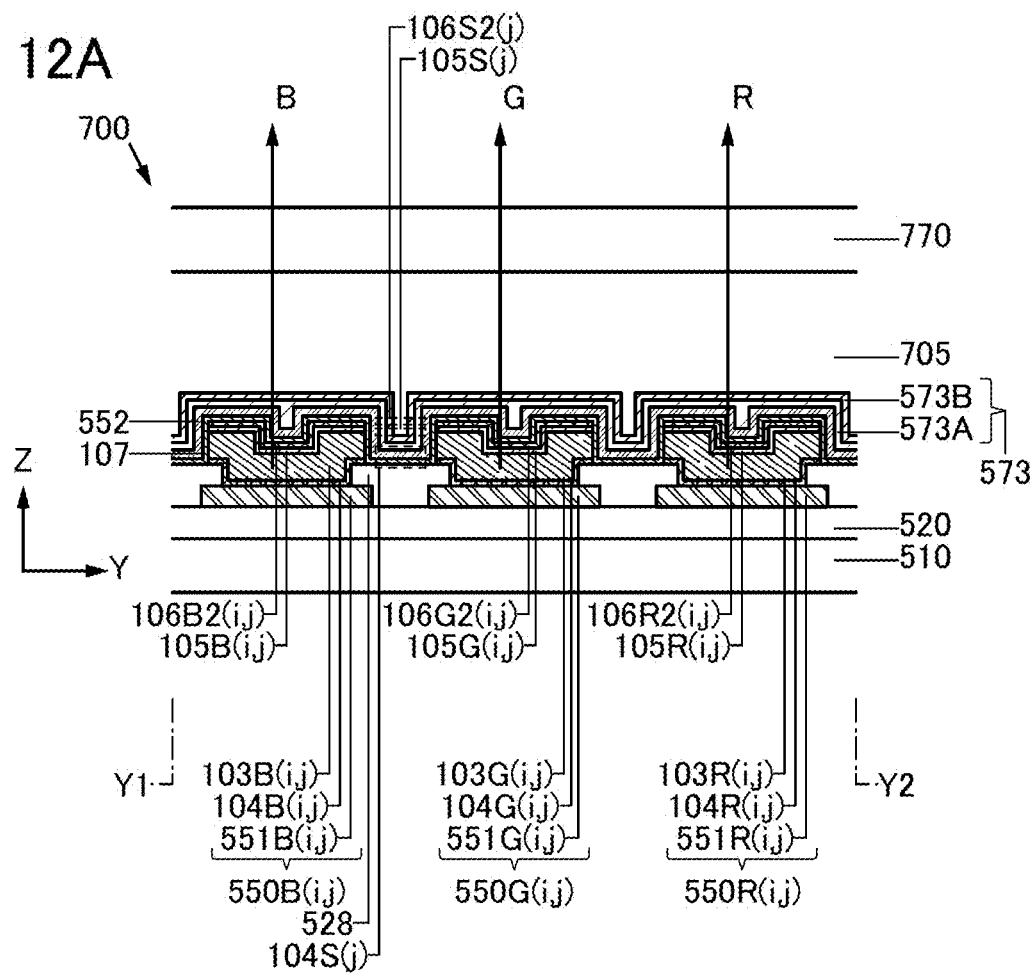
FIGS. 12A and 12B illustrate a structure of a display panel in Embodiment.
Figure 12B:
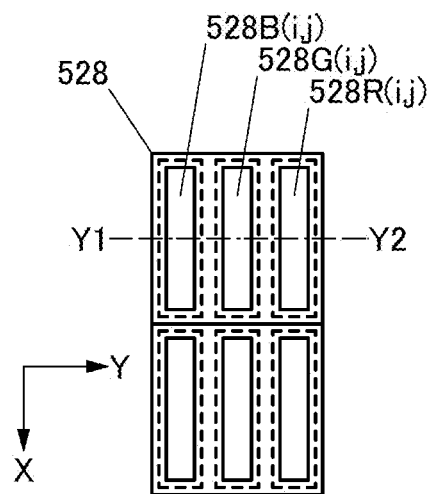

FIGS. 12A and 12B illustrate a display panel of one embodiment of the present invention, which is different from the display panels of embodiments of the present invention in FIGS. 4A to 4C to FIG. 11. FIG. 12A is a cross-sectional view of a pixel in the display panel of one embodiment of the present invention, and FIG. 12B is a top view of the pixel in FIG. 12A.

Figure 13A:
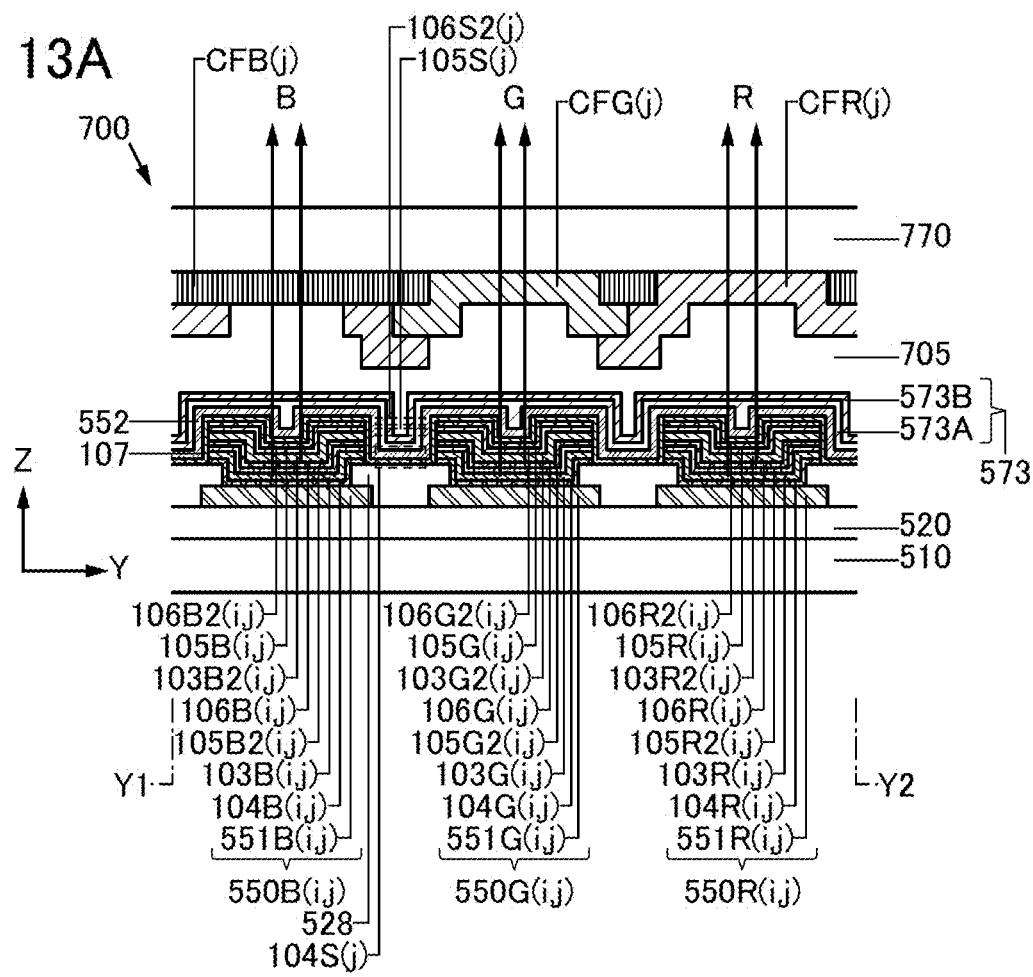
FIGS. 13A and 13B illustrate a structure of a display panel in Embodiment.
Figure 13B:
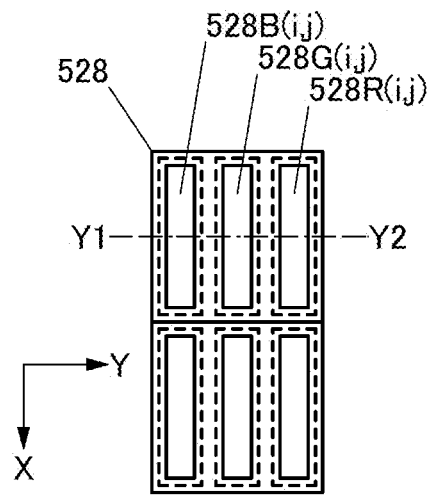

FIGS. 13A and 13B illustrate a display panel of one embodiment of the present invention, which is different from the display panels of embodiments of the present invention in FIGS. 4A to 4C to FIGS. 12A and 12B. FIG. 13A is a cross-sectional view of a pixel in the display panel of one embodiment of the present invention, and FIG. 13B is a top view of the pixel in FIG. 13A.

Figure 14:
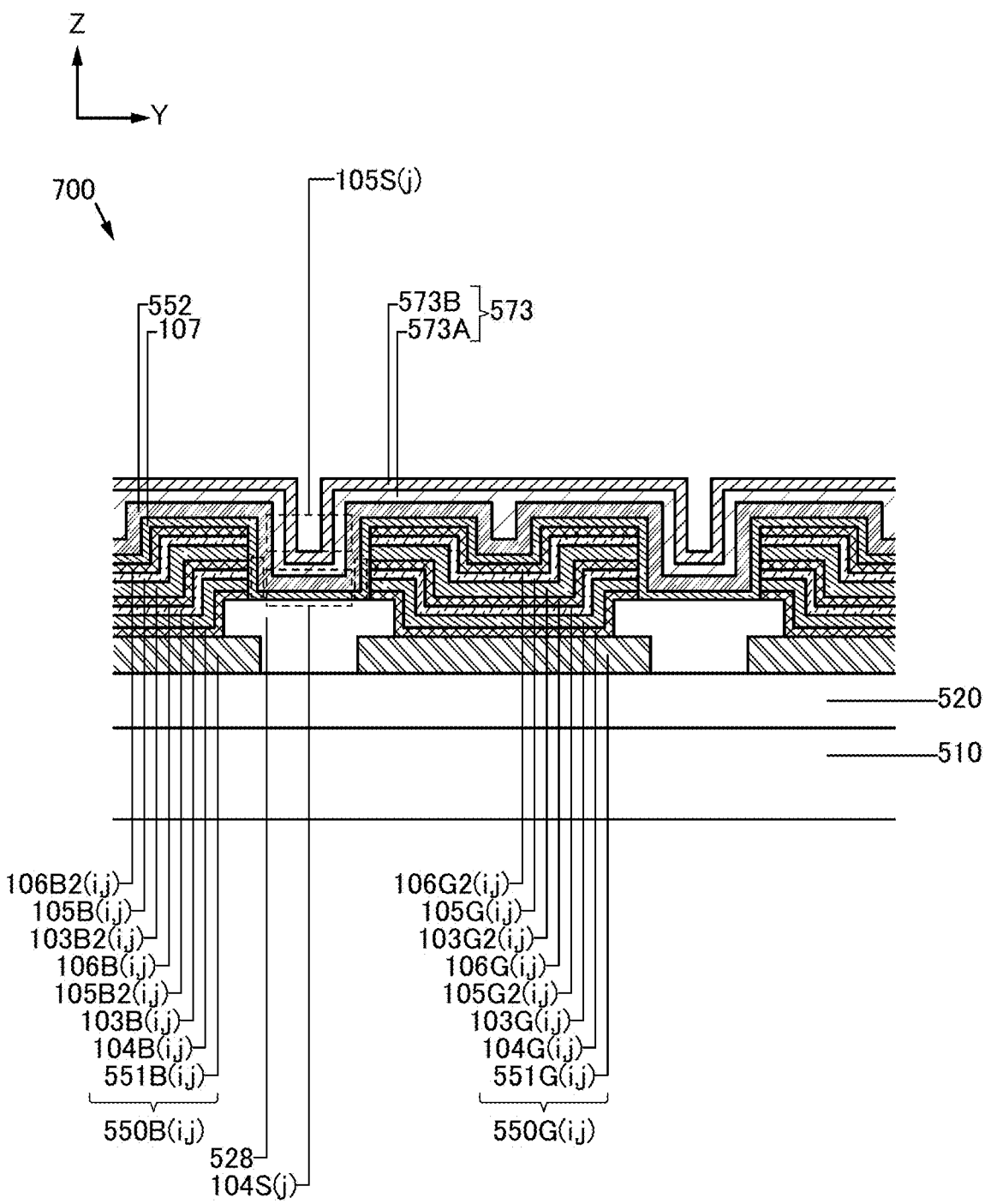
FIG. 14 illustrates part of FIG. 13A.

FIG. 14 illustrates part of the display panel of one embodiment of the present invention in FIG. 13A.

In this specification and the like, a device fabricated using a metal mask or a fine metal mask (FMM, a high-definition metal mask) is referred to as a device with a metal mask (MM) structure in some cases. Also in this specification and the like, a device fabricated without using a metal mask or an FMM is referred to as a device with a metal maskless (MML) structure in some cases.

In this specification and the like, a structure in which light-emitting layers are separately formed or separated by color in accordance with light-emitting devices (here, blue (B), green (G), and red (R)) is called a side by side (SBS) structure in some cases. In this specification and the like, a light-emitting device capable of emitting white light is called a white light-emitting device in some cases. Note that a white light-emitting device can be a full-color display device by being combined with a coloring layer (e.g., a color filter).

The light-emitting devices can be roughly classified into a single structure and a tandem structure. It is preferable that a device having a single structure include one light-emitting unit between a pair of electrodes and the light-emitting unit include one or more light-emitting layers. To obtain white light emission, two or more light-emitting layers may be selected such that emission colors of the light-emitting layers are complementary colors. Thus, the emission colors of the first light-emitting layer and the second light-emitting layer are made complementary, so that the light-emitting device can emit white light as a while, for example. This can be applied to a light-emitting device including three or more light-emitting layers.

It is preferable that a device having a tandem structure include two or more light-emitting units between a pair of electrodes and each light-emitting unit include one or more light-emitting layers. To obtain white light emission, white light may be obtained by combining light emitted from light-emitting layers of a plurality of light-emitting units. Note that the structure that can provide white light emission is similar to that of the single structure. In the device having a tandem structure, an intermediate layer such as a charge-generation layer is preferably provided between the plurality of light-emitting units.

When the above-described white light-emitting device (having a single structure or a tandem structure) and a light-emitting device having an SBS structure are compared, the light-emitting device having an SBS structure can have lower power consumption than the white light-emitting device. In the case where power consumption is required to be low, the light-emitting device having an SBS structure is preferably used. In contrast, the white light-emitting device is preferable because a process for manufacturing the white light-emitting device is easier than that for the light-emitting device having an SBS structure, resulting in a low manufacturing cost or a high manufacturing yield.

Note that in this specification, an integer variable of 1 or more may be used for reference numerals. For example, "(p)" where p is an integer variable of 1 or more may be used for part of a reference numeral that specifies any one of components (p components at a maximum). For another example, "(m,n)" where each of m and n is an integer variable of 1 or more may be used for part of a reference numeral that specifies any one of components (m×n components at a maximum).

<Structure Example 1 of Display Panel 700>

A display panel 700 includes a display region 231, and the display region 231 includes a set of pixels 703(i,j) (see FIG. 1A). The display region 231 also includes a set of pixels 703(i+1,j) adjacent to the set of pixels 703(i,j) (see FIG. 1B).

<<Structure Example of Pixel 703(i,j)>>

A plurality of pixels can be used as the pixel 703(i,j) (see FIG. 1B). For example, a plurality of pixels that show colors of different hues can be used. Note that the plurality of pixels can be referred to as subpixels. In addition, a set of subpixels can be referred to as a pixel.

Such a structure enables additive mixture or subtractive mixture of colors shown by the plurality of pixels. Alternatively, it is possible to express a color of a hue that an individual pixel cannot show.

Specifically, a pixel 702B(i,j) for showing blue, the pixel 702G(i,j) for showing green, and a pixel 702R(i,j) for showing red can be used in the pixel 703(i,j).

As another example, a pixel for showing white or the like in addition to the above set can be used in the pixel 703(*i,j*). Moreover, a pixel for showing cyan, a pixel for showing magenta, and a pixel for showing yellow can be used in the pixel 703(*i,j*).

As another example, a pixel emitting infrared rays in addition to the above set can be used in the pixel 703(*i,j*). Specifically, a pixel that emits light including light with a wavelength of greater than or equal to 650 nm and less than or equal to 1000 nm can be used in the pixel 703(*i,j*).

<Structure Example 2 of Display Panel 700>

The display panel described in this embodiment includes a driver circuit GD and a driver circuit SD (see FIG. 1A and FIG. 3A). In addition, a terminal 519B is included. The terminal 519B can be electrically connected to a flexible printed circuit FPC1, for example.

<<Structure Example of Driver Circuit GD>>

The driver circuit GD has a function of supplying a first selection signal and a second selection signal. For example, the driver circuit GD is electrically connected to a conductive film G1(*i*) to supply the first selection signal, and is electrically connected to a conductive film G2(*i*) to supply the second selection signal (see FIG. 2).

<<Structure Example of Driver Circuit SD>>

The driver circuit SD has a function of supplying an image signal and a control signal, and the control signal includes a first level and a second level. The driver circuit SD is electrically connected to a conductive film S1*g*(*j*) to supply the image signal, and is electrically connected to a conductive film S2*g*(*j*) to supply the control signal, for example.

<Structure Example 3 of Display Panel 700>

The display panel 700 includes a base 510, a base 770, and a functional layer 520 (see FIG. 3A). The functional layer 520 is sandwiched between the base 770 and the base 510. The display panel 700 includes an insulating film 705, and the insulating film 705 has a function of bonding the base 770 and the functional layer 520.

The functional layer 520 includes a pixel circuit 530B(i,j), a pixel circuit 530G(i,j), and the driver circuit GD. The pixel circuit 530B(i,j) is electrically connected to a light-emitting device 550B(i,j) through an opening 591B, and the pixel circuit 530G(i,j) is electrically connected to a light-emitting device 550G(i,j) through an opening 591G.

Note that the display panel displays information through the base 770 (see FIG. 3C). In other words, the light-emitting device 550B(i,j) emits light toward the direction in which the functional layer 520 is not provided. The light-emitting device 550B(i,j) can be referred to as a top emission light-emitting device.

A base in which touch sensors arranged in a matrix can be used as the base 770. For example, a capacitive touch sensor or an optical touch sensor can be used for the base 770. Thus, the display panel of one embodiment of the present invention can be used as a touch panel.

<Structure Example 4 of Display Panel 700>

The display panel 700 includes the base 510, the base 770, and the functional layer 520 (see FIG. 3D). Note that the display panel described with reference to FIG. 3D differs from the display panel described with reference to FIG. 3C in that information is displayed through the base 510. In other words, the light-emitting device 550B(i,j) emits light toward the functional layer 520. Note that the functional layer 520 includes the pixel circuit 530B(i,j) and a region 520T having a light-transmitting property. The light-emitting device 550B(i,j) is electrically connected to the pixel circuit 530B(i,j), and emits light toward the region 520T having a light-transmitting property. The light-emitting device 550B(i,j) can be referred to as a bottom emission light-emitting device.

<Structure Example 5 of Display Panel 700>

The functional panel 700 includes a pixel 702G(i,j), a conductive film G1(*i*), a conductive film G2(*i*), a conductive film S1*g*(*j*), a conductive film S2*g*(*j*), a conductive film ANO, and a conductive film VCOM2 (see FIGS. 1A and 1B and FIG. 2).

The conductive film G1(*i*) is supplied with a first selection signal, the conductive film G2(*i*) is supplied with a second selection signal, the conductive film S1*g*(*j*) is supplied with an image signal, and the conductive film S2*g*(*j*) is supplied with a control signal, for example.

The pixel 702G(i,j) includes the pixel circuit 530G(i,j) and the light-emitting device 550G(i,j).

<<Structure Example of Pixel 702G(i,j)>>

The pixel 702G(i,j) includes the pixel circuit 530G(i,j) and the light-emitting device 550G(i,j) (see FIG. 2).

<<Structure Example 1 of Pixel Circuit 530G(i,j)>>

The pixel circuit 530G(i,j) is supplied with the first selection signal and obtains an image signal in accordance with the first selection signal. For example, the first selection signal can be supplied using the conductive film G1(*i*) (see FIG. 2). The image signal can be supplied using the conductive film S1*g*(*j*). Note that the operation of supplying the first selection signal and making the pixel circuit 530G(i,j) obtain an image signal can be referred to as "writing".

<<Structure Example 2 of Pixel Circuit 530G(i,j)>>

The pixel circuit 530G(i,j) includes a switch SW21, a switch SW22, a transistor M21, a capacitor C21, and a node N21 (see FIG. 2). The pixel circuit 530G(i,j) includes a node N22, a capacitor C22, and a switch SW23.

The transistor M21 includes a gate electrode electrically connected to the node N21, the first electrode electrically connected to the light-emitting device 550G(i,j), and the second electrode electrically connected to the conductive film ANO.

The switch SW21 includes a first terminal electrically connected to the node N21 and a second terminal electrically connected to the conductive film S1*g*(*j*), and has a function of controlling its on/off state on the basis of the potential of the conductive film G1(*i*).

The switch SW22 includes a first terminal electrically connected to the conductive film S2*g*(*j*), and has a function of controlling its on/off state on the basis of the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550G(i,j) can be controlled with the potential of the node N21.

<<Structure Example of Transistor M21>>

A bottom-gate transistor, a top-gate transistor, or the like can be used in the functional layer 520. Specifically, a transistor can be used as a switch.

The transistor includes a semiconductor film 508, a conductive film 504, a conductive film 512A, and a conductive film 512B (see FIG. 3B). The transistor is formed over an insulating film 501C, for example.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C and has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other.

A conductive film 524 can be used in the transistor. The semiconductor film 508 is sandwiched between the conductive film 504 and the conductive film 524. The conductive film 524 has a function of a second gate electrode. The insulating film 501D is sandwiched between the semiconductor film 508 and the conductive film 524 and has a function of a second gate insulating film. Note that a transistor that uses the conductive film 524 is called a dual-gate transistor and a transistor that does not use the conductive film 524 is called a single-gate transistor in some cases. Each of the transistors can be used for the functional layer 520.

Note that in a step of forming the semiconductor film used in the transistor of the pixel circuit, the semiconductor film used in the transistor of the driver circuit can be formed. A semiconductor film with the same composition as the semiconductor film used in the transistor of the pixel circuit can be used for the driver circuit, for example.

<<Structure Example 1 of Semiconductor Film 508>>

For example, a semiconductor containing a Group 14 element can be used for the semiconductor film 508. Specifically, a semiconductor containing silicon can be used for the semiconductor film 508.

[Hydrogenated Amorphous Silicon]

For example, hydrogenated amorphous silicon can be used for the semiconductor film 508. Microcrystalline silicon or the like can also be used for the semiconductor film 508. Thus, it is possible to provide a functional panel having less display unevenness than a functional panel using polysilicon for the semiconductor film 508, for example. Alternatively, the size of the functional panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that of a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. Alternatively, the driver circuit can be formed over a substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a functional panel using hydrogenated amorphous silicon for the semiconductor film 508. Alternatively, a functional panel having less display unevenness than a functional panel using polysilicon for the semiconductor film 508, for example, can be provided. For another example, smart glasses or a head mounted display can be provided.

<<Structure Example 2 of Semiconductor Film 508>>

For example, a metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of the data processing device can be reduced. Furthermore, power consumption for driving can be reduced.

For example, a transistor using an oxide semiconductor can be used. Specifically, an oxide semiconductor containing indium, an oxide semiconductor containing indium, gallium, and zinc, or an oxide semiconductor containing indium, gallium, zinc, and tin can be used for the semiconductor film.

For example, a transistor having a lower leakage current in an off state than a transistor using amorphous silicon for a semiconductor film can be used. Specifically, a transistor using an oxide semiconductor for a semiconductor film can be used as a switch or the like. In that case, the potential of the floating node can be held for a longer time than in a circuit in which a transistor using amorphous silicon is used as a switch.

<<Structure Example 1 of Light-Emitting Device 550G(i,j)>>

The light-emitting device 550G(i,j) is electrically connected to the pixel circuit 530G(i,j) (see FIG. 2). The light-emitting device 550G(i,j) includes an electrode 551G (i,j) and an electrode 552(j). The electrode 551G(i,j) is electrically connected to the pixel circuit 530G(i,j), and the electrode 552(j) is electrically connected to the conductive film VCOM2 (see FIG. 2 and FIG. 4A). Note that the light-emitting device 550G(i,j) operates on the basis of the potential of the node N21.

For example, an organic electroluminescent element, an inorganic electroluminescent element, a light-emitting diode, or a quantum-dot LED (QDLED) can be used as the light-emitting device 550G(i,j).

<Structure Example 6 of Display Panel 700>

The display panel 700 described in this embodiment includes the light-emitting device 550B(i,j), the light-emitting device 550G(i,j), and a partition wall 528 (see FIG. 4A). In addition, a light-emitting device 550R(i,j) is included.

<<Structure Example 1 of Light-Emitting Device 550B(i,j)>>

The light-emitting device 550B(i,j) includes an electrode 551B(i,j), an electrode 552B(j), and a layer 105B(j). Note that the electrode 552B(j) overlaps with the electrode 551B (i,j).

The light-emitting device 550B(i,j) includes a unit 103B (j) and a layer 104B(j).

The unit 103B(j) includes a region sandwiched between the layer 105B(j) and the electrode 551B(i,j). The unit 103B(j) includes a light-emitting layer, and has a function of emitting light. For example, the unit 103B(j) can emit blue light.

For example, a layer selected from a hole-transport layer, an electron-transport layer, a carrier-blocking layer, and the like can be used for the unit 103B(j). For example, a high molecular compound (e.g., an oligomer, a dendrimer, or a polymer), a middle molecular compound (a compound with a molecular weight of 400 to 4000 between a low molecular compound and a high molecular compound), a low molecular compound, or the like can be used for the unit 103B(j). The unit 103B(j) can be formed with a vacuum evaporation machine, an ink-jet machine, a coating machine such as a spin coater, a gravure printing machine, an offset printing machine, a screen printing machine, or the like.

<<Structure Example of Layer 105B(j)>>

The layer 105B(j) includes a region sandwiched between the electrode 552B(j) and the electrode 551B(i,j). For example, the layer 105B(j) is positioned between the electrode 552B(j) and the unit 103B(j), and is in contact with the electrode 552B(j). Note that the layer 105B(j) can be used for, for example, an electron-injection layer.

The layer 105B(j) contains the first organic compound and the first metal. Note that the first organic compound and the first metal form a SOMO. For example, the energy level of the SOMO is lower than the energy level of LUMO of the first organic compound within a range of greater than or equal to −1.5 eV and less than 0 eV.

For example, a composite material of the first organic compound including an unshared electron pair and the first metal can be used for the layer 105B(j). The sum of the number of electrons of the first organic compound and the number of electrons of the first metal is preferably an odd number. The molar ratio of the first metal to 1 mol of the first organic compound is preferably greater than or equal to 0.1 and less than or equal to 10, more preferably greater than or equal to 0.2 and less than or equal to 2, further more preferably greater than or equal to 0.2 and less than or equal to 0.8.

Accordingly, the first organic compound including an unshared electron pair interacts with the first metal and thus can form a SOMO. Furthermore, in the case where electrons are injected from the electrode 552B(j) into the layer 105B (j), a barrier therebetween can be reduced. The first metal has a low reactivity with water or oxygen; thus, the moisture resistance of the light-emitting device 550B(i,j) can be improved.

The layer 105B(j) can adopt a composite material that allows the spin density of the layer 105B(j) measured by an electron spin resonance method (ESR) to be preferably greater than or equal to $1\times10^{16}$ spins/cm$^3$, more preferably $5\times10^{16}$ spins/cm$^3$, further more preferably greater than or equal to $1\times10^{17}$ spins/cm$^3$.

The concentration of an alkali metal contained in the layer 105B(j) is preferably lower than the concentration of the first metal contained in the layer 105B(j). Examples of the alkali metal are lithium, sodium, potassium, rubidium, and cesium. The concentrations of the alkali metal and the first metal contained in the layer 105B(j) can be measured by a secondary ion mass spectrometry method or the like.

[First Organic Compound]

For example, an electron-transport material (a material having an electron-transport property) can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device 550B(i,j) can be reduced.

Note that the lowest unoccupied molecular orbital (LUMO) of the organic compound including an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used for the organic compound including an unshared electron pair. Note that NBPhen has a higher glass transition temperature (Tg) than BPhen and thus has high heat resistance.

[Chemical Formula 1]

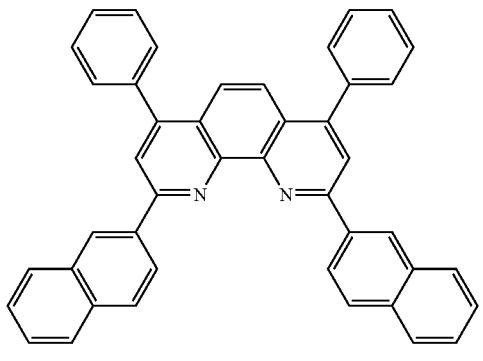

NBPhen

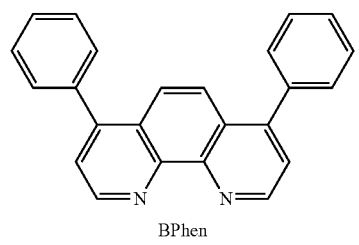

BPhen

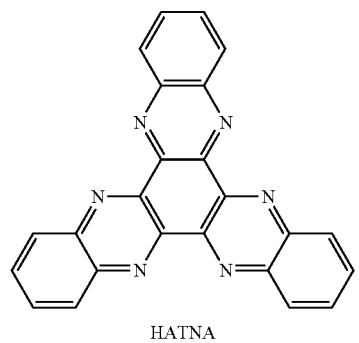

HATNA

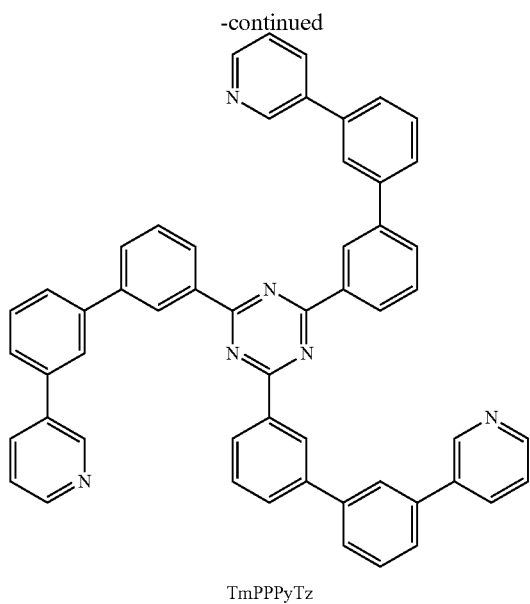

TmPPPyTz

Alternatively, for example, copper phthalocyanine can be used for the organic compound including an unshared electron pair. The number of electrons of the copper phthalocyanine is an odd number.

[First Metal]

When the number of electrons of the organic compound including an unshared electron pair is an even number, for example, a composite material of the first metal and the first organic compound, which belongs to an odd-numbered group in the periodic table, can be used for the layer 105B(j).

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point.

The use of Ag for the electrode 552B(j) and the layer 105B(j) can increase the adhesion between the layer 105B(j) and the electrode 552B(j).

When the number of electrons of the first organic compound including an unshared electron pair is an odd number, for example, a composite material of the first metal and the first organic compound, which belongs to an even-numbered group in the periodic table, can be used for the layer 105B(j). For example, iron (Fe), which is a metal belonging to Group 8, is an element belonging to an even-numbered group in the periodic table.

Thus, for example, driving voltage of the display panel can be reduced without using an alkali metal for the light-emitting device. Adjacent light-emitting devices can be separated by etching. Even when etching is performed, manufacturing facilities are not contaminated by an alkali metal. As a result, a novel display panel that is highly convenient, useful, or reliable can be provided.

<<Structure Example 1 of Layer 104B(j)>>

The layer 104B(j) includes a region sandwiched between the unit 103B(j) and the electrode 551B(i,j) (see FIG. 4A). Note that the layer 104B(j) can be used for a hole-injection layer, for example.

The layer 104B(j) contains a composite material. The composite material contains a hole-transport material and an acceptor substance, and the layer 104B(j) has an electrical resistivity greater than or equal to $1\times10^2$ [Ω·cm] and less than or equal to $1\times10^8$ [Ω·cm].

Accordingly, a layer which contains a hole-transport material and an acceptor substance and which is not easily oxidized can be provided on a surface in a manufacturing process. Alternatively, a chemically stable layer can be provided on the surface and an etching step can be performed. Adjacent light-emitting devices can be separated by an etching method, for example. A change in characteristics of the light-emitting device caused by the etching step can be suppressed. As a result, a novel display panel that is highly convenient, useful, or reliable can be provided.

[Hole-Transport Material]

For example, an aromatic amine compound or an organic compound having a π-electron rich heteroaromatic ring can be used as the hole-transport material.

For the hole-transport material in the composite material, a compound having an aromatic amine skeleton, a carbazole derivative, an aromatic hydrocarbon, an aromatic hydrocarbon having a vinyl group, or a high molecular compound (such as an oligomer, a dendrimer, or a polymer) can be used. A material having a hole mobility of $1\times10^{-6}$ cm$^2$/Vs or higher can be suitably used as the hole-transport material.

As the compound having an aromatic amine skeleton, for example, N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As aromatic hydrocarbon having a vinyl skeleton, for example, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can be used.

Furthermore, a substance having any of a carbazole derivative, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With use of a substance including an N,N-bis(4-biphenyl)amino group, the reliability of the light-emitting device can be increased.

Specific examples of the hole-transport material in the composite material include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4''-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II) (4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4,4'-diphenyl-4''-(6;1'-binaphthyl-2-yl)triphenylamine (abbreviation: BBAαNβNB), 4,4'-diphenyl-4''-(7;1'-binaphthyl-2-yl)triphenylamine (abbreviation: BBAαNβNB-03), 4,4'-diphenyl-4''-(7-phenyl)naphthyl-2-yltriphenylamine (abbreviation: BBAPβNB-03), 4,4'-diphenyl-4''-(6;2'-binaphthyl-2-yl)triphenylamine (abbreviation: BBA(βN2)B), 4,4'-diphenyl-4''-(7;2'-binaphthyl-2-yl)triphenylamine (abbreviation: BBA(βN2)B-03), 4,4'-diphenyl-4''-(4;2'-binaphthyl-1-yl)triphenylamine (abbreviation: BBAβNαNB), 4,4'-diphenyl-4''-(5;2'-binaphthyl-1-yl)triphenylamine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4''[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4''-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi(9H-fluoren)-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

[Acceptor Substance]

A transition metal oxide or an organic compound containing fluorine or a cyano group can be used for the acceptor substance, for example. The acceptor substance can extract electrons from an adjacent hole-transport layer or a hole-transport material by the application of an electric field. Note that an organic compound having an acceptor property is easily evaporated, which facilitates film deposition. Thus, the productivity of the light-emitting device can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α,α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], α,α,α''-1,2,3-cyclopropanetriylidenetris[2,3,4,5,6-pentafluorobenzeneacetonitrile], or the like can be used.

For the acceptor substance, a molybdenum oxide, a vanadium oxide, a ruthenium oxide, a tungsten oxide, a manganese oxide, or the like can be used. A metal oxide such as a molybdenum oxide is stable in the air and has a low hygroscopic property, and thus can prevent degradation of the unit 103B(j) and the layer 105B(j) caused by oxidation or water in the manufacturing processing.

It is possible to use any of the following materials: phthalocyanine-based complex compounds such as phthalocyanine (abbreviation: $H_2Pc$) and copper phthalocyanine (abbreviation: CuPc); and compounds each having an aromatic amine skeleton such as 4,4'-bis[N-(4-diphenylamino-phenyl)-N-phenylamino]biphenyl (abbreviation: DPAB) and N,N'-bis{4-[bis(3-methylphenyl)amino]phenyl}-diphenyl-(1,1'-biphenyl)-4,4'-diamine (abbreviation: DNTPD).

In addition, high molecular compounds such as poly(3, 4-ethylenedioxythiophene)/poly(styrenesulfonic acid) (abbreviation: PEDOT/PSS), and the like can be used.

<<Structure Example 2 of Light-Emitting Device 550G(i,j)>>

The light-emitting device 550G(i,j) includes an electrode 551G(i,j), an electrode 552G(j), and a layer 105G(j) (see FIG. 4A). Note that the electrode 552G(j) overlaps with the electrode 551G(i,j).

The light-emitting device 550G(i,j) includes a unit 103G(j) and a layer 104G(j).

The unit 103G(j) includes a region sandwiched between the layer 105G(j) and the electrode 551G(i,j). The unit 103G(j) includes a light-emitting layer, and has a function of emitting light. For example, the unit 103B(j) can emit green light.

For example, a layer selected from a hole-transport layer, an electron-transport layer, a carrier-blocking layer, and the like can be used for the unit 103G(j).

<<Structure Example of Layer 105G(j)>>

The layer 105G(j) includes a region sandwiched between the electrode 552G(j) and the electrode 551G(i,j). For example, the layer 105G(j) is positioned between the electrode 552G(j) and the unit 103G(j), and is in contact with the electrode 552G(j). Note that the layer 105G(j) can be used for, for example, an electron-injection layer.

The layer 105G(j) contains the first organic compound and the first metal, and a space 105S(j) is provided between the layer 105G(j) and the layer 105B(j).

<<Structure Example 1 of Layer 104G(j)>>

The layer 104G(j) includes a region sandwiched between the unit 103G(j) and the electrode 551G(i,j). Note that the layer 104G(j) can be used for a hole-injection layer, for example.

The layer 104G(j) contains the same hole-transport material and the same acceptor substance as the layer 104B(j).

A space 104S(j) is provided between the layer 104G(j) and the layer 104B(j). The layer 104B(j) and the layer 104G(j) have conductivity, and the space 104S(j) has a function of preventing electrical continuity between the layer 104B(j) and the layer 104G(j).

On a high-resolution display panel exceeding 1000 ppi, crosstalk occurs when there is electrical continuity between the layer 104B(j) and the layer 104G(j), which narrows the color gamut displayable on the display panel. By providing the space 104S(j) on the high-resolution display panel exceeding 1000 ppi, preferably exceeding 2000 ppi, more preferably exceeding 5000 ppi, a display panel capable of displaying bright colors can be provided.

Thus, holes can be supplied from the positive electrode side to the cathode side. The layer 104G(j) in the light-emitting device 550G(i,j) is separated from the layer 104B(j) in the light-emitting device 550B(i,j), which can prevent occurrence of crosstalk. As a result, a novel display panel that is highly convenient, useful, or reliable can be provided.

The layer 104G(j) can have a region continuous with the layer 104B(j). In other words, the layer 104G(j) is electrically separated from the layer 104B(j) by the space 104S(j).

In the case where the layer 104G(j) includes a region continuous with the layer 104B(j), the layer 104B(j) is a region overlapping with the electrode 551B(i,j) of a layer where the space 104S(j) is provided, and the layer 104G(j) is a region overlapping with the electrode 551G(i,j) of the layer. A space 554S(j) is provided between the layer 104G(j) and the layer 104B(j). In a top view, a straight line drawn from the electrode 551G(i,j) to the electrode 551B(i,j) crosses the space 104S(j) with a probability higher than or equal to a probability that the straight line crosses the continuous region.

<<Structure Example 1 of Partition Wall 528>>

The partition wall 528 includes an opening 528B(i,j) and an opening 528G(i,j) (see FIG. 4C). The opening 528B(i,j) overlaps with the electrode 551B(i,j), and the opening 528G(i,j) overlaps with the electrode 551G(i,j).

The partition wall 528 overlaps with the space 105S(j) between the opening 528B(i,j) and the opening 528G(i,j) (see FIG. 4A).

The partition wall 528 also overlaps with the space 104S(j) between the opening 528B(i,j) and the opening 528G(i,j).

An inorganic material, an organic material, a composite material of an inorganic material and an organic material, or the like can be used for the partition wall 528. Specifically, an inorganic oxide film, an inorganic nitride film, an inorganic oxynitride film, or the like, or a layered material obtained by stacking some of these films can be used for the partition wall 528. For example, a silicon oxide film, a film containing an acrylic resin, a film containing polyimide, or the like can be used as the partition wall 528.

<<Structure Example 1 of Light-Emitting Device 550R(i,j)>>

The light-emitting device 550R(i,j) includes an electrode 551R(i,j), an electrode 552R(j), and a layer 105R(j) (see FIG. 4A). Note that the layer 105R(j) can be used for, for example, an electron-injection layer.

The light-emitting device 550R(i,j) includes a unit 103R(j) and a layer 104R(j). The electrode 552R(j) overlaps with the electrode 551R(i,j). The layer 104R(j) can be used for, for example, a hole-injection layer.

The unit 103R(j) includes a region sandwiched between the layer 105R(j) and the electrode 551R(i,j). The unit 103R(j) includes a light-emitting layer, and has a function of emitting light. For example, the unit 103R(j) can emit red light.

For example, a layer selected from a hole-transport layer, an electron-transport layer, a carrier-blocking layer, and the like can be used for the unit 103R(j).

For example, a blue light-emitting material can be used for the unit 103B(j), a green light-emitting material can be used for the unit 103G(j), and a red light-emitting material can be used for the unit 103R(j). Thus, the emission efficiency of the light-emitting devices can be increased. In addition, light emitted from the light-emitting devices can be efficiently utilized.

Thus, even when etching is performed, manufacturing facilities are not contaminated by an alkali metal. Adjacent light-emitting devices can be separated by etching. Electrical continuity between the layer 104B(j) and the layer 104G(j) can be prevented. A phenomenon in which current flows between the electrode 551B(i,j) and the electrode 552G(j) through the layer 104B(j) and the layer 104G(j) can be prevented. A phenomenon in which current flows between the electrode 551G(i,j) and the electrode 552B(j) through the layer 104B(j) and the layer 104G(j) can be prevented. In addition, occurrence of crosstalk between the light-emitting device 550B(i,j) and the light-emitting device 550G(i,j) can be prevented. As a result, a novel display panel that is highly convenient, useful, or reliable can be provided.

<<Structure Example 1 of Insulating Film 573>>

The electrode 552B(j) is positioned between an insulating film 573 and the electrode 551B(i,j), and the electrode 552G(j) is positioned between the insulating film 573 and the electrode 551G(i,j) (see FIG. 4A).

For example, a stacked film of an insulating film 573A and an insulating film 573B can be used as the insulating film 573.

For example, an aluminum oxide, a magnesium oxide, a hafnium oxide, a gallium oxide, an indium gallium zinc oxide, a silicon nitride, a silicon nitride oxide, or the like can be used for the insulating film 573.

The insulating film 573 can prevent impurities existing around the light-emitting device 550B(i,j) from diffusing into the light-emitting device 550B(i,j). Similarly, the insulating film 573 can prevent impurities existing around the light-emitting device 550G(i,j) from diffusing into the light-emitting device 550G(i,j). As a result, a novel display panel that is highly convenient, useful, or reliable can be provided.

<Structure Example 7 of Display Panel 700>

A structure of the display panel of one embodiment of the present invention will be described with reference to FIGS. 5A and 5B.

Note that the display panel described with reference to FIGS. 5A and 5B is different from the display panel described with reference to FIG. 4A in that the light-emitting device 550B(i,j), the light-emitting device 550G(i,j), and the light-emitting device 550R(i,j) all emit white light.

In addition, the display panel described with reference to FIGS. 5A and 5B is different from the display panel described with reference to FIG. 4A in that a coloring layer CFB(j), a coloring layer CFG(j), and a coloring layer CFR(j) are included (see FIG. 5A). Different portions will be described in detail below, and the above description is referred to for portions where a structure similar to the above is employed.

<<Structure Example 1 of Unit 103B(j)>>

For example, a layer 111(B) emitting blue light EL(1), a layer 111(G) emitting green light EL(2), and a layer 111(R) emitting red light EL(3) can be used for one unit 103B(j) (see FIG. 5B). Thus, white light can be emitted.

Specifically, a stacked structure of the layer 111(B) containing a blue light-emitting material, the layer 111(G) containing a green light-emitting material, and the layer 111(R) containing a red light-emitting material can be used for the unit 103B(j).

A layer containing a hole-transport material, a layer containing an electron-transport material, and a layer containing a material having a bipolar property can be used for the unit 103B(j). For example, the hole-transport material can be used for a layer 112(1). The electron-transport material can be used for a layer 113. The material having a bipolar property can be used for a layer 112(2).

Note that the structure of the unit 103B(j) can be applied to the unit 103G(j) and the unit 103R(j).

<<Structure Example 1 of Coloring Layer>>

The coloring layer CFB(j) overlaps with the light-emitting device 550B(i,j). The coloring layer CFG(j) overlaps with the light-emitting device 550G(i,j), and transmits light of a color different from a color of light that the coloring layer CFB(j) transmits. The coloring layer CFR(j) overlaps with the light-emitting device 550R(i,j), and transmits light of a color different from colors of light that the coloring layer CFB(j) and the coloring layer CFG(j) transmit.

For example, a material that preferentially transmits blue light can be used for the coloring layer CFB(j). Thus, blue light can be extracted from white light.

For example, a material that preferentially transmits green light can be used for the coloring layer CFG(j). Thus, green light can be extracted from white light.

For example, a material that preferentially transmits red light can be used for the coloring layer CFR(j). Thus, red light can be extracted from white light.

<<Structure Example 2 of Unit 103B(j)>>

For example, a blue light-emitting material can be used for the unit 103B(j), the unit 103G(j), and the unit 103R(j). Thus, the light-emitting device 550B(i,j), the light-emitting device 550G(i,j), and the light-emitting device 550R(i,j) can emit blue light.

Instead of the coloring layer, a color conversion layer can be used. For example, nanoparticles, quantum dots, or the like can be used for the color conversion layer.

For example, instead of the coloring layer CFG(j), a color conversion layer which converts blue light to green light can be used. Instead of the coloring layer CFR(j), a color conversion layer which converts blue light to red light can be used. Thus, blue light emitted by the light-emitting device 550G(i,j) can be converted to green light. Blue light emitted by the light-emitting device 550R(i,j) can be converted to red light.

Thus, for example, in the process of forming the light-emitting device 550B(i,j), the light-emitting device 550G(i,j) can also be formed. Furthermore, the hue can be changed with the use of the light-emitting device 550B(i,j) and the light-emitting device 550G(i,j). As a result, a novel display panel that is highly convenient, useful, or reliable can be provided.

<Structure Example 8 of Display Panel 700>

A structure of the display panel of one embodiment of the present invention will be described with reference to FIGS. 6A to 6C and FIG. 7.

Note that the display panel described with reference to FIGS. 6A to 6C and FIG. 7 is different from the display panel described with reference to FIG. 4A in that the light-emitting device 550B(i,j) includes a unit 103B2(j), a layer 106B(j), and a layer 105B2(j) and the light-emitting device 550G(i,j) includes a unit 103G2(j), a layer 106G(j), and a layer 105G2(j). The light-emitting device 550R(i,j) includes a unit 103R2(j), a layer 106R(j), and a layer 105R2(j). The layer 106R(j) is referred to as an intermediate layer in some cases.

Different portions will be described in detail below, and the above description is referred to for portions where a structure similar to the above is employed.

<<Structure Example 2 of Light-Emitting Device 550B(i,j)>>

The light-emitting device 550B(i,j) includes the unit 103B2(j), the layer 106B(j), and the layer 105B2(j) (see FIG. 6A).

<<Structure Example 1 of Unit 103B2(j)>>

The unit 103B2(j) includes a region sandwiched between the layer 105B(j) and the unit 103B(j).

For example, a structure which exhibits a different emission color from that of the unit 103B(j) can be employed for the unit 103B2(j). Specifically, the unit 103B(j) emitting red light and green light and the unit 103B2(j) emitting blue light can be employed. With this structure, a light-emitting device emitting light of a desired color can be provided. A light-emitting device emitting white light can be provided, for example.

For another example, an emission color from the unit 103B(j) can be the same as that of the unit 103B2(j). Specifically, the unit 103B(j) emitting blue light and the unit 103B2(*j*) emitting blue light can be employed. Thus, light can be obtained at high luminance while the power consumption is suppressed.

<<Structure Example 1 of Layer 106B(j)>>

The layer 106B(j) includes a region sandwiched between the unit 103B2(*j*) and the unit 103B(j). Note that the layer 106B(j) can be used for a charge-generation layer, for example. The layer 106B(j) has a function of supplying electrons to the anode side and supplying holes to the cathode side when voltage is applied. The layer 106B(j) is referred to as an intermediate layer in some cases.

The layer 106B(j) contains a composite material. The composite material contains a hole-transport material and an acceptor substance, and the layer 106B(j) has an electrical resistivity greater than or equal to $1 \times 10^2$ [Ω·cm] and less than or equal to $1 \times 10^8$ [Ω·cm]. Note that a composite material that can be used for the layer 104B(j) can be used for the layer 106B(j).

<<Structure Example of Layer 105B2(*j*)>>

The layer 105B2(*j*) includes a region sandwiched between the layer 106B(j) and the unit 103B(j). Note that the layer 105B2(*j*) can be used for an electron-injection layer, for example.

The layer 105B2(*j*) contains the second organic compound and the second metal. For example, the first organic compound that can be used for the layer 105B(j) can be used as the second organic compound. In addition, the first metal that can be used for the layer 105B(j) can be used as the second metal. Note that the second organic compound and the second metal form a SOMO.

<<Structure Example 3 of Light-Emitting Device 550G(i,j)>>

The light-emitting device 550G(i,j) includes the unit 103G2(*j*), the layer 106G(j), and the layer 105G2(*j*).

<<Structure Example of Unit 103G2(*j*)>>

The unit 103G2(*j*) includes a region sandwiched between the layer 105G(j) and the unit 103G(j).

<<Structure Example of Layer 106G(j)>>

The layer 106G(j) includes a region sandwiched between the unit 103G2(*j*) and the unit 103G(j).

The layer 106G(j) contains the same hole-transport material and the same acceptor substance as the layer 106B(j). A space 106S(*j*) is provided between the layer 106G(j) and the layer 106B(j) (see FIG. 6A and FIG. 7). The layer 106B(j) and the layer 106G(j) have conductivity, and the space 106S(*j*) has a function of preventing electrical continuity between the layer 106B(j) and the layer 106G(j). The layer 106G(j) is referred to as an intermediate layer in some cases.

<<Structure Example 2 of Partition Wall 528>>

The partition wall 528 also overlaps with the space 106S(*j*) between the opening 528B(i,j) and the opening 528G(i,j).

Thus, a phenomenon in which current flows between the electrode 551B(i,j) and the electrode 552G(j) through the layer 104B(j) and the layer 104G(j) or between the layer 106B(j) and the layer 106G(j) can be prevented. A phenomenon in which current flows between the electrode 551G(i,j) and the electrode 552B(j) through the layer 104B(j) and the layer 104G(j) can be prevented. In addition, occurrence of crosstalk between the light-emitting device 550B(i,j) and the light-emitting device 550G(i,j) can be prevented. As a result, a novel display panel that is highly convenient, useful, or reliable can be provided.

<<Structure Examples of Layer 104B(j) and Layer 104G(j)>>

The layer 104B(j) includes a first sidewall WL1, and the layer 104G(j) includes a second sidewall WL2 (see FIG. 7).

The second sidewall WL2 faces the first sidewall WL1, and the space 104S(j) is sandwiched between the second sidewall WL2 and the first sidewall WL1.

<<Structure Example of Layer 105G2(*j*)>>

The layer 105G2(*j*) includes a region sandwiched between the layer 106G(j) and the unit 103G(j) (see FIG. 6A). Note that the layer 105G2(*j*) can be used for an electron-injection layer, for example.

The layer 105G2(*j*) contains the second organic compound and the second metal.

A space is provided between the layer 105G2(*j*) and the layer 105B2(*j*) (see FIG. 6A and FIG. 7).

Thus, even when etching is performed, manufacturing facilities are not contaminated by an alkali metal. Adjacent light-emitting devices can be separated by etching. A phenomenon in which current flows between the electrode 551B(i,j) and the electrode 552G(j) through the layer 106B(j) and the layer 106G(j) can be prevented. A phenomenon in which current flows between the electrode 551G(i,j) and the electrode 552B(j) through the layer 106B(j) and the layer 106G(j) can be prevented. In addition, occurrence of crosstalk between the light-emitting device 550B(i,j) and the light-emitting device 550G(i,j) can be prevented. As a result, a novel display panel that is highly convenient, useful, or reliable can be provided.

<<Structure Example 2 of Insulating Film 573>>

The insulating film 573 is in contact with the first sidewall WL1 and the second sidewall WL2. Note that the insulating film 573 fills the space 104S(j).

<<Structure Example 3 of Insulating Film 573>>

The insulating film 573 is in contact with the partition wall 528 (see FIG. 7).

<<Structure Example 4 of Insulating Film 573>>

The insulating film 573 includes the insulating film 573A and the insulating film 573B.

The insulating film 573A is sandwiched between the insulating film 573B and the electrode 552B(j), and between the insulating film 573B and the electrode 552G(i,j).

<<Structure Example 3 of Partition Wall 528>>

The partition wall 528 is in contact with the insulating film 573A, and contains a silicon nitride, for example.

An insulating film which has a high capability of preventing diffusion of an impurity such as water can be used for the partition wall 528. For example, a structure similar to that of the insulating film 573B can be suitably employed. Accordingly, the partition wall 528 in a region not overlapping with the light-emitting device 550G(i,j) is in contact with the insulating film 573A. In other words, the light-emitting device 550G(i,j) can be sealed by the insulating film 573A, the insulating film 573B, and the partition wall 528.

Thus, a phenomenon in which water is diffused from the outside of the insulating film 573B and the partition wall 528 into the light-emitting device 550G(i,j) can be prevented. Furthermore, water in the insulating film 573B and the partition wall 528 can be captured or fixed. The concentration of water in the light-emitting device 550G(i,j) can be reduced. As a result, a novel display panel that is highly convenient, useful, or reliable can be provided.

<Structure Example 9 of Display Panel 700>

The display panel described in this embodiment includes the insulating film 705 (see FIG. 6A).

<<Structure Example of Insulating Film 705>>

The insulating film 705 fills a space between the unit 103B(j) and the unit 103G(j). Note that the insulating film 705 fills the space 104S(j) in some cases instead of the insulating film 573.

The insulating film 705 includes a region sandwiched between the functional layer 520 and the base 770, and has a function of bonding the functional layer 520 and the base 770 together.

An inorganic material, an organic material, a composite material of an inorganic material and an organic material, or the like can be used for the insulating film 705.

Specifically, an inorganic oxide film, an inorganic nitride film, an inorganic oxynitride film, or the like, or a layered material obtained by stacking some of these films can be used for the insulating film 705.

For example, a film including any of a silicon oxide film, a silicon nitride film, a silicon oxynitride film, an aluminum oxide film, and the like, or a film including a layered material obtained by stacking any of these films can be used for the insulating film 705. Note that a silicon nitride film is a dense film and has an excellent function of inhibiting diffusion of impurities.

For example, polyester, polyolefin, polyamide, polyimide, polycarbonate, polysiloxane, or an acrylic resin, or a layered or composite material including resins selected from these can be used for the insulating film 705.

For example, an organic material such as a reactive curable adhesive, a light curable adhesive, a thermosetting adhesive, and/or an anaerobic adhesive can be used for the insulating film 705.

Thus, a phenomenon in which impurities are diffused into the light-emitting device 550B(i,j) and the light-emitting device 550G(i,j) can be suppressed. Furthermore, the reliability of the light-emitting device 550B(i,j) and the light-emitting device 550G(i,j) can be improved. As a result, a novel display panel that is highly convenient, useful, or reliable can be provided.

<Structure Example 10 of Display Panel 700>

The structure of a display panel of one embodiment of the present invention will be described with reference to FIG. 8.

Note that the display panel described with reference to FIG. 8 is different from the display panel described with reference to FIGS. 6A to 6C in that the insulating film 573 fills the space 104S($j$) and the coloring layer CFB(j), the coloring layer CFG(j), and the coloring layer CFR(j) are formed in contact with the insulating film 573.

<<Structure Example 2 of Coloring Layer>>

For example, a coloring film formed using a color resist to be in contact with the insulating film 573 can be used for the coloring layer CFB(j), the coloring layer CFG(j), and the coloring layer CFR(j) (see FIG. 8).

<<Structure Example 5 of Insulating Film 573>>

The insulating film 573 includes a region sandwiched between the coloring layer CFB(j) and the light-emitting device 550B(i,j), a region sandwiched between the coloring layer CFG(j) and the light-emitting device 550G(i,j), and a region sandwiched between the coloring layer CFR(j) and the light-emitting device 550R(i,j).

The electrode 552B(j) is positioned between the insulating film 573 and the electrode 551B(i,j), the electrode 552G(j) is positioned between the insulating film 573 and the electrode 551G(i,j), and the electrode 552R(j) is positioned between the insulating film 573 and the electrode 551R(i,j).

For example, a stacked-layer film of an organic material and an inorganic material can be used as the insulating film 573. Thus, the insulating film 573 with good-quality and less defects can be formed. Furthermore, in a step of forming the coloring layer CFB(j), the coloring layer CFG(j), and the coloring layer CFR(j), the insulating film 573 can protect the components positioned between the insulating film 573 and the electrode 551B(i,j), for example. Furthermore, a phenomenon in which impurities are diffused into the light-emitting devices 550B(i,j), 550G(i,j), and 550R(i,j) can be suppressed.

<Structure Example 11 of Display Panel 700>

A structure of a display panel of one embodiment of the present invention will be described with reference to FIGS. 9A and 9B.

Note that the display panel display panel described with reference to FIGS. 9A and 9B is different from the display panel described with reference to FIGS. 6A to 6C in that the display panel in FIGS. 9A and 9B includes a protection layer 554B(j), a protection layer 554G(j) and a protection layer 554R(j).

The protection layer 554B(j) overlaps with the light-emitting device 550B(i,j), and the electrode 552B(j) includes a region sandwiched between the protection layer 554B(j) and the layer 105B(j) (see FIGS. 9A and 9B).

The protection layer 554G(j) overlaps with the light-emitting device 550G(i,j), and the electrode 552G(j) includes a region sandwiched between the protection layer 554G(j) and the layer 105G(j). The space 554S($j$) is provided between the protection layer 554G(j) and the protection layer 554B(j). The space 554S($j$) overlaps with the space 106S($j$), the space 104S($j$), and the partition wall 528.

For example, a film including any of a silicon oxide film, a silicon nitride film, a silicon oxynitride film, an aluminum oxide film, and the like, or a film including a layered material obtained by stacking any of these films can be used for the protection layer 554B(j), the protection layer 554G (j), and the protection layer 554R(j). Note that a silicon nitride film is a dense film and has an excellent function of inhibiting diffusion of impurities. The aluminum oxide film can be formed by an atomic layer deposition (ALD) method, for example.

<Structure Example 12 of Display Panel 700>

A structure of the display panel of one embodiment of the present invention will be described with reference to FIGS. 10A and 10B.

Note that the display panel display panel described with reference to FIGS. 10A and 10B is different from the display panel described with reference to FIGS. 6A to 6C in that the display panel in FIGS. 10A and 10B does not includes the partition wall 528 and includes the protection layer 554B(j), the protection layer 554G(j) and the protection layer 554R (j).

A space 5515($j$) is provided between the electrode 551G (i,j) and the electrode 551B(i,j) (see FIG. 10B). The space 5515($j$) overlaps with the space 104S($j$), the space 106S($j$), and the space 554S($j$).

As in the display panel described with reference to FIG. 9A, for example, a film including any of a silicon oxide film, a silicon nitride film, a silicon oxynitride film, an aluminum oxide film, and the like, or a film including a layered material obtained by stacking any of these films can be used for the protection layer 554B(j), the protection layer 554G (j), and the protection layer 554R(j).

<Structure Example 13 of Display Panel 700>

A structure of a display panel of one embodiment of the present invention will be described with reference to FIG. 11.

Note that the display panel described with reference to FIG. 11 is different from the display panel described with reference to FIGS. 6A to 6C in that the display panel 700 includes the electrode 552 instead of the electrode 552B(j), the electrode 552G(j), and the electrode 552R(j) and the electrode 552 serves as a common electrode between the light-emitting device 550G(i,j), the light-emitting device 550B(i,j), and the light-emitting device 550R(i,j).

In addition, the display panel described with reference to FIG. 11 is different from the display panel described with reference to FIGS. 6A to 6C in that the display panel 700 includes the layer 105 instead of the layer 105B(j), the layer 105G(j), and the layer 105R(j) and that the layer 105 serves as a common electron-injection layer between the light-emitting device 550B(i,j), the light-emitting device 550G(i,j), and the light-emitting device 550R(i,j).

In addition, the display panel described with reference to FIG. 11 is different from the display panel described with reference to FIGS. 6A to 6C in that the display panel 700 includes a unit 1032 instead of the unit 103B2($j$), the unit 103G2($j$), and the unit 103R2($j$) and that the unit 1032 serves as a common unit between the light-emitting device 550B(i,j), the light-emitting device 550G(i,j), and the light-emitting device 550R(i,j).

<Structure Example 14 of Display Panel 700>

A structure of a display panel of one embodiment of the present invention will be described with reference to FIGS. 12A and 12B.

Note that the display panel described with reference to FIGS. 12A and 12B is different from the display panel described with reference to FIGS. 4A to 4C in that the display panel 700 includes the electrode 552 instead of the electrode 552B(j), the electrode 552G(j), and the electrode 552R(j) and the electrode 552 serves as a common electrode between the light-emitting device 550B(i,j), the light-emitting device 550G(i,j), and the light-emitting device 550R(i,j).

The display panel described with reference to FIGS. 12A and 12B is different from the display panel described with reference to FIGS. 4A to 4C in that the display panel 700 includes a layer 107.

Furthermore, the display panel described with reference to FIGS. 12A and 12B is different from the display panel described with reference to FIGS. 4A to 4C in that the light-emitting device 550B(i,j) includes a layer 106B2($i,j$), the light-emitting device 550G(i,j) includes a layer 106G2($i,j$), and the light-emitting device 550R(i,j) includes a layer 106R2($i,j$).

The display panel described with reference to FIGS. 12A and 12B is different from the display panel described with reference to FIGS. 4A to 4C in that the light-emitting device 550B(i,j) includes a layer 104B(i,j), a unit 103B(i,j), and a layer 105B(i,j) instead of the layer 104B(j), the unit 103B(j), and the layer 105B(j), respectively.

Each of the layer 104B(j), the unit 103B(j), and the layer 105B(j) illustrated in FIG. 4A has a band shape extending in the X direction as indicated by the dashed line in FIG. 4C. Each of the layer 104B(i,j), the unit 103B(i,j), the layer 105B(i,j), and the layer 106B2($i,j$) in FIG. 12A has an island shape as indicated by the dashed line in FIG. 12B, and adjacent light-emitting devices do not include any of these layers in common.

The above-described different points apply to the light-emitting device 550G(i,j) and the light-emitting device 550R(i,j).

Different portions will be described in detail below, and the above description is referred to for portions where a structure similar to the above is employed.

The display panel of one embodiment of the present invention includes the light-emitting device 550B(i,j), the light-emitting device 550G(i,j), and a partition wall 528 (see FIG. 12A). In addition, a light-emitting device 550R(i,j) is included.

<<Structure Example 3 of Light-Emitting Device 550B(i,j)>>

The light-emitting device 550B(i,j) includes the electrode 551B(i,j), the electrode 552, the layer 105B(i,j), and the layer 106B2($i,j$). Note that the electrode 552 overlaps with the electrode 551B(i,j).

<<Structure Example 1 of Layer 105B(i,j)>>

The layer 105B(i,j) includes a region sandwiched between the electrode 552 and the electrode 551B(i,j).

The layer 105B(i,j) contains the first organic compound and the first metal.

For example, an organic compound including an unshared electron pair can be used as the first organic compound. A metal belonging to Group 5, Group 7, Group 9, Group 11, or Group 13 can be used as the first metal.

Note that the first organic compound and the first metal form a SOMO.

For example, the structure described with reference to FIG. 4A which can be used for the layer 105B(j) can be employed for the layer 105B(i,j).

<<Structure Example 1 of Layer 106B2($i,j$)>>

The layer 106B2($i,j$) includes a region sandwiched between the electrode 552 and the layer 105B(i,j).

The layer 106B2($i,j$) contains a composite material. The composite material contains a hole-transport material and an acceptor substance, and the layer 106B2($i,j$) has an electrical resistivity greater than or equal to $1 \times 10^2$ [Ω·cm] and less than or equal to $1 \times 10^8$ [Ω·cm].

For example, the structure described with reference to FIG. 4A which can be used for the layer 104B(j) can be employed for the layer 106B2($i,j$).

The layer 106B2($i,j$) can supply electrons to the anode side and supply holes to the cathode side when voltage is applied. Specifically, electrons can be supplied to the unit 103B(i,j) that is positioned on the anode side. Holes can be supplied to the layer 107 that is positioned on the cathode side. The layer 106B2($i,j$) can be referred to as a charge-generation layer. The layer 106B3($i,j$) is referred to as an intermediate layer in some cases.

<<Structure Example 4 of Light-Emitting Device 550G(i,j)>>

The light-emitting device 550G(i,j) includes the electrode 551G(i,j), a layer 105G(i,j), and the layer 106G2($i,j$) (see FIG. 12A). The layer 106G2($i,j$) overlaps with the electrode 551G(i,j).

<<Structure Example of Layer 105G(i,j)>>

The layer 105G(i,j) includes a region sandwiched between the layer 106G2($i,j$) and the electrode 551G(i,j).

The layer 105G(i,j) contains the first organic compound and the first metal.

The space 105S($j$) is provided between the layer 105G(i,j) and the layer 105B(i,j).

<<Structure Example of Layer 106G2($i,j$)>>

The layer 106G2($i,j$) contains a composite material. The composite material contains a hole-transport material and an acceptor substance, and the layer 106G2($i,j$) has an electrical resistivity greater than or equal to $1 \times 10^2$ [Ω·cm] and less than or equal to $1 \times 10^8$ [Ω·cm]. A space 10652($j$) is provided between the layer 106G2($i,j$) and the layer 106B2($i,j$). The layer 106G3($i,j$) is referred to as an intermediate layer in some cases.

<<Structure Example 4 of Partition Wall 528>>

The partition wall 528 includes an opening 528B(i,j) and an opening 528G(i,j). The opening 528B(i,j) overlaps with the electrode 551B(i,j), and the opening 528G(i,j) overlaps with the electrode 551G(i,j).

The partition wall 528 also overlaps with the space 105S(j) between the opening 528B(i,j) and the opening 528G(i,j).

<Structure Example 15 of Display Panel 700>

A display panel of one embodiment of the present invention includes the layer 107 (see FIG. 12A). The layer 107 includes a region sandwiched between the electrode 552 and the layer 106B2(i,j), a region sandwiched between the electrode 552 and the layer 106G2(i,j), and a region sandwiched between the electrode 552 and the layer 106R2(i,j).

<<Structure Example 1 of Layer 107>>

For example, a hole-transport material can be used for the layer 107. Accordingly, holes supplied from the layer 106B2(i,j) can be transferred to the electrode 552. Holes supplied from the layer 106G2(i,j) can be transferred to the electrode 552. Holes supplied from the layer 106R2(i,j) can be transferred to the electrode 552.

<Structure Example 16 of Display Panel 700>

A structure of a display panel of one embodiment of the present invention will be described with reference to FIGS. 13A and 13B and FIG. 14.

Note that the display panel described with reference to FIGS. 13A and 13B and FIG. 14 is different from the display panel described with reference to FIGS. 6A to 6C in that the display panel 700 includes the electrode 552 instead of the electrode 552B(j), the electrode 552G(j), and the electrode 552R(j) and the electrode 552 serves as a common electrode between the light-emitting device 550B(i,j), the light-emitting device 550G(i,j), and the light-emitting device 550R(i,j).

The display panel described with reference to FIGS. 13A and 13B and FIG. 14 is different from the display panel described with reference to FIGS. 6A to 6C in that the display panel 700 includes the layer 107.

Furthermore, the display panel described with reference to FIGS. 13A and 13B and FIG. 14 is different from the display panel described with reference to FIGS. 6A to 6C in that the light-emitting device 550B(i,j) includes the layer 106B2(i,j), the light-emitting device 550G(i,j) includes the layer 106G2(i,j), and the light-emitting device 550R(i,j) includes the layer 106R2(i,j).

The display panel described with reference to FIGS. 13A and 13B and FIG. 14 is different from the display panel described with reference to FIGS. 6A to 6C in that the light-emitting device 550B(i,j) includes the layer the 104B(i,j), the unit 103B(i,j), the layer 105B(i,j), the layer 106B(i,j), the unit 103B2(i,j), and the layer 105B2(i,j) instead of the layer 104B(j), the unit 103B(j), the layer 105B(j), the layer 106B(j), the unit 103B2(j), and the layer 105B2(j), respectively.

Each of the layer 104B(j), the unit 103B(j), the layer 105B(j), the layer 106B(j), the unit 103B2(j), and the layer 105B2(j) illustrated in FIG. 6A has a band shape extending in the X direction as indicated by the dashed line in FIG. 6C. Each of the layer 104B(i,j), the unit 103B(i,j), the layer 105B(i,j), the layer 106B(i,j), the unit 103B2(i,j), and the layer 105B2(i,j) in FIG. 13A has an island shape as indicated by the dashed line in FIG. 13B, and adjacent light-emitting devices do not include any of these layers in common.

The above-described different points apply to the light-emitting device 550G(i,j) and the light-emitting device 550R(i,j).

Different portions will be described in detail below, and the above description is referred to for portions where a structure similar to the above is employed.

The display panel of one embodiment of the present invention includes the light-emitting device 550B(i,j), the light-emitting device 550G(i,j), and a partition wall 528 (see FIG. 13A). In addition, the light-emitting device 550R(i,j) is included.

<<Structure Example 4 of Light-Emitting Device 550B(i,j)>>

The light-emitting device 550B(i,j) includes the electrode 551B(i,j), the electrode 552, the layer 105B2(i,j), and the layer 106B2(i,j). Note that the electrode 552 overlaps with the electrode 551B(i,j).

<<Structure Example 1 of Layer 105B2(i,j)>>

The layer 105B2(i,j) includes a region sandwiched between the layer 106B(i,j) and the unit 103B(i,j).

The layer 105B2(i,j) contains the second organic compound and the second metal.

For example, an organic compound including an unshared electron pair can be used as the second organic compound. A metal belonging to Group 5, Group 7, Group 9, Group 11, or Group 13 can be used as the second metal.

Note that the second organic compound and the second metal form a SOMO.

For example, the structure described with reference to FIG. 4A which can be used for the layer 105B(j) can be employed for the layer 105B2(i,j).

<<Structure Example 2 of Layer 106B2(i,j)>>

The layer 106B2(i,j) includes a region sandwiched between the electrode 552 and the layer 105B(i,j).

The layer 106B2(i,j) contains a composite material. The composite material contains a hole-transport material and an acceptor substance, and the layer 106B2(i,j) has an electrical resistivity greater than or equal to $1\times10^2$ [Ω·cm] and less than or equal to $1\times10^8$ [Ω·cm].

For example, the structure described with reference to FIG. 4A which can be used for the layer 104B(j) can be employed for the layer 106B2(i,j).

The layer 106B2(i,j) can supply electrons to the anode side and supply holes to the cathode side when voltage is applied. Specifically, electrons can be supplied to the unit 103B2(i,j) that is positioned on the anode side. Holes can be supplied to the layer 107 that is positioned on the cathode side. The layer 106B2(i,j) can be referred to as a charge-generation layer.

<<Structure Example 5 of Light-Emitting Device 550G(i,j)>>

The light-emitting device 550G(i,j) includes the electrode 551G(i,j), a layer 105G2(i,j), and the layer 106G2(i,j). The layer 106G2(i,j) overlaps with the electrode 551G(i,j).

<<Structure Example of Layer 105G2(i,j)>>

The layer 105G2(i,j) includes a region sandwiched between a layer 106G(i,j) and a unit 103G(i,j).

The layer 105G2(i,j) contains the second organic compound and the second metal.

A space is provided between the layer 105G2(i,j) and the layer 105B2(i,j) (see FIGS. 13A and 13B and FIG. 14).

<<Structure Example 2 of Layer 106G2(i,j)>>

The layer 106G2(i,j) contains a composite material. The composite material contains a hole-transport material and an acceptor substance, and has an electrical resistivity greater than or equal to $1\times10^2$ [Ω·cm] and less than or equal to $1\times10^8$ [Ω·cm]. The space 106S2(j) is provided between the layer 106G2(ij) and the layer 106B2(ij).

<<Structure Example 5 of Partition Wall 528>>

The partition wall 528 includes the opening 528B(i,j) and the opening 528G(i,j). The opening 528B(i,j) overlaps with the electrode 551B(i,j), and the opening 528G(i,j) overlaps with the electrode 551G(i,j).

The partition wall 528 also overlaps with the space 105S(j) between the opening 528B(i,j) and the opening 528G(i,j).

<Structure Example 17 of Display Panel 700>

A display panel of one embodiment of the present invention includes the layer 107 (see FIG. 13A). The layer 107 includes a region sandwiched between the electrode 552 and the layer 106B2(ij), a region sandwiched between the electrode 552 and the layer 106G2(ij), and a region sandwiched between the electrode 552 and the layer 106R2(ij).

<<Structure Example 2 of Layer 107>>

For example, a hole-transport material can be used for the layer 107. Accordingly, holes supplied from the layer 106B2 (ij) can be transferred to the electrode 552. Holes supplied from the layer 106G2(ij) can be transferred to the electrode 552. Holes supplied from the layer 106R2(ij) can be transferred to the electrode 552.

Note that this embodiment can be combined with any of the other embodiments in this specification as appropriate.

Embodiment 2

In this embodiment, a structure of a display panel of one embodiment of the present invention will be described with reference to FIG. 15 to FIG. 18.

Figure 15:
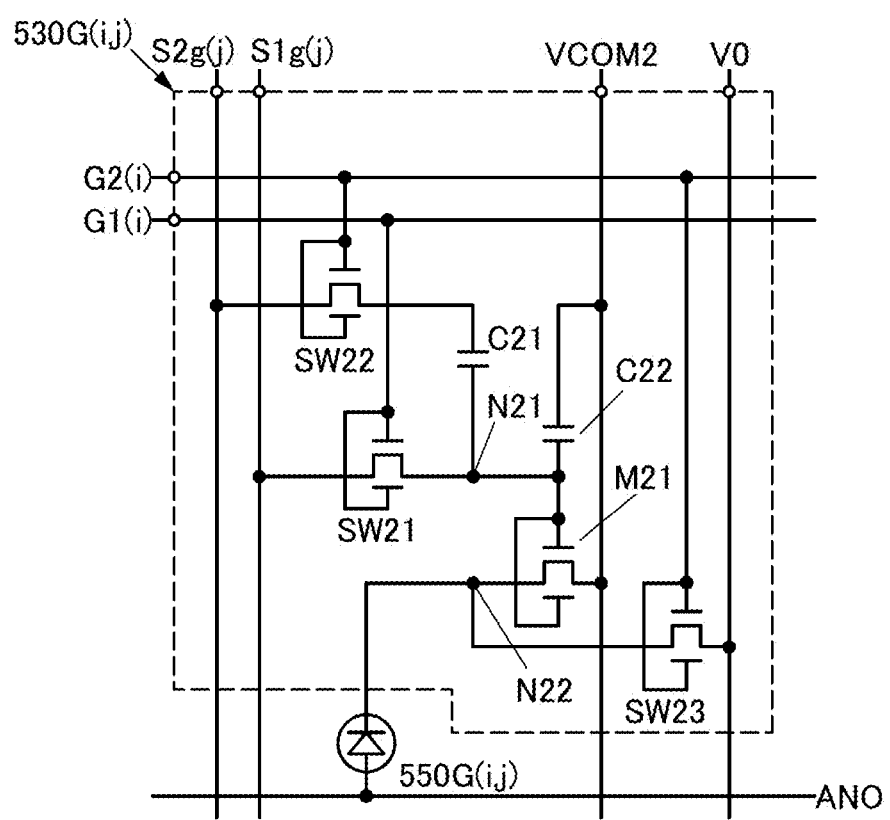
FIG. 15 is a circuit diagram illustrating a pixel of a display panel in Embodiment.

FIG. 15 is a circuit diagram illustrating a pixel in the display panel of one embodiment of the present invention.

Figure 16A:
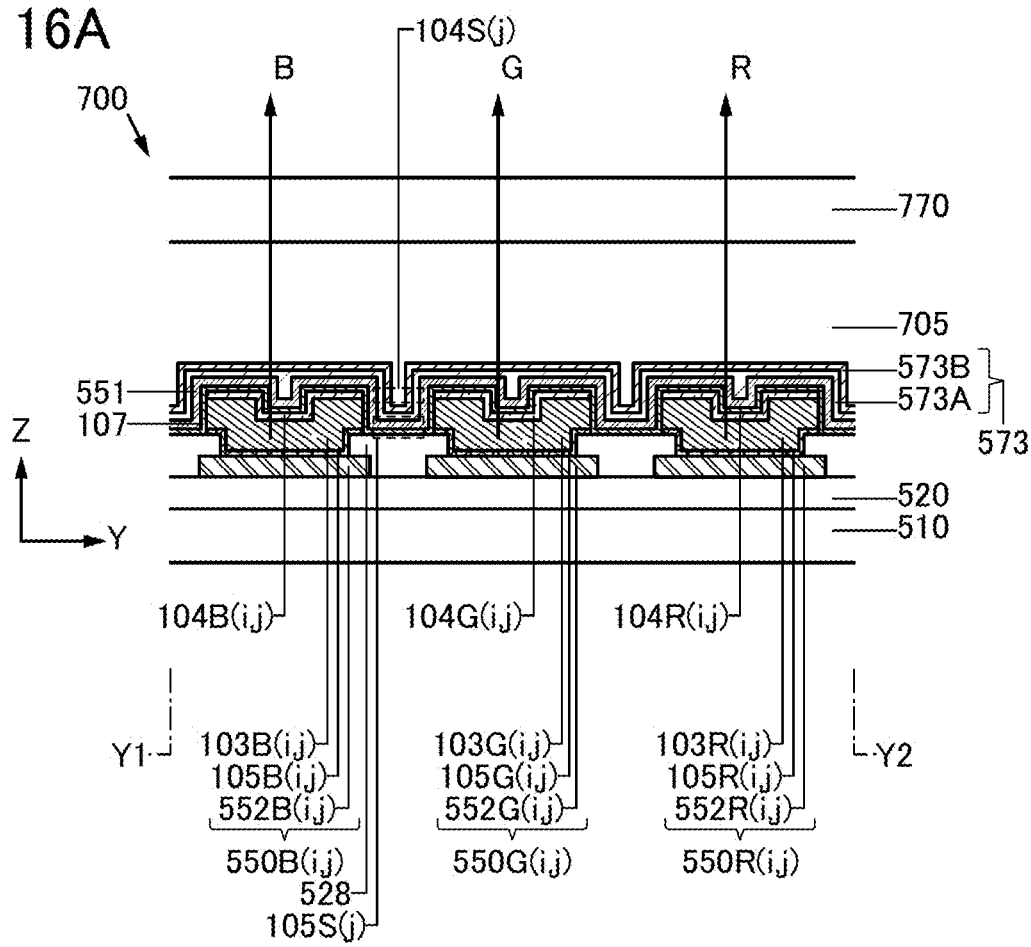
FIGS. 16A and 16B illustrate a structure of a display panel in Embodiment.
Figure 16B:
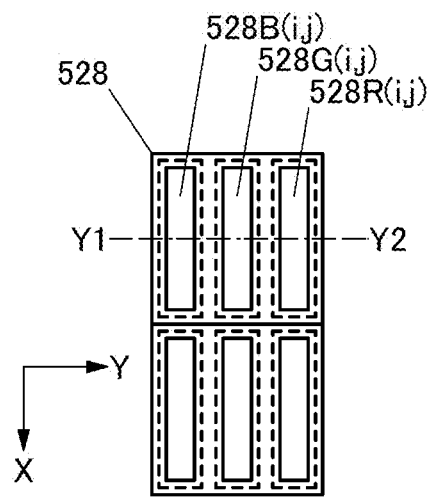

FIGS. 16A and 16B illustrate a structure of a display panel of one embodiment of the present invention. FIG. 16A is a cross-sectional view of a pixel in a display panel of one embodiment of the present invention, and FIG. 16B is a top view of the pixel in FIG. 16A.

Figure 17A:
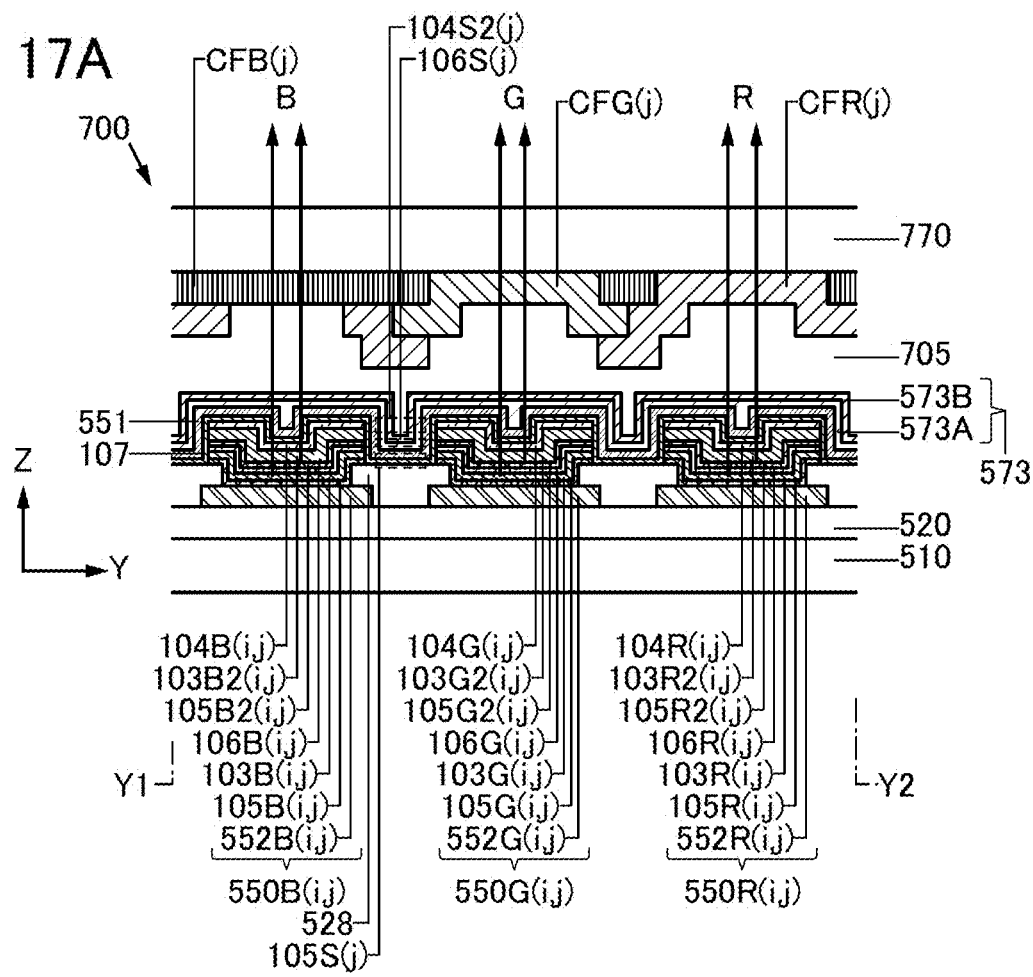
FIGS. 17A and 17B illustrate a structure of a display panel in Embodiment.
Figure 17B:
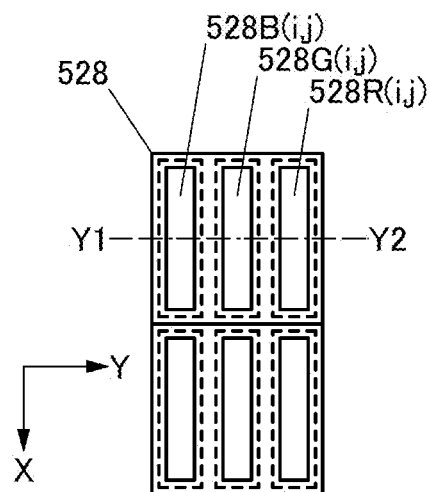

FIGS. 17A and 17B illustrate a display panel of one embodiment of the present invention, which is different from the display panel of one embodiment of the present invention described with reference to FIGS. 16A and 16B. FIG. 17A is a cross-sectional view of a pixel in the display panel of one embodiment of the present invention and FIG. 17B is a top view of the pixel illustrated in FIG. 17A.

Figure 18:
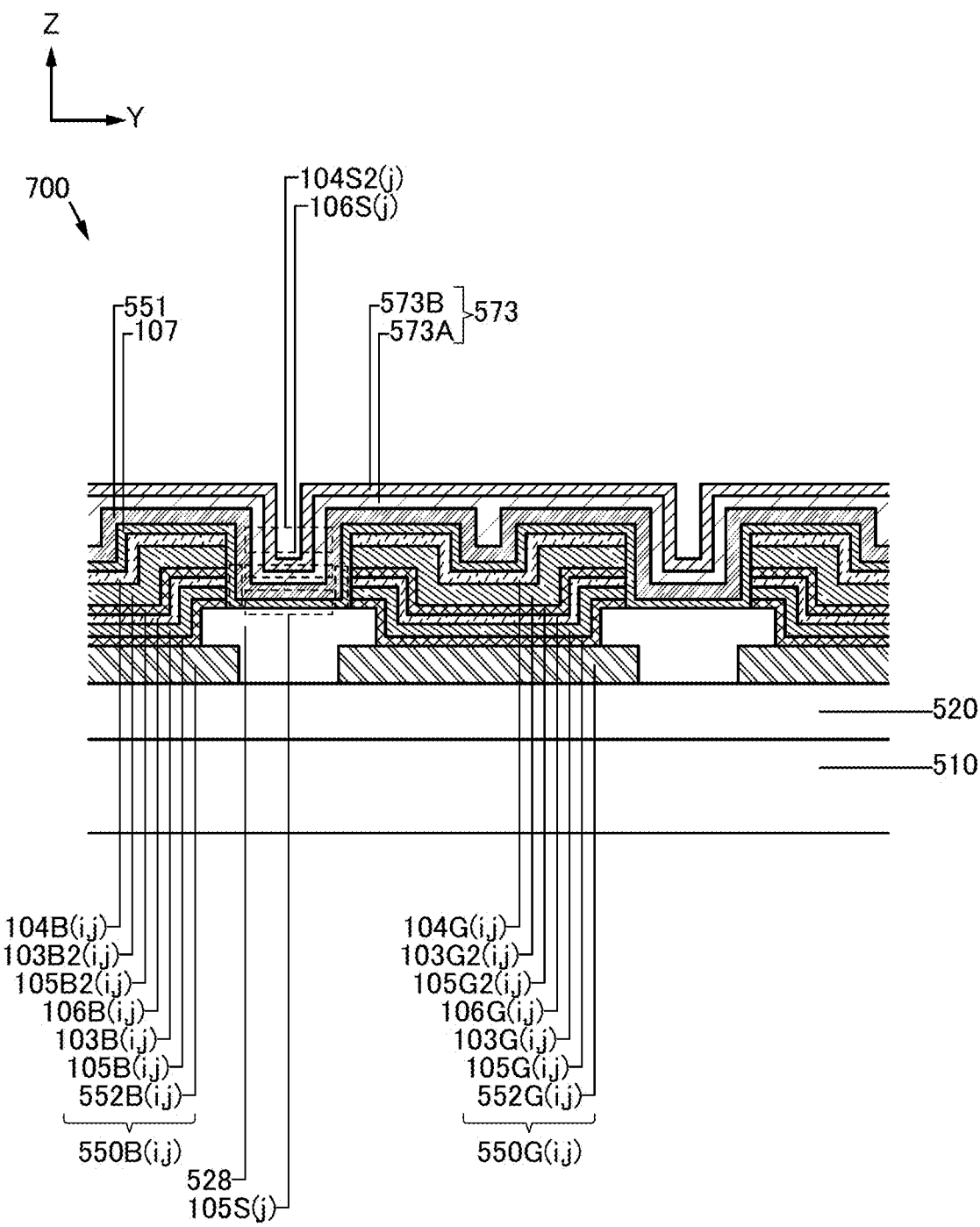
FIG. 18 illustrates part of FIG. 17A.

FIG. 18 illustrates part of the display panel of one embodiment of the present invention described with reference to FIGS. 17A and 17B.

<Structure Example 1 of Display Panel 700>

The functional panel 700 includes a pixel 702G(i,j), a conductive film G1(i), a conductive film G2(i), a conductive film S1g(j), a conductive film S2g(j), a conductive film ANO, and a conductive film VCOM2 (see FIGS. 1A and 1B and FIG. 15).

The conductive film G1(i) is supplied with the first selection signal, the conductive film G2(i) is supplied with the second selection signal, the conductive film S1g(j) is supplied with the image signal, and the conductive film S2g(j) is supplied with the control signal, for example.

The pixel 702G(i,j) includes the pixel circuit 530G(i,j) and the light-emitting device 550G(i,j).

The display panel described in Embodiment 2 is different from the display panel described in Embodiment 1 in that the pixel circuit 530G(i,j) is electrically connected to the conductive film VCOM2, the pixel circuit 530G(i,j) is electrically connected to the electrode 552G(i,j) of the light-emitting device 550G(i,j), and the electrode 551 of the light-emitting device 550G(i,j) is electrically connected to the conductive film ANO, for example, current flows from the light-emitting device 550G(i,j) to the pixel circuit 530G (i,j).

Different portions will be described in detail below, and the above description is referred to for portions where a structure similar to the above is employed.

<<Structure Example of Pixel 702G(i,j)>>

The pixel 702G(i,j) includes the pixel circuit 530G(i,j) and the light-emitting device 550G(i,j) (see FIG. 15).

<<Structure Example 1 of Pixel Circuit 530G(i,j)>>

The pixel circuit 530G(i,j) is supplied with the first selection signal and obtains an image signal in accordance with the first selection signal. For example, the first selection signal can be supplied using the conductive film G1(i) (see FIG. 15). The image signal can be supplied using the conductive film S1g(j). Note that the operation of supplying the first selection signal and making the pixel circuit 530G (i,j) obtain an image signal can be referred to as "writing".

<<Structure Example 2 of Pixel Circuit 530G(i,j)>>

The pixel circuit 530G(i,j) includes the switch SW21, the switch SW22, the transistor M21, the capacitor C21, and the node N21 (see FIG. 15). The pixel circuit 530G(i,j) includes the node N22, the capacitor C22, and the switch SW23.

The transistor M21 includes a gate electrode electrically connected to the node N21, the first electrode electrically connected to the light-emitting device 550G(i,j), and the second electrode electrically connected to the conductive film VCOM2.

The switch SW21 includes the first terminal electrically connected to the node N21 and the second terminal electrically connected to the conductive film S1g(j), and has a function of controlling its on/off state on the basis of the potential of the conductive film G1(i).

The switch SW22 includes the first terminal electrically connected to the conductive film S2g(j), and has a function of controlling its on/off state on the basis of the potential of the conductive film G2(i).

The capacitor C21 includes the conductive film electrically connected to the node N21 and the conductive film electrically connected to the second electrode of the switch SW22.

Accordingly, an image signal can be stored in the node N21. Alternatively, the potential of the node N21 can be changed using the switch SW22. Alternatively, the intensity of light emitted from the light-emitting device 550G(i,j) can be controlled with the potential of the node N21.

<Structure Example 2 of Display Panel 700>

The display panel 700 described in this embodiment includes the light-emitting device 550B(i,j), the light-emitting device 550G(i,j), and a partition wall 528 (see FIG. 16A). In addition, a light-emitting device 550R(i,j) is included.

<<Structure Example 1 of Light-Emitting Device 550B(i,j)>>

The light-emitting device 550B(i,j) includes an electrode 552B(i,j), the electrode 551, and the layer 105B(i,j). Note that the electrode 551 overlaps with the electrode 552B(i,j).

<<Structure Example of Layer 105B(i,j)>>

The layer 105B(i,j) includes a region sandwiched between the electrode 552B(i,j) and the electrode 551. For example, the layer 105B(i,j) is sandwiched between the electrode 552B(i,j) and the unit 103B(i,j), and is in contact with the electrode 552B(i,j). Note that the layer (i,j) can be used for, for example, an electron-injection layer.

The layer 105B(i,j) contains the first organic compound and the first metal. Note that the first organic compound and the first metal form a SOMO. For example, the energy level of the SOMO is lower than the energy level of LUMO of the first organic compound within a range of greater than or equal to −1.5 eV and less than 0 eV.

For example, a composite material of the first organic compound including an unshared electron pair and the first metal can be used for the layer 105B(i,j). The sum of the number of electrons of the first organic compound and the number of electrons of the first metal is preferably an odd number. The molar ratio of the first metal to 1 mol of the first organic compound is preferably greater than or equal to 0.1 and less than or equal to 10, more preferably greater than or equal to 0.2 and less than or equal to 2, further more preferably greater than or equal to 0.2 and less than or equal to 0.8.

Accordingly, the first organic compound including an unshared electron pair interacts with the first metal and thus can form a SOMO. Furthermore, in the case where electrons are injected from the electrode 552B(j) into the layer 105B (j), a barrier therebetween can be reduced. The first metal has a low reactivity with water or oxygen; thus, the moisture resistance of the light-emitting device 550B(i,j) can be improved.

The layer 105 can adopt a composite material that allows the spin density of the layer 105B(j) measured by an electron spin resonance method (ESR) to be preferably greater than or equal to $1\times10^{16}$ spins/cm$^3$, more preferably $5\times10^{16}$ spins/cm$^3$, further more preferably greater than or equal to $1\times10^{17}$ spins/cm$^3$.

The concentration of an alkali metal contained in the layer 105B(i,j) is preferably lower than the concentration of the first metal contained in the layer 105B(i,j). Examples of the alkali metal are lithium, sodium, potassium, rubidium, cesium, and francium. The concentrations of the alkali metal and the first metal contained in the layer 105B(i,j) can be measured by a secondary ion mass spectrometry method or the like.

[First Organic Compound]

For example, the organic compound including an unshared electron pair can be used as the first organic compound. Specifically, an organic compound that can be used for the layer 105B(j) described in Embodiment 1 can be used. For example, a compound having an electron deficient heteroaromatic ring can be used.

[First Metal]

For example, a metal belonging to Group 5, Group 7, Group 9, Group 11, or Group 13 can be used as the first metal. Specifically, a metal that can be used for the layer 105B(j) described in Embodiment 1 can be used. For example, silver (Ag) can be used.

<<Structure Example 1 of Light-Emitting Device 550G(i,j)>>

The light-emitting device 550G(i,j) includes the electrode 552G(i,j), the electrode 551, and the layer 105G(i,j) (see FIG. 16A). Note that the electrode 551 overlaps with the electrode 552G(i,j).

<<Structure Example of Layer 105G(i,j)>>

The layer 105G(i,j) includes a region sandwiched between the electrode 552G(i,j) and the electrode 551. For example, the layer 105G(i,j) is sandwiched between the electrode 552G(i,j) and the unit 103G(i,j), and is in contact with the electrode 552G(i,j). Note that the layer 105G(i,j) can be used for, for example, an electron-injection layer.

The layer 105G(i,j) contains the first organic compound and the first metal. The space 105S(j) is provided between the layer 105G(i,j) and the layer 105B(i,j).

<<Structure Example 1 of Partition Wall 528>>

The partition wall 528 includes an opening 528B(i,j) and an opening 528G(i,j) (see FIG. 16B). The opening 528B(i,j) overlaps with the electrode 552B(i,j), and the opening 528G(i,j) overlaps with the electrode 552G(i,j).

The partition wall 528 overlaps with the space 105S(j) between the opening 528B(i,j) and the opening 528G(i,j) (see FIG. 16A).

The partition wall 528 is in contact with the layer 105B(j) and the layer 105G(j).

For example, the structure of the partition wall 528 described in Embodiment 1 can be employed.

Thus, for example, driving voltage of the display panel can be reduced without using an alkali metal for the light-emitting device. Adjacent light-emitting devices can be separated by etching. Even when etching is performed, manufacturing facilities are not contaminated by an alkali metal. As a result, a novel display panel that is highly convenient, useful, or reliable can be provided.

<<Structure Example 2 of Light-Emitting Device 550B(i,j)>>

The light-emitting device 550B(i,j) includes the unit 103B(i,j) and the layer 104B(i,j) (see FIG. 16A).

<<Structure Example 1 of Unit 103B(i,j)>>

The unit 103B(i,j) includes a region sandwiched between the layer 105B(i,j) and the electrode 551. The unit 103B(i,j) includes a light-emitting layer, and has a function of emitting light. For example, the unit 103B(i,j) can emit blue light.

For example, a layer selected from functional layers such as a hole-transport layer, an electron-transport layer, and a carrier-blocking layer can be used for the unit 103B(i,j).

<<Structure Example 1 of Layer 104B(i,j)>>

The layer 104B(i,j) includes a region sandwiched between the unit 103B(i,j) and the electrode 551. Note that the layer 104B(i,j) can be used for a hole-injection layer, for example.

The layer 104B(i,j) contains a composite material. The composite material contains a first hole-transport material and a first acceptor substance. The layer 104B(i,j) has an electrical resistivity greater than or equal to $1\times10^2$ [$\Omega\cdot$cm] and less than or equal to $1\times10^8$ [$\Omega\cdot$cm].

[First Hole-Transport Material]

For example, an aromatic amine compound or an organic compound having a π-electron rich heteroaromatic ring can be used as the hole-transport material. Specifically, the hole-transport material that can be used for the layer 104B(j) described in Embodiment 1 can be used.

[Acceptor Substance]

A transition metal oxide or an organic compound containing fluorine or a cyano group can be used for the acceptor substance, for example. Specifically, an acceptor substance that can be used for the layer 104B(j) described in Embodiment 1 can be used.

<<Structure Example 2 of Light-Emitting Device 550G(i,j)>>

The light-emitting device 550G(i,j) includes the unit 103G(i,j) and a layer 104G(i,j) (see FIG. 16A).

<<Structure Example 1 of Unit 103G(i,j)>>

The unit 103G(i,j) includes a region sandwiched between the layer 105G(i,j) and the electrode 551. The unit 103G(i,j) includes a light-emitting layer, and has a function of emitting light. For example, the unit 103G(i,j) can emit green light.

For example, a layer selected from functional layers such as a hole-transport layer, an electron-transport layer, and a carrier-blocking layer can be used for the unit 103G(i,j).

<<Structure Example 1 of Layer 104G(i,j)>>

The layer 104G(i,j) includes a region sandwiched between the unit 103G(i,j) and the electrode 551. Note that the layer 104G(i,j) can be used for a hole-injection layer, for example.

The layer 104G(i,j) contains the same hole-transport material and the same acceptor substance as the layer 104B(i,j).

A space 104S(j) is provided between the layer 104G(i,j) and the layer 104B(i,j). The layer 104B(i,j) and the layer 104G(i,j) have conductivity, and the space 104S(j) has a function of preventing electrical continuity between the layer 104B(i,j) and the layer 104G(i,j).

<<Structure Example 1 of Partition Wall 528>>

The partition wall 528 overlaps with the space 104S(j) between the opening 528B(i,j) and the opening 528G(i,j).

With this structure, adjacent light-emitting devices can be separated by etching, for example. Furthermore, a change in characteristics of the light-emitting device caused by the etching step can be suppressed. As a result, a novel display panel that is highly convenient, useful, or reliable can be provided.

<Structure Example 3 of Display Panel 700>

A display panel of one embodiment of the present invention includes the layer 107 (see FIG. 16A). The layer 107 includes a region sandwiched between the electrode 551 and the layer 104B(i,j), a region sandwiched between the electrode 551 and the layer 104G(i,j), and a region sandwiched between the electrode 551 and the layer 104R(i,j).

<<Structure Example 1 of Layer 107>>

For example, a hole-transport material can be used for the layer 107. Accordingly, holes can be transferred from the electrode 551 to the layer 104B(i,j). Holes can be transferred from the electrode 551 to the layer 104G(i,j). Holes can be transferred from the electrode 551 to the layer 104R(i,j).

<Structure Example 4 of Display Panel 700>

A structure of a display panel of one embodiment of the present invention will be described with reference to FIGS. 17A and 17B and FIGS. 18A and 18B.

The display panel described with reference to FIGS. 17A and 17B and FIG. 18 is different from the display panel described with reference to FIGS. 16A and 16B in that the display panel includes the coloring layer CFB(j), the coloring layer CFG(j), and the coloring layer CFR(j) (see FIG. 17A).

Another different point from the display panel described with reference to FIGS. 16A and 16B is that each of the light-emitting device 550B(i,j), the light-emitting device 550G(i,j), and the light-emitting device 550R(i,j) emits white light.

Another different point from the display panel described with reference to FIGS. 16A and 16B is that the light-emitting device 550B(i,j) includes the unit 103B2$(i,j)$, the layer 106B(i,j), and the layer 105B2$(i,j)$ and the light-emitting device 550G(i,j) includes a unit 103G2$(i,j)$, the layer 106G(i,j), and the layer 105G2$(i,j)$. The light-emitting device 550R(i,j) includes a unit 103R2$(i,j)$, a layer 106R(i,j), and a layer 105R2$(i,j)$. The layer 106R(i,j) is referred to as an intermediate layer in some cases.

Different portions will be described in detail below, and the above description is referred to for portions where a structure similar to the above is employed.

<<Structure Example 1 of Coloring Layer>>

The coloring layer CFB(j) overlaps with the light-emitting device 550B(i,j) (see FIG. 17A). For example, a material that preferentially transmits blue light can be used for the coloring layer CFB(j). Thus, blue light can be extracted from white light.

The coloring layer CFG(j) overlaps with the light-emitting device 550G(i,j), and transmits light of a color different from a color of light that the coloring layer CFB(j) transmits. For example, a material that preferentially transmits green light can be used for the coloring layer CFG(j). Thus, green light can be extracted from white light.

The coloring layer CFR(j) overlaps with the light-emitting device 550R(i,j), and transmits light of a color different from colors of light that the coloring layer CFB(j) and the coloring layer CFG(j) transmit. For example, a material that preferentially transmits red light can be used for the coloring layer CFR(j). Thus, red light can be extracted from white light.

<<Structure Example 3 of Light-Emitting Device 550B(i,j)>>

The light-emitting device 550B(i,j) includes the unit 103B2$(i,j)$, the layer 106B(i,j), and the layer 105B2$(i,j)$ (see FIG. 17A).

<<Structure Example 1 of Unit 103B2$(i,j)$>>

The unit 103B2$(i,j)$ includes a region sandwiched between the layer 104B(i,j) and the unit 103B(i,j).

For example, a structure which exhibits a different emission color from that of the unit 103B(i,j) can be employed for the unit 103B2$(i,j)$. With this structure, a light-emitting device emitting light of a desired color can be provided. Specifically, the unit 103B(i,j) can adopt a structure emitting red light and green light and the unit 103B2$(i,j)$ can adopt a structure emitting blue light. Thus, a light-emitting device emitting white light can be provided, for example.

<<Structure Example 1 of Layer 106B(i,j)>>

The layer 106B(i,j) includes a region sandwiched between the unit 103B2$(i,j)$ and the unit 103B(i,j). Note that the layer 106B(i,j) can be used for a charge-generation layer, for example. The layer 106B(i,j) has a function of supplying electrons to the anode side and supplying holes to the cathode side when voltage is applied.

The layer 106B(i,j) contains a composite material. The composite material contains a hole-transport material and an acceptor substance, and the layer 106B(i,j) has an electrical resistivity greater than or equal to $1\times10^2$ [Ω·cm] and less than or equal to $1\times10^8$ [Ω·cm]. Note that a composite material that can be used for the layer 104B(i,j) can be used for the layer 106B(i,j).

<<Structure Example of Layer 105B2$(i,j)$>>

The layer 105B2$(i,j)$ includes a region sandwiched between the unit 103B2$(i,j)$ and the layer 106B. Note that the layer 105B2$(i,j)$ can be used for an electron-injection layer, for example.

The layer 105B2$(i,j)$ contains the second organic compound and the second metal. For example, the first organic compound that can be used for the layer 105B(i,j) can be used as the second organic compound. In addition, the first metal that can be used for the layer 105B(i,j) can be used as the second metal. Note that the second organic compound and the second metal form a SOMO.

<<Structure Example 3 of Light-Emitting Device 550G(i,j)>>

The light-emitting device 550G(i,j) includes the unit 103G2$(i,j)$, the layer 106G(i,j), and the layer 105G2$(i,j)$ (see FIG. 17A).

<<Structure Example 1 of Unit 103G2$(i,j)$>>

The unit 103G2$(i,j)$ includes a region sandwiched between the layer 104G(i,j) and the unit 103G(i,j). The unit 103G2$(i,j)$ includes a light-emitting layer and has a function of emitting light.

<<Structure example 1 of layer 106G(i,j)>>

The layer 106G(i,j) includes a region sandwiched between the unit 103G2$(i,j)$ and the unit 103G(i,j). The layer 106G(i,j) can be used as a charge-generation layer, for example. The layer 106G(i,j) has a function of supplying electrons to the anode side and supplying holes to the cathode side when voltage is applied.

The layer 106G(i,j) contains a composite material. The composite material contains a hole-transport material and an acceptor substance and has an electrical resistivity greater than or equal to 1×10² [Ω·cm] and less than or equal to 1×10⁸ [Ω·cm]. Note that a composite material that can be used for the layer 104G(i,j) can be used for the layer 106G(i,j).

A space 106S(j) is provided between the layer 106G(i,j) and the layer 106B(i,j) (see FIG. 17A and FIG. 18). The layer 106B(i,j) and the layer 106G(i,j) have conductivity, and the space 106S(j) has a function of preventing electrical continuity between the layer 106B(i,j) and the layer 106G (i,j).

<<Structure Example of Layer 105G2(*i,j*)>>

The layer 105G2(*i,j*) includes a region sandwiched between the unit 103G2(*i,j*) and the layer 106G. The layer 105G2(*i,j*) can be used as an electron-injection layer, for example.

The layer 105G2(*i,j*) contains the second organic compound and the second metal. For example, the first organic compound that can be used for the layer 105G(i,j) can be used as the second organic compound. The first metal that can be used for the layer 105G(i,j) can be used as the second metal. Note that the second organic compound and the second metal form a SOMO.

<<Structure Example 2 of Partition Wall 528>>

The partition wall 528 also overlaps with the space 106S(*j*) between the opening 528B(i,j) and the opening 528G(i,j).

Thus, a phenomenon in which current flows between the layer 106B(i,j) and the layer 106G(i,j) can be prevented. In addition, occurrence of crosstalk between the light-emitting device 550B(i,j) and the light-emitting device 550G(i,j) can be prevented. As a result, a novel display panel that is highly convenient, useful, or reliable can be provided.

<Structure Example 5 of Display Panel 700>

The display panel of one embodiment of the present invention includes the layer 107 (see FIG. 17A). The layer 107 includes a region sandwiched between the electrode 551 and the layer 104B(i,j), a region sandwiched between the electrode 551 and the layer 104G(i,j), and a region sandwiched between the electrode 551 and the layer 104R(i,j).

<<Structure Example 2 of Layer 107>>

For example, a hole-transport material can be used for the layer 107. Accordingly, holes can be transferred from the electrode 551 to the layer 104B(i,j). Holes can be transferred from the electrode 551 to the layer 104G(i,j). Holes can be transferred from the electrode 551 to the layer 104R(i,j).

Note that this embodiment can be combined with any of the other embodiments in this specification as appropriate.

Embodiment 3

In this embodiment, a method for manufacturing a display panel of one embodiment of the present invention will be described with reference to FIGS. 19A and 19B, FIGS. 20A to 20C, FIGS. 21A to 21C, FIGS. 22A to 22C, FIGS. 23A to 23C, FIGS. 24A to 24C, FIGS. 25A and 25B, FIGS. 26A to 26C, FIGS. 27A and 27B, FIGS. 28A and 28B, FIGS. 29A to 29C, and FIGS. 30A and 30B.

Figure 19A:
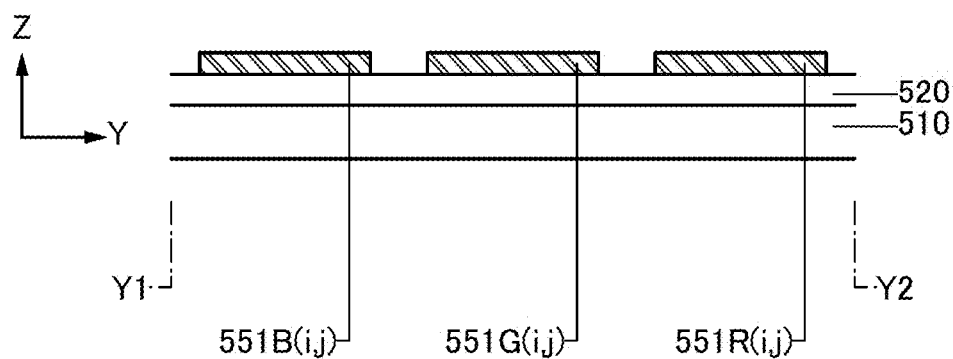
FIGS. 19A and 19B illustrate a method for manufacturing a display panel in Embodiment.
Figure 19B:
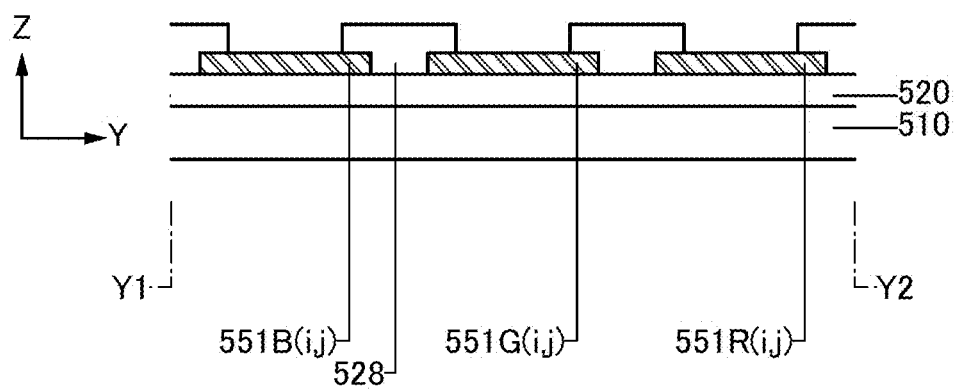

FIGS. 19A and 19B illustrate a method for manufacturing a display panel of one embodiment of the present invention.

FIGS. 20A to 20C, FIGS. 21A to 21C, and FIGS. 22A to 22C illustrate the method for manufacturing the display panel of one embodiment of the present invention.

Figure 22A:
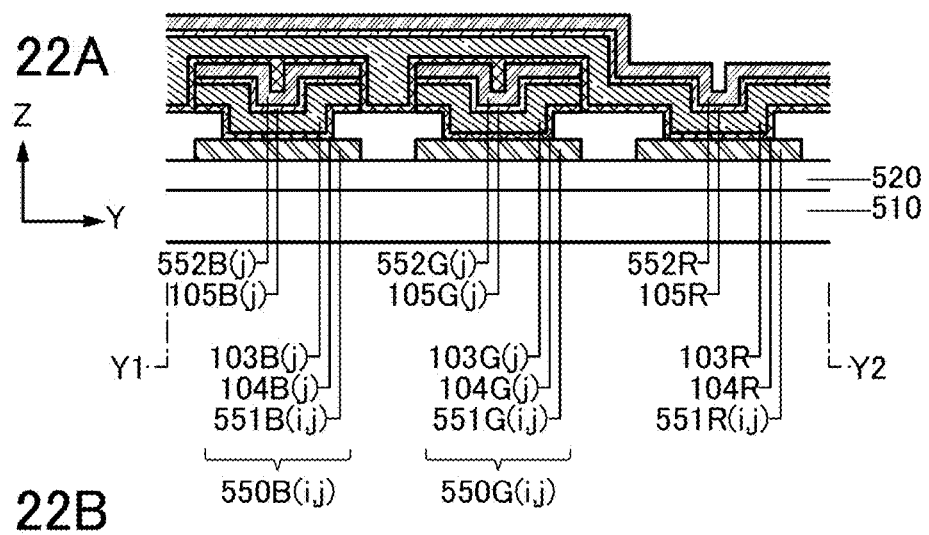
FIGS. 22A to 22C illustrate a method for manufacturing a display panel in Embodiment.
Figure 22B:
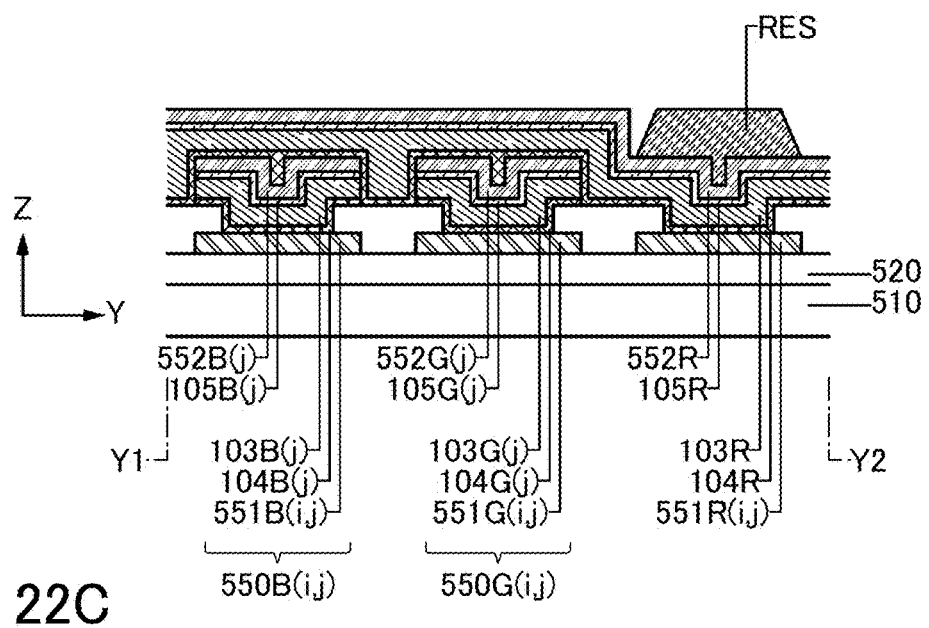
Figure 22C:
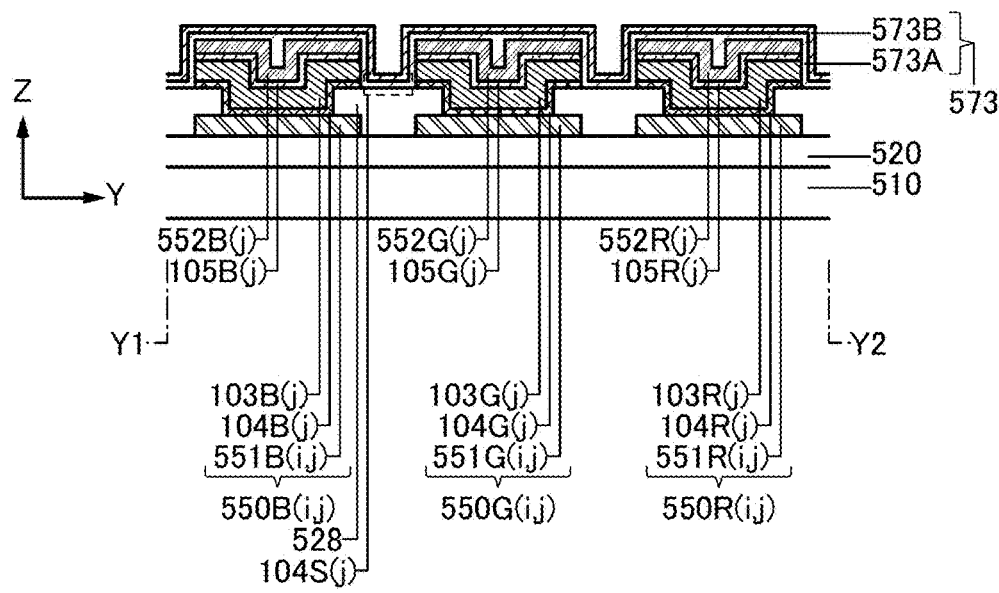
Figure 23A:
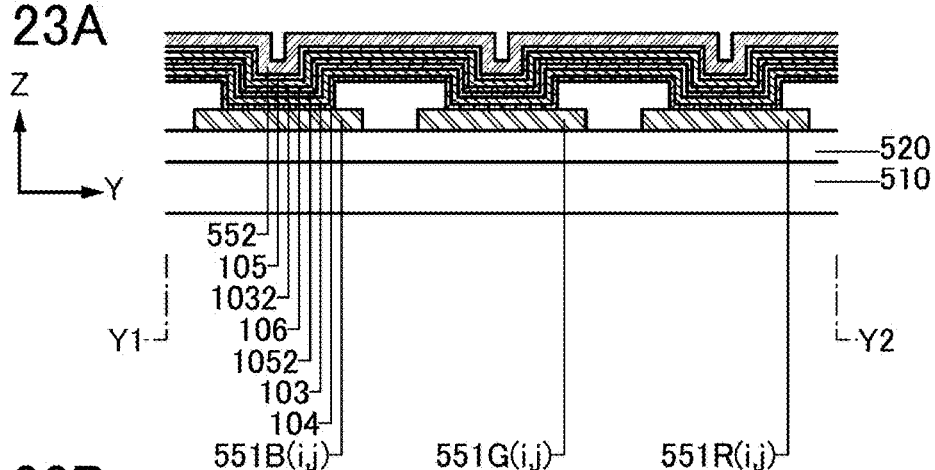
FIGS. 23A to 23C illustrate a method for manufacturing a display panel in Embodiment.
Figure 23B:
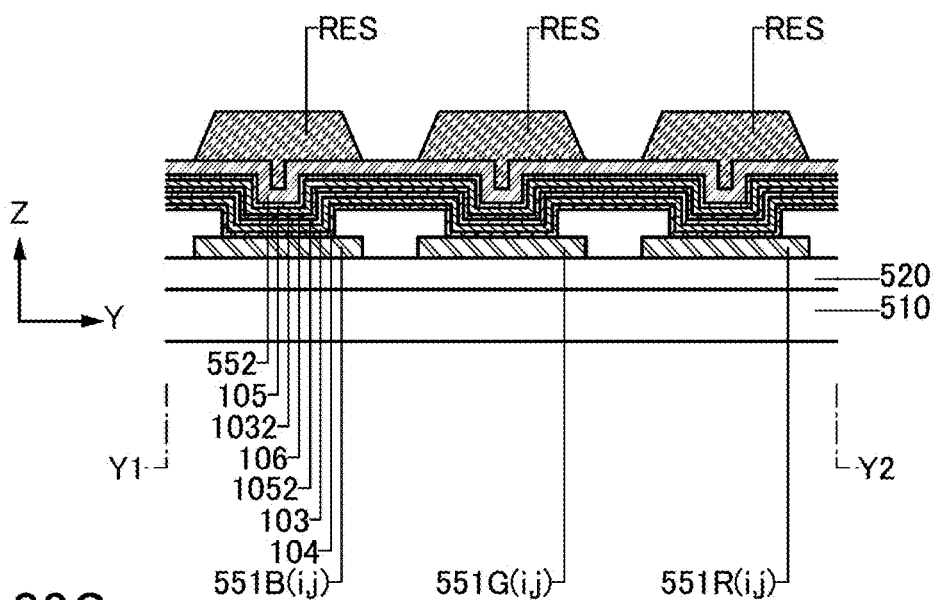
Figure 23C:
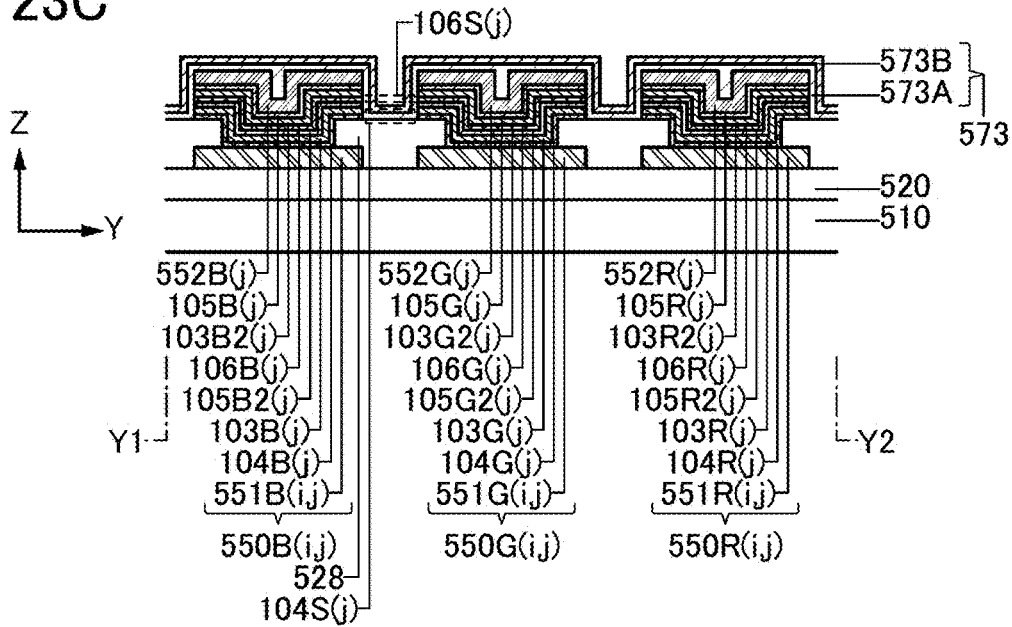

FIGS. 23A to 23C illustrate a method for manufacturing a display panel of one embodiment of the present invention, which is different from the display panel of one embodiment of the present invention described with reference to FIGS. 20A to 20C, FIGS. 21A to 21C, and FIGS. 22A to 22C.

FIGS. 24A to 24C and FIGS. 25A and 25B illustrate a method for manufacturing a display panel of one embodiment of the present invention, which is different from the display panels of embodiments of the present invention described with reference to FIGS. 20A to 20C, FIGS. 21A to 21C, FIGS. 22A to 22C, and FIGS. 23A to 23C.

FIGS. 26A to 26C and FIGS. 27A and 27B illustrate a method for manufacturing a display panel of one embodiment of the present invention, which is different from the display panel of one embodiment of the present invention described with reference to FIGS. 20A to 20C, FIGS. 21A to 21C, FIGS. 22A to 22C, FIGS. 23A to 23C, and FIGS. 24A to 24C.

FIGS. 28A and 28B, FIGS. 29A to 29C, and FIGS. 30A and 30B illustrate a method for manufacturing a display panel of one embodiment of the present invention.

<Example 1 of Method for Manufacturing Display Panel>

A method for manufacturing a display panel of one embodiment of the present invention has the following first to fifteenth steps. For example, the display panel 700 of one embodiment of the present invention described with reference to FIGS. 4A to 4C can be manufactured.

<<First Step>>

In the first step, the electrode 551B(i,j), the electrode 551G(i,j), and the electrode 551R(i,j) are formed (see FIG. 19A). For example, a conductive film is formed over the functional layer 520 formed over the base 510, and processed into a predetermined shape by photolithography. For example, the conductive film is processed into island shapes.

<<Second Step>>

In the second step, the partition wall 528 is formed between the electrode 551B(i,j) and the electrode 551G(i,j) (see FIG. 19B). For example, an insulating film covering the electrodes 551B(i,j), 551G(i,j), and 551R(i,j) is formed, and an opening is formed by photolithography to expose the electrodes 551B(i,j), 551G(i,j), and 551R(i,j).

<<Third Step>>

Figure 20A:
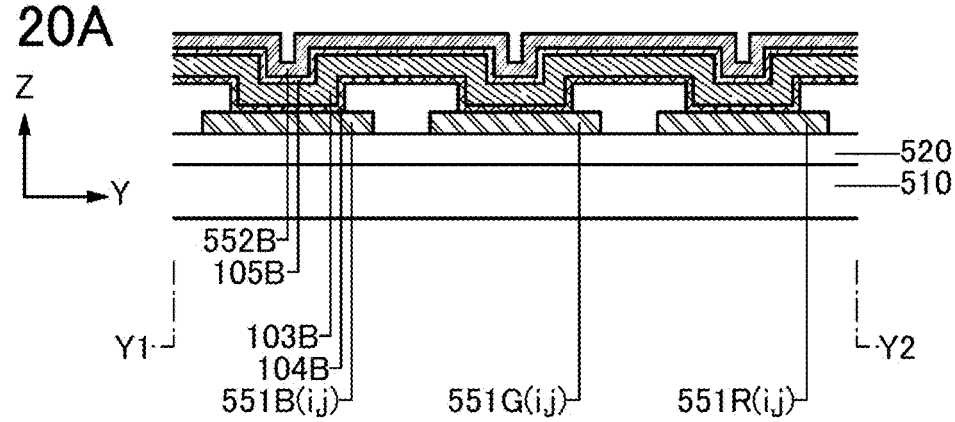
FIGS. 20A to 20C illustrate a method for manufacturing a display panel in Embodiment.

In the third step, a layer 104B containing a hole-transport material and an acceptor substance is formed over the electrodes 551B(i,j) and 551G(i,j) (see FIG. 20A). For example, the layer 104B is formed by a vacuum evaporation method to cover the electrodes 551B(i,j), 551G(i,j), and 551R(i,j). Specifically, a co-evaporation method is used.

<<Fourth Step>>

In the fourth step, the unit 103B is formed over the layer 104B. For example, a vacuum evaporation method is used.

<<Fifth Step>>

In the fifth step, a layer 105B containing the first organic compound and the first metal is formed over the unit 103B. For example, a vacuum evaporation method, specifically, a co-evaporation method is used.

<<Sixth Step>>

In the sixth step, the electrode 552B is formed over the layer 105B (see FIG. 20A). For example, a vacuum evaporation method is used.

Figure 20B:
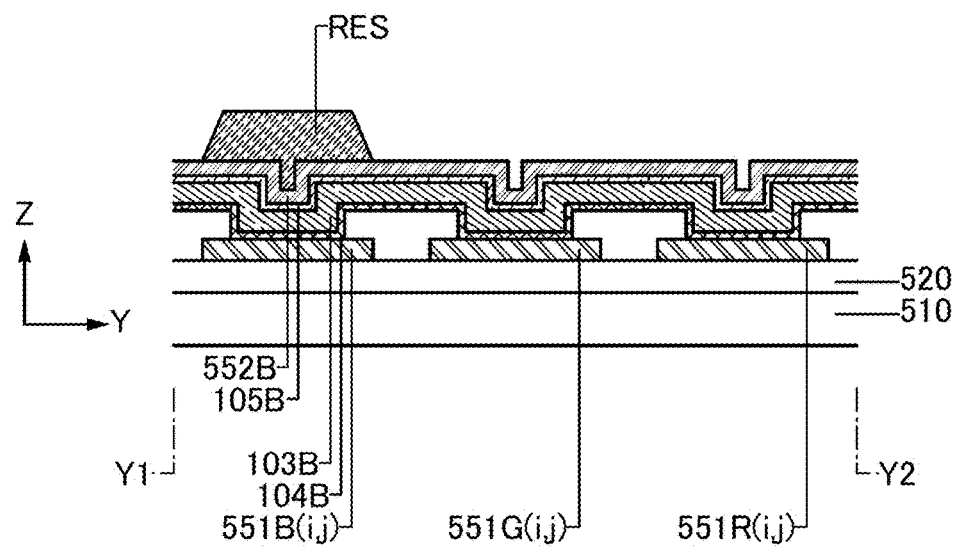

A resist RES is formed over the electrode 552B (see FIG. 20B). For example, the resist RES is formed in a position overlapping with the electrode 551B(i,j).

<<Seventh Step>>

Figure 20C:
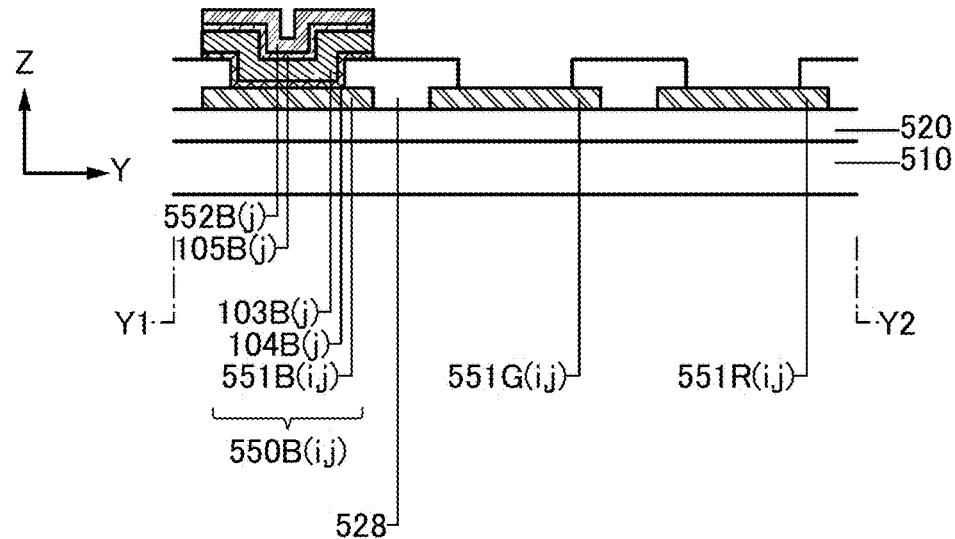

In the seventh step, the layer 104B, the unit 103B, the layer 105B, and the electrode 552B are processed into a predetermined shape (see FIG. 20C). For example, the layer 104B, the unit 103B, the layer 105B, and the electrode 552B over the electrode 551G(i,j) are removed by photoetching, whereby the layer 104B, the unit 103B, the layer 105B, and the electrode 552B are processed into a band shape that extends in the direction intersecting with the paper. Thus, the light-emitting device 550B(i,j) is formed.

Specifically, a portion overlapping with the partition wall 528 and the like are removed using the resist RES and an etching method. The partition wall 528 can be used as an etching stopper.

<<Eighth Step>>

Figure 21A:
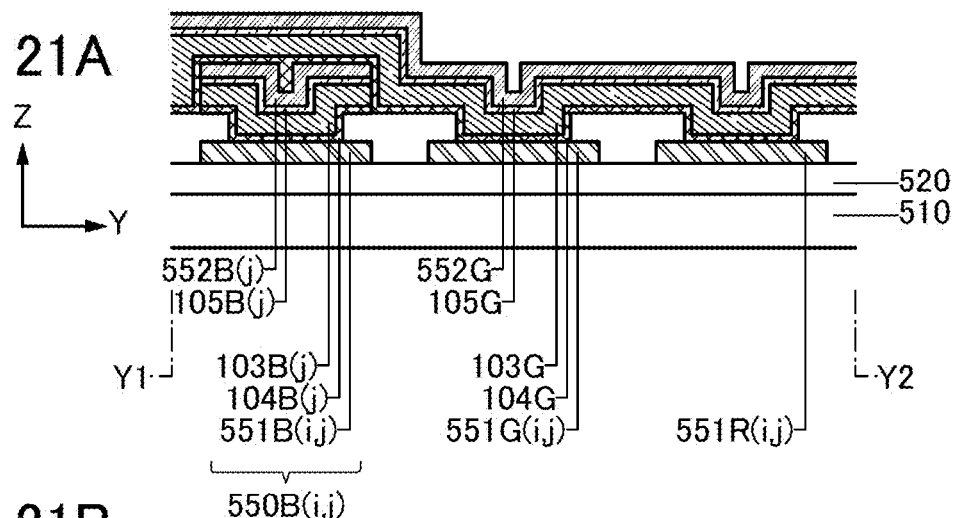
FIGS. 21A to 21C illustrate a method for manufacturing a display panel in Embodiment.

In the eighth step, a layer 104G containing a hole-transport material and an acceptor substance is formed over the light-emitting device 550B(i,j) and the electrode 551G(i,j) (see FIG. 21A). For example, the layer 104G is formed by a vacuum evaporation method to cover the electrode 551G(i,j), and the electrode 551R(i,j). Specifically, a co-evaporation method is used.

<<Ninth Step>>

In the ninth step, the unit 103G is formed over the layer 104G. For example, a vacuum evaporation method is used.

<<Tenth Step>>

In the tenth step, a layer 105G containing the first organic compound and the first metal is formed over the unit 103G. For example, a vacuum evaporation method, specifically, a co-evaporation method is used.

<<Eleventh Step>>

In the eleventh step, the electrode 552G is formed over the layer 105G (see FIG. 21A). For example, a vacuum evaporation method is used.

Figure 21B:
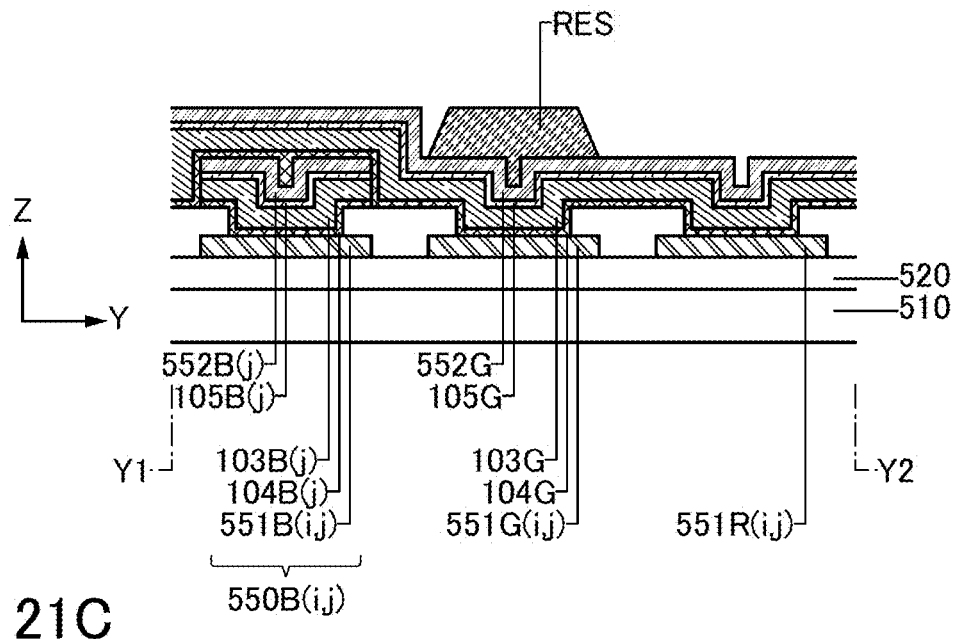

A resist RES is formed over the electrode 552G (see FIG. 21B). For example, the resist RES is formed in a position overlapping with the electrode 551G(i,j).

<<Twelfth Step>>

Figure 21C:
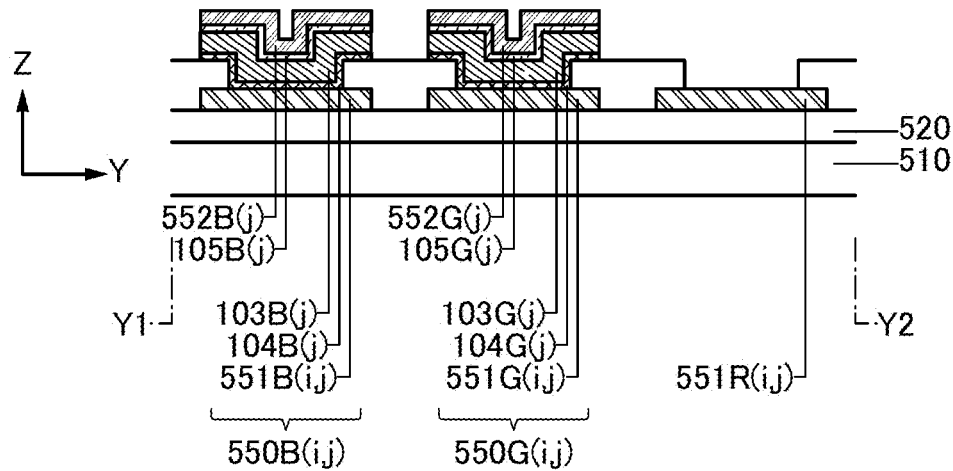

In the twelfth step, the layer 104G, the unit 103G, the layer 105G, and the electrode 552G are processed into a predetermined shape (see FIG. 21C). For example, the layer 104G, the unit 103G, the layer 105G, and the electrode 552G over the light-emitting device 550B(i,j) are removed by photoetching, whereby the layer 104G, the unit 103G, the layer 105G, and the electrode 552G are processed into a band shape that extends in the direction intersecting with the paper, and thus are separated from the light-emitting device 550B(i,j). Thus, the light-emitting device 550G(i,j) is formed.

Specifically, a portion overlapping with the partition wall 528 and the like are removed using the resist RES and an etching method. The electrode 552B(j) and the partition wall 528 can be used as an etching stopper.

<<Thirteenth Step>>

In the thirteenth step, a layer 104R, a unit 103R, a layer 105R, and an electrode 552R are formed in this order over the electrode 552G(j) and the electrode 551R(i,j). For example, the layer 104R, the unit 103R, the layer 105R, and the electrode 552R are formed by a vacuum evaporation method to cover the electrode 551R(i,j) (see FIG. 22A).

A resist RES is formed over the electrode 552R (see FIG. 22B). For example, the resist RES is formed in a position overlapping with the electrode 551R(i,j).

<<Fourteenth Step>>

In the fourteenth step, the layer 104R, the unit 103R, the layer 105R, and the electrode 552R are processed into a predetermined shape (see FIG. 22C). For example, the layer 104R, the unit 103R, the layer 105R, and the electrode 552R are processed into a band shape that extends in the direction intersecting with the paper.

Specifically, a portion overlapping with the partition wall 528 and the like are removed using the resist RES and an etching method. The electrode 552B(j), the electrode 552G(j), and the partition wall 528 can be used as an etching stopper.

Through the above steps, the light-emitting device 550B(i,j), the light-emitting device 550G(i,j), and the light-emitting device 550R(i,j) can be formed.

<<Fifteenth Step>>

In the fifteenth step, the insulating film 573 in contact with the partition wall 528 is formed to cover the light-emitting device 550B(i,j) and the light-emitting device 550G(i,j) (see FIG. 22C). Through the above steps, the light-emitting device 550B(i,j) and the light-emitting device 550G(i,j) can be protected with use of the insulating film 573.

<Example 2 of Method for Manufacturing Display Panel>

A method for manufacturing a display panel of one embodiment of the present invention has the following first to eleventh steps. For example, the display panel 700 of one embodiment of the present invention described with reference to FIGS. 4A to 4C can be manufactured.

<<First Step>>

In the first step, the electrode 551B(i,j), the electrode 551G(i,j), and the electrode 551R(i,j) are formed (see FIG. 19A). For example, a conductive film is formed over the functional layer 520 formed over the base 510, and processed into a predetermined shape by photolithography. For example, the conductive film is processed into island shapes.

<<Second Step>>

In the second step, the partition wall 528 is formed between the electrode 551B(i,j) and the electrode 551G(i,j) (see FIG. 19B). For example, an insulating film covering the electrodes 551B(i,j), 551G(i,j), and 551R(i,j) is formed, and an opening is formed by photolithography to expose the electrodes 551B(i,j), 551G(i,j), and 551R(i,j).

<<Third Step>>

In the third step, a layer 104 containing a hole-transport material and an acceptor substance is formed over the electrodes 551B(i,j) and 551G(i,j) (see FIG. 23A). For example, the layer 104 is formed by a vacuum evaporation method to cover the electrodes 551B(i,j), 551G(i,j), and 551R(i,j). Specifically, a co-evaporation method is used.

<<Fourth Step>>

In the fourth step, the unit 103 is formed over the layer 104. For example, a vacuum evaporation method is used.

<<Fifth Step>>

In the fifth step, a layer 1052 containing the first organic compound and the first metal is formed over the unit 103. For example, a vacuum evaporation method, specifically, a co-evaporation method is used.

<<Sixth Step>>

In the sixth step, a layer 106 containing a hole-transport material and an acceptor substance is formed over the layer 1052. For example, a vacuum evaporation method, specifically, a co-evaporation method is used.

<<Seventh Step>>

In the seventh step, the unit 1032 is formed over the layer 106. For example, a vacuum evaporation method is used.

<<Eighth Step>>

In the eighth step, a layer 105 containing the first organic compound and the first metal is formed over the unit 1032. For example, a vacuum evaporation method, specifically, a co-evaporation method is used.

In the ninth step, the electrode 552 is formed over the layer 105 (see FIG. 23A). For example, a vacuum evaporation method is used.

A resist RES is formed over the electrode 552 (see FIG. 23B). For example, the resist RES is formed in a position overlapping with the electrodes 551B(i,j), 551G(i, and 551R (i,j).

<<Tenth Step>>

In the tenth step, the layer 104, the unit 103, the layer 1052, the layer 106, the unit 1032, the layer 105, and the electrode 552 are processed into a predetermined shape (see FIG. 23C). For example, the layer 104, the unit 103, the layer 1052, the layer 106, the unit 1032, the layer 105, and the electrode 552 are processed into a band shape that extends in the direction intersecting with the paper.

Specifically, a portion overlapping with the partition wall 528 is removed using the resist RES and an etching method. The partition wall 528 can be used as an etching stopper.

The layer 104 is processed into the layer 104B(j), the layer 104G(j), and the layer 104R(j). The unit 103 is processed into the unit 103B(j), the unit 103G(j), and the unit 103R(j). The layer 1052 is processed into the layer 105B2(*j*), the layer 105G2(*j*), and the layer 105R2(*j*). The layer 106 is processed into the layer 106B(j), the layer 106G(j), and the layer 106R(j). The unit 1032 is processed into the unit 103B2(*j*), the unit 103G2(*j*), and the unit 103R2(*j*). The layer 105 is processed into the layer 105B(j), the layer 105G(j), and the layer 105R(j). The electrode 552 is processed into the electrode 552B(j), the electrode 552G (j), and the electrode 552R(j).

For example, the space 104S(*j*) is formed and inhibits electrical continuity between the layer 104B(i,j) and the layer 104G(i,j). The space 106S(*j*) is also formed and inhibits electrical continuity between the layer 106B(i,j) and the layer 106G(i,j).

Through the above steps, the light-emitting device 550B (i,j) and the light-emitting device 550G(i,j) can be formed to be separated. The light-emitting device 550R(i,j) can also be formed.

<<Eleventh Step>>

In the eleventh step, the insulating film 573 in contact with the partition wall 528 is formed over the electrodes 552B(j), 552G(j), and 552R(j) to cover the light-emitting devices 550B(i,j) and 550G(i,j). For example, the insulating film 573 is formed by stacking the flat insulating film 573A and the dense insulating film 573B. Specifically, a flat film is formed by a coating method and a dense film is stacked over the flat film by a chemical vapor deposition method or an atomic layer deposition method. Thus, the insulating film 573 with good-quality and less defects can be formed. Through the above steps, the light-emitting device 550B(i,j) and the light-emitting device 550G(i,j) can be protected with use of the insulating film 573.

<Example 3 of Method for Manufacturing Display Panel>

A method for manufacturing a display panel of one embodiment of the present invention has the following first to sixth steps. For example, the display panel 700 of one embodiment of the present invention described with reference to FIG. 11 can be manufactured.

<<First Step>>

In the first step, the electrode 551B(i,j), the electrode 551G(i,j), and the electrode 551R(i,j) are formed (see FIG. 19A). For example, a conductive film is formed over the functional layer 520 formed over the base 510, and processed into a predetermined shape by photolithography. For example, the conductive film is processed into island shapes.

<<Second Step>>

In the second step, the partition wall 528 is formed. For example, an insulating film covering the electrodes 551B(i, j), 551G(i,j), and 551R(i,j) is formed, and an opening is formed by photolithography to expose the electrodes 551B (i,j), 551G(i,j), and 551R(i,j) (see FIG. 19B).

<<Third Step>>

Figure 24A:
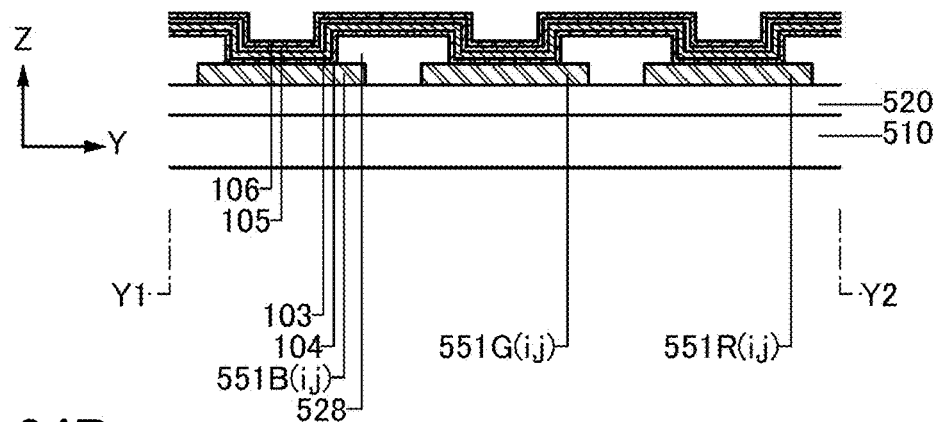
FIGS. 24A to 24C illustrate a method for manufacturing a display panel in Embodiment.

In the third step, the layer 104, the unit 103, the layer 105, and the layer 106 are formed in this order over the electrodes 551B(i,j), 551G(i,j), and 551R(i,j) (see FIG. 24A). For example, the layer 104, the unit 103, the layer 105, and the layer 106 are formed by a vacuum evaporation method to cover the electrodes 551B(i,j), 551G(i,j), and 551R(i,j).

Figure 24B:
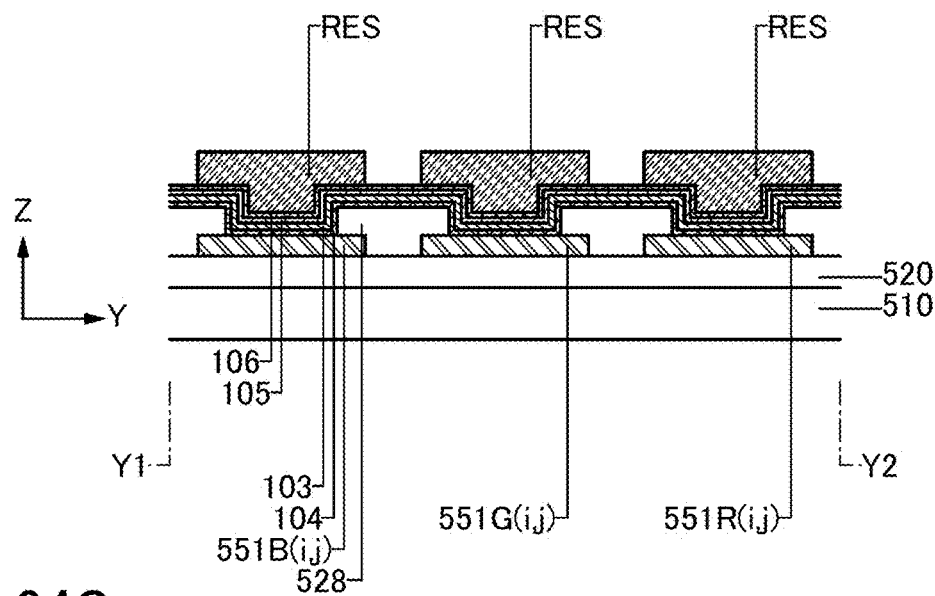

The resist RES is formed over the layer 106 (see FIG. 24B). For example, the resist RES is formed in a position overlapping with the electrodes 551B(i,j), 551G(i,j), and 551R(i,j).

<<Fourth Step>>

Figure 24C:
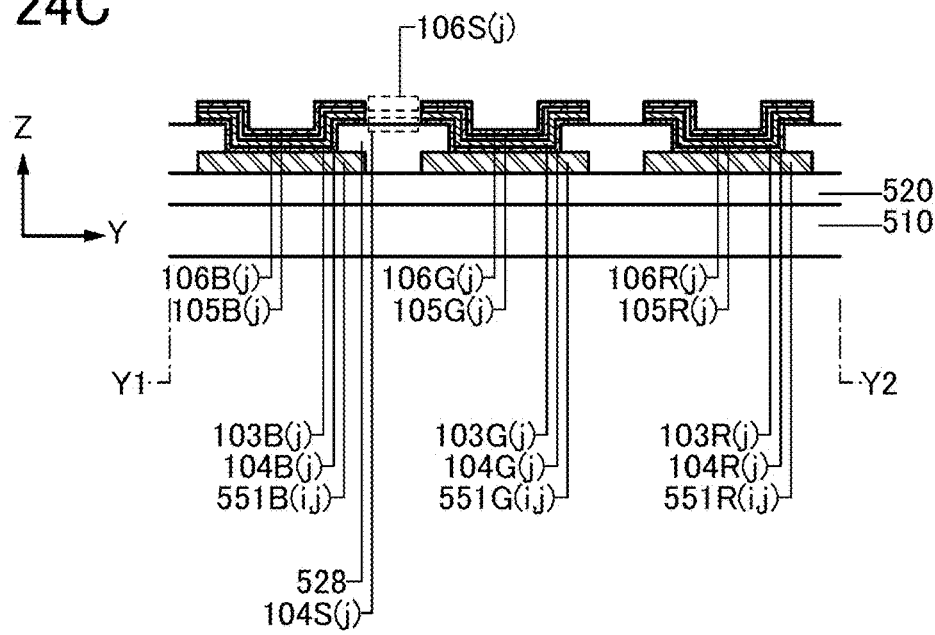

In the fourth step, the layer 104, the unit 103, the layer 105, and the layer 106 are processed into a predetermined shape (see FIG. 24C). For example, the layer 104, the unit 103, the layer 105, and the layer 106 are processed into an island shape overlapping with the electrode 551B(i,j), an island shape overlapping with the electrode 551G(i,j), and an island shape overlapping with the electrode 551R(i,j). Alternatively, the layer 104, the unit 103, the layer 105, and the layer 106 may be processed into a band shape that extends in the direction intersecting with the paper.

Specifically, a portion overlapping with the partition wall 528 is removed using the resist RES and an etching method. The partition wall 528 can be used as an etching stopper.

The layer 104 is processed into the layer 104B(i,j), the layer 104G(i,j), and the layer 104R(i,j). The unit 103 is processed into the unit 103B(i,j), the unit 103G(i,j), and the unit 103R(i,j). The layer 105 is processed into the layer 105B(i,j), the layer 105G(i,j), and the layer 105R(i,j). The layer 106 is processed into the layer 106B(i,j), the layer 106G(i,j), and the layer 106R(i,j).

For example, the space 104S(*j*) inhibits electrical continuity between the layer 104B(i,j) and the layer 104G(i,j). The space 106S(*j*) inhibits electrical continuity between the layer 106B(i,j) and the layer 106G(i,j).

<<Fifth Step>>

Figure 25A:
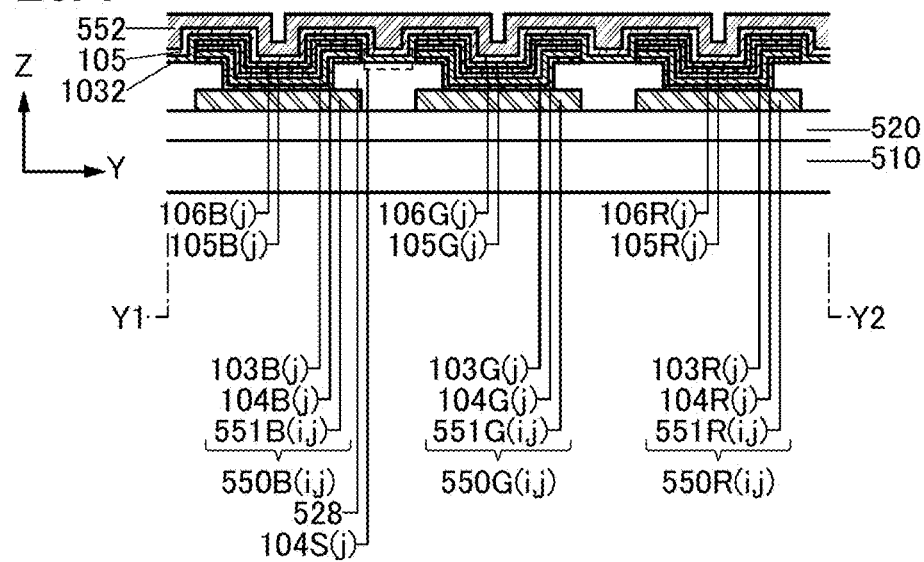
FIGS. 25A and 25B illustrate a method for manufacturing a display panel in Embodiment.

In the fifth step, the unit 1032, the layer 105, and the electrode 552 are formed in this order (see FIG. 25A). For example, the unit 1032, the layer 105, and the electrode 552 are formed by a vacuum evaporation method to cover the layer 106B(i,j), the layer 106G(i,j), and the layer 106R(i,j).

Through the above steps, the light-emitting devices 550B (i,j) and 550G(i,j) can be formed. The light-emitting device 550R(i,j) can also be formed.

<<Sixth Step>>

Figure 25B:
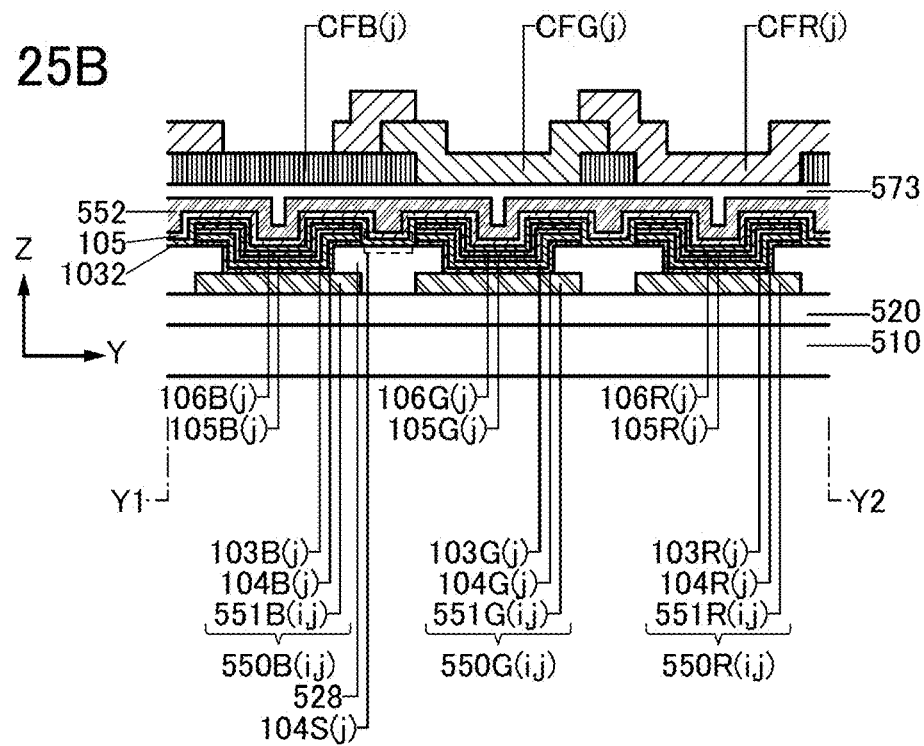

In the sixth step, the insulating film 573 is formed (see FIG. 25B). The coloring layer CFB(j), the coloring layer CFG(j), and the coloring layer CFR(j) are formed over the insulating film 573.

For example, the insulating film 573 is formed by stacking a flat film and a dense film. Specifically, a flat film is formed by a coating method and a dense film is stacked over the flat film by a chemical vapor deposition method or an atomic layer deposition method. Thus, the insulating film 573 with good-quality and less defects can be formed.

For example, with use of a color resist, the coloring layer CFB(j), the coloring layer CFG(j), and the coloring layer CFR(j) are processed into a predetermined shape. Note that processing is performed such that the coloring layer CFR(j) and the coloring layer CFB(j) overlap with each other over the partition wall 528. Thus, a phenomenon in which light emitted from an adjacent light-emitting device enters the coloring layer can be suppressed.

<Example 4 of Method for Manufacturing Display Panel>

A method for manufacturing a display panel of one embodiment of the present invention has the following first to thirteenth steps. For example, the display panel 700 of one embodiment of the present invention described with reference to FIGS. 13A and 13B can be manufactured.

<<First Step>>

In the first step, the electrode 551B(i,j), the electrode 551G(i,j), and the electrode 551R(i,j) are formed (see FIG. 19A). For example, a conductive film is formed over the functional layer 520 formed over the base 510, and processed into a predetermined shape by photolithography. For example, the conductive film is processed into island shapes.

<<Second Step>>

In the second step, the partition wall 528 is formed between the electrode 551B(i,j) and the electrode 551G(i,j) (see FIG. 19B). For example, an insulating film covering the electrodes 551B(i,j), 551G(i,j), and 551R(i,j) is formed, and an opening is formed by photolithography to expose the electrodes 551B(i,j), 551G(i,j), and 551R(i,j).

<<Third Step>>

Figure 26A:
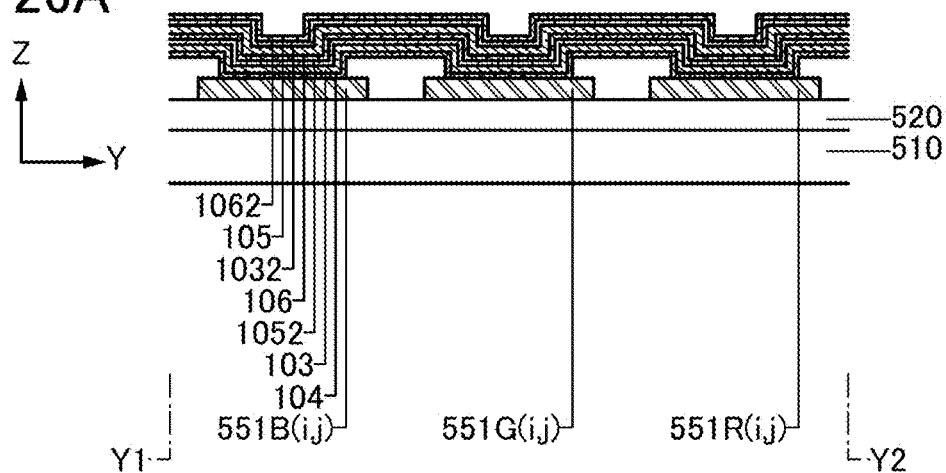
FIGS. 26A to 26C illustrate a method for manufacturing a display panel in Embodiment.

In the third step, a layer 104 containing a hole-transport material and an acceptor substance is formed over the electrodes 551B(i,j) and 551G(i,j) (see FIG. 26A). For example, the layer 104 is formed by a vacuum evaporation method to cover the electrodes 551B(i,j), 551G(i,j), and 551R(i,j). Specifically, a co-evaporation method is used.

<<Fourth Step>>

In the fourth step, the unit 103 is formed over the layer 104. For example, a vacuum evaporation method is used.

<<Fifth Step>>

In the fifth step, a layer 1052 containing the second organic compound and the second metal is formed over the unit 103. For example, a vacuum evaporation method, specifically, a co-evaporation method is used.

<<Sixth Step>>

In the sixth step, a layer 106 containing a hole-transport material and an acceptor substance is formed over the layer 1052. For example, a vacuum evaporation method, specifically, a co-evaporation method is used.

<<Seventh Step>>

In the seventh step, the unit 1032 is formed over the layer 106. For example, a vacuum evaporation method is used.

<<Eighth Step>>

In the eighth step, a layer 105 containing the first organic compound and the first metal is formed over the unit 1032. For example, a vacuum evaporation method, specifically, a co-evaporation method is used.

<<Ninth Step>>

In the ninth step, a layer 1062 containing a hole-transport material and an acceptor substance is formed over the layer 105 (see FIG. 26A). For example, a vacuum evaporation method, specifically, a co-evaporation method is used.

Figure 26B:
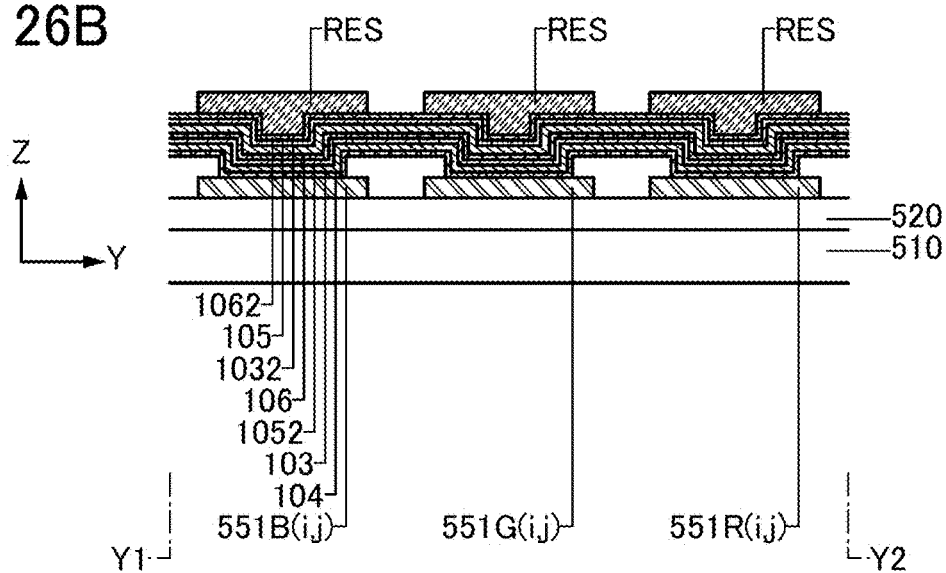

A resist RES is formed over the layer 1062 (see FIG. 26B). For example, the resist RES is formed in a position overlapping with the electrodes 551B(i,j), 551G(i,j), and 551R(i,j).

<<Tenth Step>>

Figure 26C:
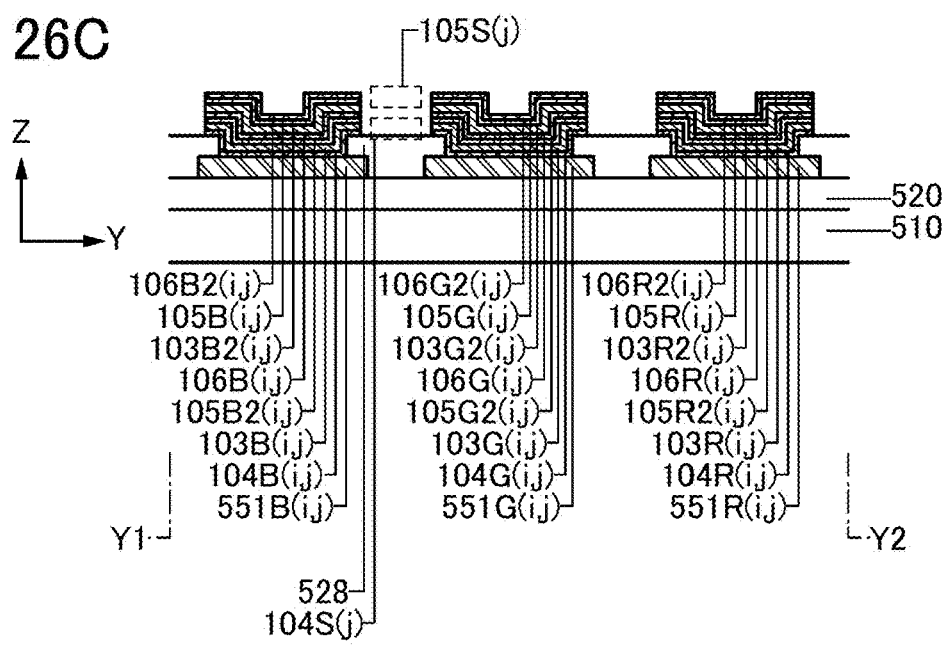

In the tenth step, the layer 104, the unit 103, the layer 1052, the layer 106, the unit 1032, the layer 105, and the layer 1062 are processed into a predetermined shape (see FIG. 26C). Note that the layer 1062 containing a hole-transport material and an acceptor substance is resistant to oxidation and a state in which the layer 1062 exists on a surface is chemically stable. In addition, the etching step of the tenth step is performed in the state in which the layer 1062 exists on a surface, which can suppress a change in characteristics of the light-emitting device caused by the etching step.

For example, the layer 104, the unit 103, the layer 1052, the layer 106, the unit 1032, the layer 105, and the layer 1062 over the partition wall 528 are removed by photoetching to be processed into a predetermined shape. The partition wall 528 can be used as an etching stopper.

Specifically, the layer 104, the unit 103, the layer 1052, the layer 106, the unit 1032, the layer 105, and the layer 1062 are processed into an island shape overlapping with the electrode 551B(i,j), an island shape overlapping with the electrode 551G(i,j), and an island shape overlapping with the electrode 551R(i,j). Alternatively, the unit 103, the layer 1052, the layer 106, the unit 1032, the layer 105, and the layer 1062 may be processed into a band shape that extends in the direction intersecting with the paper.

<<Eleventh Step>>

Figure 27A:
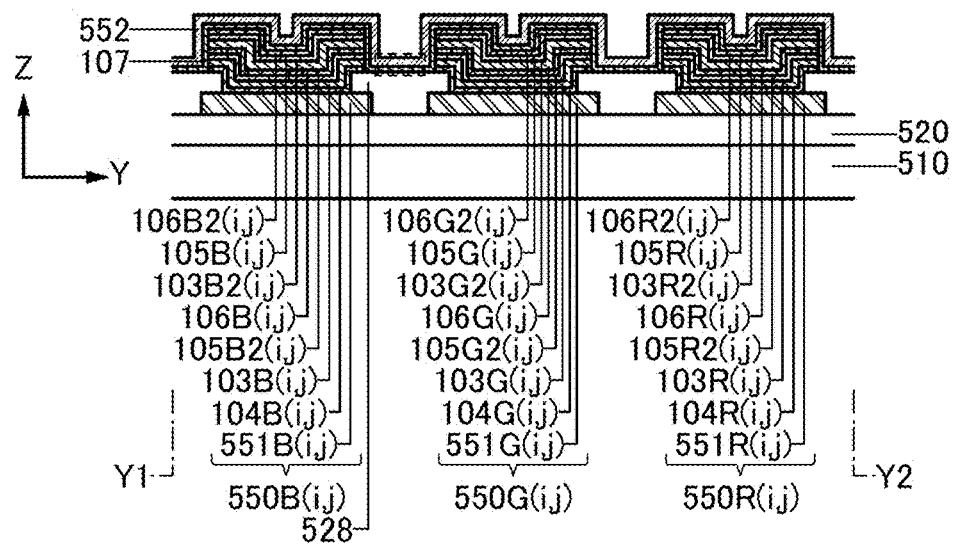
FIGS. 27A and 27B illustrate a method for manufacturing a display panel in Embodiment.

In the eleventh step, the layer 107 is formed over the layer 106B2($i,j$), the layer 106G2($i,j$), and the layer 106R2($i,j$) (see FIG. 27A). For example, the layer 107 is formed by a vacuum evaporation method to cover the layer 106B2($i,j$), the layer 106G2($i,j$), and the layer 106R2($i,j$).

<<Twelfth Step>>

In the twelfth step, the electrode 552 is formed over the layer 107, whereby the light-emitting device 550B(i,j) and the light-emitting device 550G(i,j) are formed (see FIG. 27A). In addition, the light-emitting device 550R(i,j) is formed.

<<Thirteenth Step>>

Figure 27B:
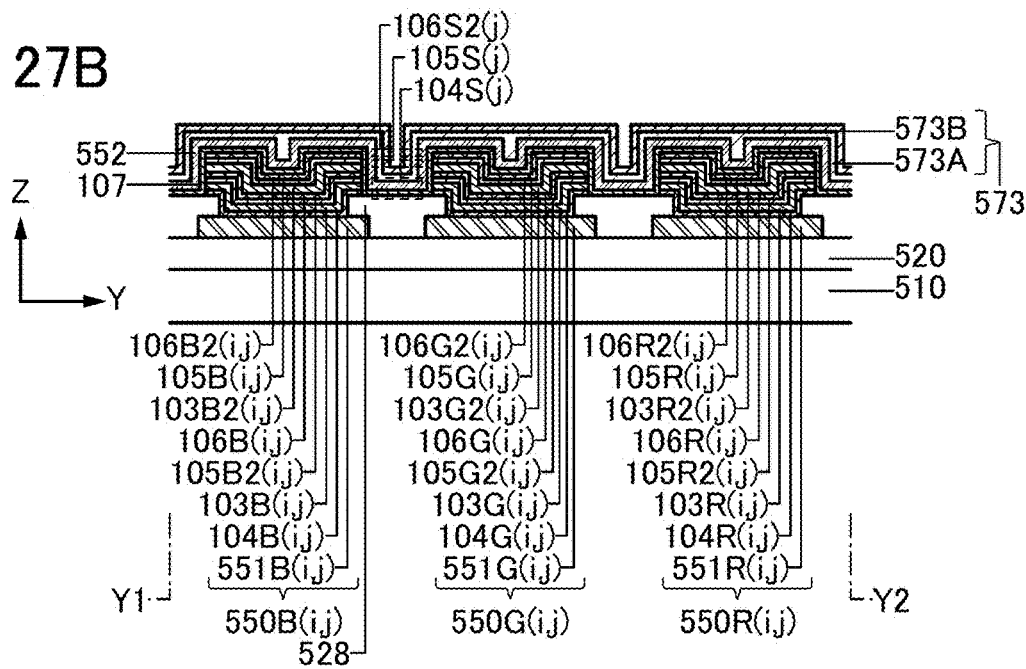

In the thirteenth step, the insulating film 573 is formed over the electrode 552 to cover the light-emitting device 550B(i,j) and the light-emitting device 550G(i,j) (see FIG. 27B). For example, the insulating film 573 is formed by stacking the flat insulating film 573A and the dense insulating film 573B. Specifically, a flat film is formed by a coating method and a dense film is stacked over the flat film by a chemical vapor deposition method or an atomic layer deposition method. Thus, the insulating film 573 with good-quality and less defects can be formed. Through the above steps, the light-emitting device 550B(i,j) and the light-emitting device 550G(i,j) can be protected with use of the insulating film 573.

With this structure, adjacent light-emitting devices can be separated by etching, for example. The layer 1062 which contains a hole-transport material and an acceptor substance and is resistant to oxidation can be provided on a surface in the manufacturing process. An etching step can be performed while a chemically stable layer is provided on the surface. In addition, the etching step of the tenth step is performed in the state in which the layer 1062 exists on the surface, which can suppress a change in characteristics of the light-emitting device caused by the etching step. Furthermore, a display panel including a plurality of light-emitting devices can be manufactured without using a metal mask. As a result, a method for manufacturing a novel display panel that is highly convenient, useful, or reliable can be provided.

<Example 5 of Method for Manufacturing Display Panel>

A method for manufacturing a display panel of one embodiment of the present invention has the following first to twelfth steps. For example, the display panel 700 of one embodiment of the present invention described with reference to FIGS. 17A and 17B can be manufactured.

<<First Step>>

In the first step, the electrode 552B(i,j), the electrode 552G(i,j), and the electrode 552R(i,j) are formed (see FIG.

28A). For example, a conductive film is formed over the functional layer 520 formed over the base 510, and processed into a predetermined shape by photolithography. For example, the conductive film is processed into island shapes.

<<Second Step>>

Figure 28A:
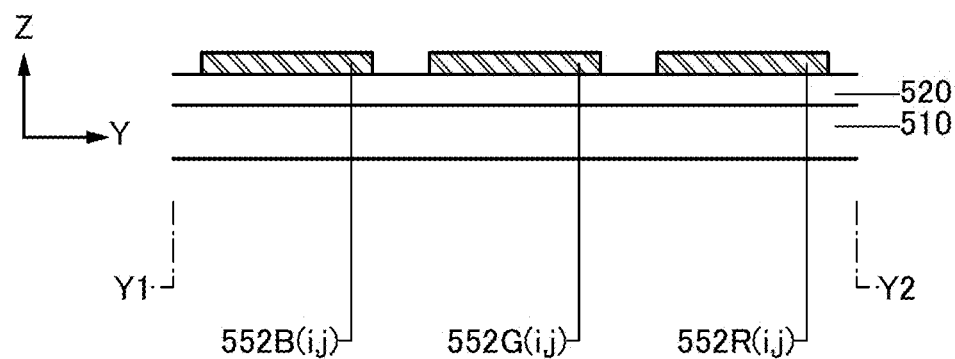
FIGS. 28A and 28B illustrate a method for manufacturing a display panel in Embodiment.
Figure 28B:
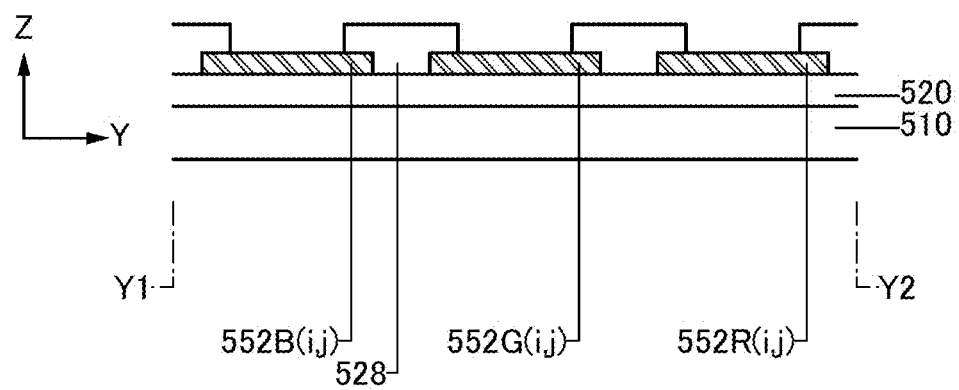

In the second step, the partition wall 528 is formed between the electrode 552B(i,j) and the electrode 552G(i,j) (see FIG. 28B). For example, an insulating film covering the electrodes 552B(i,j), 552G(i,j), and 552R(i,j) is formed, and an opening is formed by photolithography to expose the electrodes 552B(i,j), 552G(i,j), and 552R(i,j).

<<Third Step>>

Figure 29A:
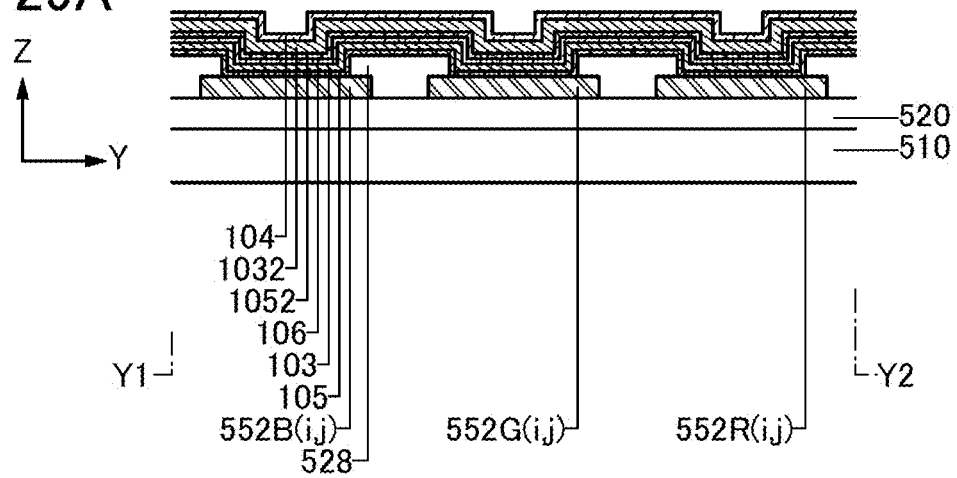
FIGS. 29A to 29C illustrate a method for manufacturing a display panel in Embodiment.

In the third step, the layer 105 containing the first organic compound and the first metal is formed over the electrode 552B(i,j) and the electrode 552G(i,j) (see FIG. 29A). For example, a vacuum evaporation method, specifically, a co-evaporation method is used.

<<Fourth Step>>

In the fourth step, the unit 103 is formed over the layer 105. For example, a vacuum evaporation method is used.

<<Fifth Step>>

In the fifth step, a layer 106 containing a hole-transport material and an acceptor substance is formed over the unit 103. For example, a vacuum evaporation method, specifically, a co-evaporation method is used.

<<Sixth Step>>

In the sixth step, the layer 1052 containing the second organic compound and the second metal is formed over the layer 106. For example, a vacuum evaporation method, specifically, a co-evaporation method is used.

<<Seventh Step>>

In the seventh step, the unit 1032 is formed over the layer 1052. For example, a vacuum evaporation method is used.

<<Eighth Step>>

In the eighth step, the layer 104 containing a hole-transport material and an acceptor substance is formed over the unit 1032 (see FIG. 29A). For example, the layer 104 is formed over the electrodes 551B(i,j), 551G(i,j), and 551R(i,j) to cover the electrodes 551B(i,j), 551G(i,j), and 551R(i,j) by a vacuum evaporation method, specifically, a co-evaporation method.

Figure 29B:
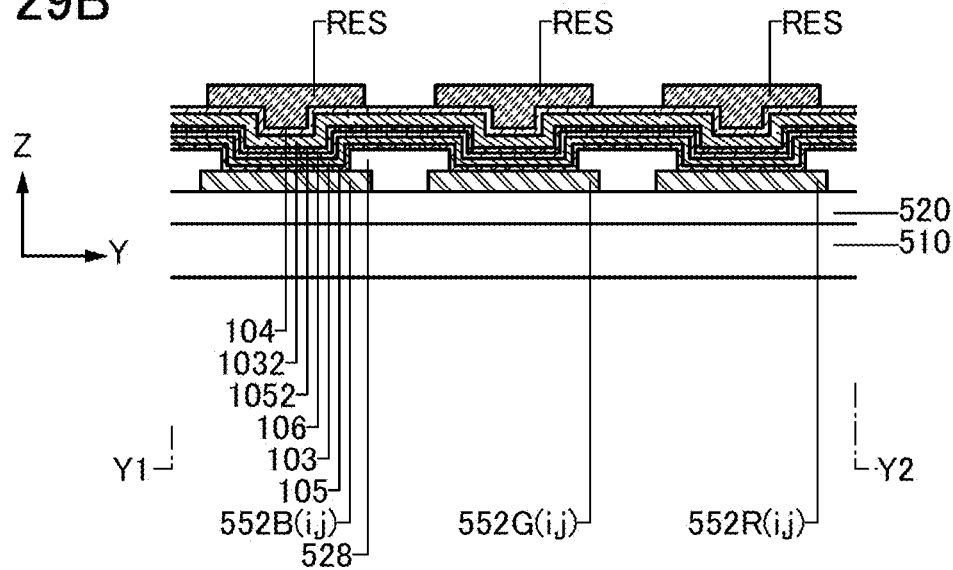

The resist RES is formed over the layer 104 (see FIG. 29B). For example, the resist RES is formed in a position overlapping with the electrodes 552B(i,j), 552G(i,j), and 552R(i,j).

<<Ninth Step>>

Figure 29C:
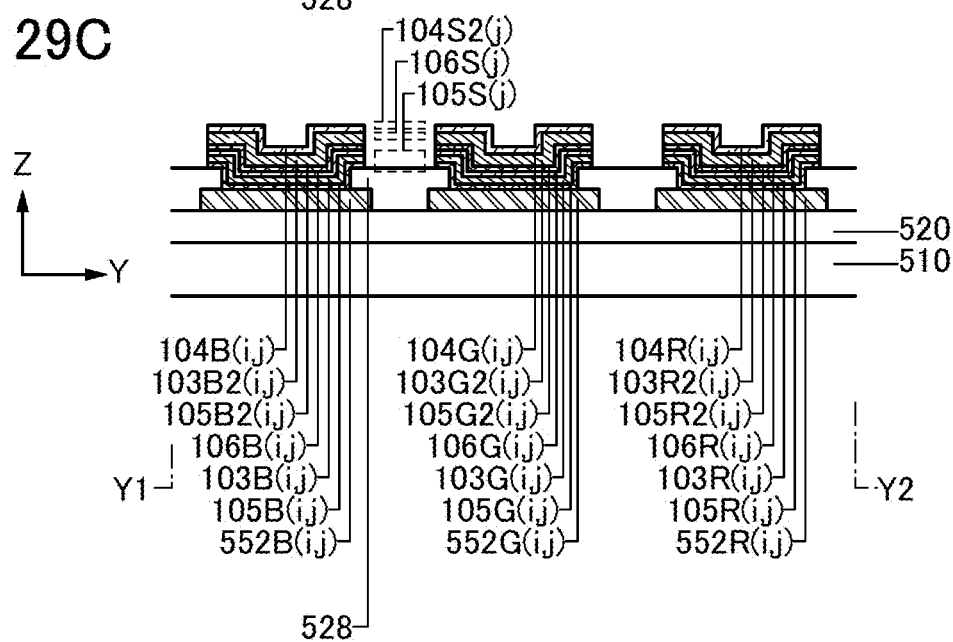

In the ninth step, the layer 105, the unit 103, the layer 106, the layer 1052, the unit 1032, and the layer 104 are processed into a predetermined shape (see FIG. 29C). Note that the layer 104 containing a hole-transport material and an acceptor substance is resistant to oxidation and a state in which the layer 104 exists on a surface is chemically stable. In addition, the etching step of the ninth step is performed in the state in which the layer 104 exists on a surface, which can suppress a change in characteristics of the light-emitting device caused by the etching step.

For example, the layer 105, the unit 103, the layer 106, the layer 1052, the unit 1032, and the layer 104 over the partition wall 528 are removed by photoetching to be processed into a predetermined shape. The partition wall 528 can be used as an etching stopper.

Specifically, the layer 105, the unit 103, the layer 106, the layer 1052, the unit 1032, and the layer 104 are processed into an island shape overlapping with the electrode 552B(i,j), an island shape overlapping with the electrode 552G(i,j), and an island shape overlapping with the electrode 552R(i,j). Alternatively, the layer 105, the unit 103, the layer 106, the layer 1052, the unit 1032, and the layer 104 may be processed into a band shape that extends in the direction intersecting with the paper.

<<Tenth Step>>

Figure 30A:
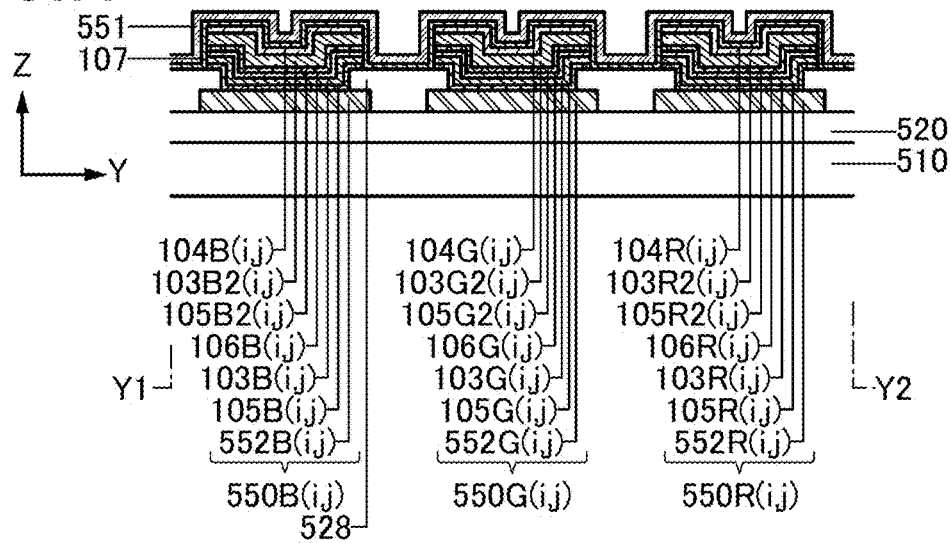
FIGS. 30A and 30B illustrate a method for manufacturing a display panel in Embodiment.

In the tenth step, the layer 107 is formed over the layer 104B(i,j), the layer 104G(i,j), and the layer 104R(i,j) (see FIG. 30A). For example, the layer 107 is formed by a vacuum evaporation method to cover the layer 104B(i,j), the layer 104G(i,j), and the layer 104R(i,j).

<<Eleventh Step>>

In the eleventh step, the electrode 551 is formed over the layer 107, whereby the light-emitting device 550B(i,j) and the light-emitting device 550G(i,j) are formed (see FIG. 30A). In addition, the light-emitting device 550R(i,j) is formed.

<<Twelfth Step>>

Figure 30B:
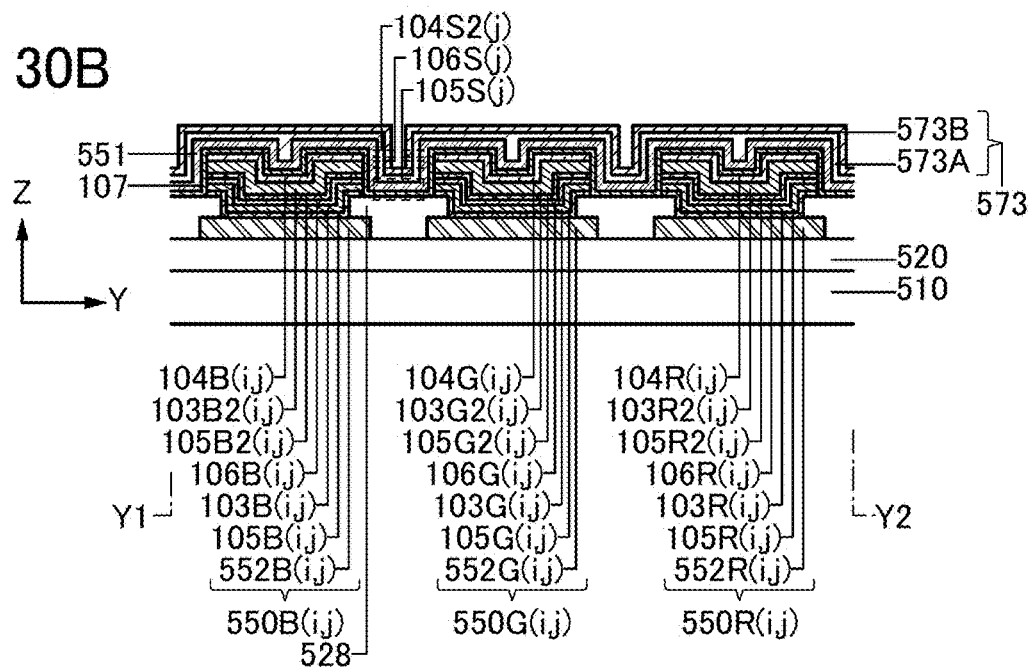

In the twelfth step, the insulating film 573 is formed over the electrode 551 to cover the light-emitting device 550B(i,j) and the light-emitting device 550G(i,j) (see FIG. 30B). For example, the insulating film 573 is formed by stacking the flat insulating film 573A and the dense insulating film 573B. Specifically, a flat film is formed by a coating method and a dense film is stacked over the flat film by a chemical vapor deposition method or an atomic layer deposition method. Thus, the insulating film 573 with good-quality and less defects can be formed. Through the above steps, the light-emitting device 550B(i,j) and the light-emitting device 550G(i,j) can be protected with use of the insulating film 573.

With this structure, adjacent light-emitting devices can be separated by etching, for example. The layer 104 which contains a hole-transport material and an acceptor substance and is resistant to oxidation can be provided on a surface in the manufacturing process. An etching step can be performed while a chemically stable layer is provided on the surface. In addition, the etching step of the ninth step is performed in the state in which the layer 104 exists on the surface, which can suppress a change in characteristics of the light-emitting device caused by the etching step. Furthermore, a display panel including a plurality of light-emitting devices can be manufactured without using a metal mask. As a result, a method for manufacturing a novel display panel that is highly convenient, useful, or reliable can be provided.

Note that this embodiment can be combined with any of the other embodiments in this specification as appropriate.

Embodiment 4

Figure 31:
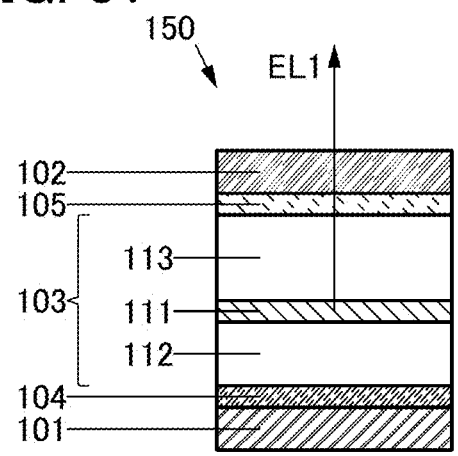
FIG. 31 illustrates a structure of a light-emitting device in Embodiment.

In this embodiment, a structure of a light-emitting device 150 that can be used for a display panel of one embodiment of the present invention will be described with reference to FIG. 31. Note that the structure that can be used for the light-emitting device 150 can be employed for, for example, the light-emitting device 550B(i,j), the light-emitting device 550G(i,j), or the light-emitting device 550R(i,j) described in Embodiment 1.

<Structure Example of Light-Emitting Device 150>

The light-emitting device 150 described in this embodiment includes the electrode 101, the electrode 102, and the unit 103. The electrode 102 includes a region overlapping with the electrode 101, and the unit 103 includes a region sandwiched between the electrode 101 and the electrode 102. Note that the structure that can be used for the unit 103 can be employed for, for example, the unit 103B(j), the unit 103G(j), or the unit 103R(j) described in Embodiment 1 or 2.

<Structure Example of Unit 103>

The unit 103 has a single-layer structure or a stacked-layer structure. For example, the unit 103 includes a layer 111, a layer 112, and the layer 113 (see FIG. 31). The unit 103 has a function of emitting light EL1.

The layer 111 includes a region sandwiched between the layer 112 and the layer 113. The layer 112 includes a region sandwiched between the electrode 101 and the layer 111. The layer 113 includes a region sandwiched between the electrode 102 and the layer 111.

The unit 103 can include, for example, a layer selected from a light-emitting layer, a hole-transport layer, an electron-transport layer, a carrier-blocking layer, and the like. The unit 103 can include a layer selected from a hole-injection layer, an electron-injection layer, an exciton-blocking layer, a charge-generation layer, and the like.

<<Structure Example of Layer 112>>

A hole-transport material can be used for the layer 112, for example. The layer 112 can be referred to as a hole-transport layer. A material having a wider bandgap than the light-emitting material contained in the layer 111 is preferably used for the layer 112. Thus, transfer of energy from excitons generated in the layer 111 to the layer 112 can be suppressed.

[Hole-Transport Material]

A material having a hole mobility of $1 \times 10^{-6}$ cm$^2$/Vs or higher can be suitably used as the hole-transport material.

As the hole-transport material, an amine compound or an organic compound having a π-electron rich heteroaromatic ring skeleton can be used, for example.

Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

<<Structure Example of Layer 113>>

An electron-transport material, a material having an anthracene skeleton, and a mixed material can be used for the layer 113, for example. The layer 113 can be referred to as an electron-transport layer. A material having a wider bandgap than the light-emitting material contained in the layer 111 is preferably used for the layer 113. Thus, energy transfer from excitons generated in the layer 111 to the layer 113 can be inhibited.

[Electron-Transport Material]

For example, a metal complex or an organic compound having a π-electron deficient heteroaromatic ring skeleton can be used as the electron-transport material.

As the electron-transport material, a material having an electron mobility higher than or equal to $1 \times 10^{-7}$ cm$^2$/Vs and lower than or equal to $5 \times 10^{-5}$ cm$^2$/Vs when the square root of the electric field strength [V/cm] is 600 can be suitably used. In this case, the electron-transport property in the electron-transport layer can be suppressed, the amount of electrons injected into the light-emitting layer can be controlled, or the light-emitting layer can be prevented from having excess electrons.

As the organic compound having a π-electron deficient heteroaromatic ring skeleton, for example, a heterocyclic compound having a polyazole skeleton, a heterocyclic compound having a diazine skeleton, a heterocyclic compound having a pyridine skeleton, a heterocyclic compound having a triazine skeleton, or the like can be used. In particular, the heterocyclic compound having a diazine skeleton and the heterocyclic compound having a pyridine skeleton have favorable reliability and thus are preferable. In addition, the heterocyclic compound having a diazine (pyrimidine or pyrazine) skeleton has a high electron-transport property to contribute to a reduction in driving voltage.

[Material Having Anthracene Skeleton]

An organic compound having an anthracene skeleton can be used for the layer 113. In particular, an organic compound having both an anthracene skeleton and a heterocyclic skeleton can preferably be used.

For example, it is possible to use an organic compound having both an anthracene skeleton and a nitrogen-containing five-membered ring skeleton. Alternatively, it is possible to use an organic compound having both an anthracene skeleton and a nitrogen-containing five-membered ring skeleton where two heteroatoms are included in a ring. Specifically, it is preferable to use, as the heterocyclic skeleton, a pyrazole ring, an imidazole ring, an oxazole ring, a thiazole ring, or the like.

For example, it is possible to use an organic compound having both an anthracene skeleton and a nitrogen-containing six-membered ring skeleton. Alternatively, it is possible to use an organic compound having both an anthracene skeleton and a nitrogen-containing six-membered ring skeleton where two heteroatoms are included in a ring. Specifically, it is preferable to use, as the heterocyclic skeleton, a pyrazine ring, a pyrimidine ring, a pyridazine ring, or the like.

<<Structure Example 1 of Layer 111>>

A light-emitting material or a light-emitting material and a host material can be used for the layer 111, for example. The layer 111 can be referred to as a light-emitting layer. Note that the layer 111 is preferably provided in a region where holes and electrons are recombined. Thus, energy generated by recombination of carriers can be efficiently converted into light and emitted.

Furthermore, the layer 111 is preferably provided to be distanced from a metal used for the electrode or the like. Thus, a quenching phenomenon caused by the metal used for the electrode or the like can be inhibited.

It is preferable that a distance from an electrode or the like having reflectivity to the layer 111 be adjusted and the layer 111 be placed in an appropriate position in accordance with an emission wavelength. With this structure, the amplitude can be increased by utilizing an interference phenomenon between light reflected by the electrode or the like and light emitted from the layer 111. Light with a predetermined wavelength can be intensified and the spectrum of the light can be narrowed. In addition, bright light emission colors with high intensity can be obtained. In other words, the layer 111 is placed in an appropriate position, for example, between electrodes and the like, and thus a microcavity structure can be formed.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as light EL1 from the light-emitting material (see FIG. 31).

[Fluorescent Substance]

A fluorescent substance can be used for the layer 111. For example, the following fluorescent substances can be used for the layer 111. Note that the fluorescent substance that can be used for the layer 111 is not limited to the following, and a variety of known fluorescent substances can be used.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

[Phosphorescent Substance]

A phosphorescent substance can be used for the layer 111. For example, the following phosphorescent substances can be used for the layer 111. Note that the phosphorescent substance that can be used for the layer 111 is not limited to the following, and a variety of known phosphorescent substances can be used.

Any of the following can be used for the layer 111: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Substance Exhibiting Thermally Activated Delayed Fluorescence (TADF)]

A TADF material can be used for the layer 111. For example, any of the TADF materials given below can be used as the light-emitting material. Note that without being limited thereto, a variety of known TADF materials can be used as the light-emitting material.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 10 K to 77 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Furthermore, a heterocyclic compound including one or both of a π-electron rich heteroaromatic ring and a π-electron deficient heteroaromatic ring can be used, for example, for the TADF material.

Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

<<Structure Example 2 of Layer 111>>

A carrier-transport material can be used as the host material. For example, a hole-transport material, an electron-transport material, a substance exhibiting TADF, a material having an anthracene skeleton, or a mixed material can be used as the host material. A material having a wider bandgap than the light-emitting material contained in the layer 111 is preferably used as the host material. Thus, transfer of energy from excitons generated in the layer 111 to the host material can be suppressed.

[Hole-Transport Material]

A material having a hole mobility of $1\times10^{-6}$ cm$^2$/Vs or higher can be suitably used as the hole-transport material.

For example, a hole-transport material that can be used for the layer 112 can be used for the layer 111. Specifically, a hole-transport material that can be used for the hole-transport layer can be used for the layer 111.

[Electron-Transport Material]

For example, an electron-transport material that can be used for the layer 113 can be used for the layer 111. Specifically, an electron-transport material that can be used for the electron-transport layer can be used for the layer 111.

[Material Having Anthracene Skeleton]

An organic compound having an anthracene skeleton can be used as the host material. In particular, when a fluorescent substance is used as the light-emitting substance, an organic compound having an anthracene skeleton is preferable. Thus, a light-emitting device with high emission efficiency and high durability can be achieved.

Among the organic compounds having an anthracene skeleton, an organic compound having a diphenylanthracene skeleton, in particular, a substance having a 9,10-diphenylanthracene skeleton, is chemically stable and thus is preferably used. The host material preferably has a carbazole skeleton in order to improve the hole-injection and hole-transport properties. In particular, the host material preferably has a dibenzocarbazole skeleton because the HOMO level thereof is shallower than that of carbazole by approximately 0.1 eV, so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferably used as the host material.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10, inclusive, carbon atoms, a substituted or unsubstituted cycloalkyl group having 3 to 10, inclusive, carbon atoms, and a trialkylsilyl group having 3 to 10, inclusive, carbon atoms. It is further preferable that the fluorescent substance have a plurality of protecting groups. The substituents having no π bond are poor in carrier-transport performance, whereby the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

[Structure Example 1 of Mixed Material]

A material in which a plurality of kinds of substances are mixed can be used as the host material. For example, an electron-transport material and a hole-transport material can be used for the mixed material. The weight ratio of the hole-transport material between the electron-transport material contained in the mixed material may be (the hole-transport material/the electron-transport material)=(1/19) or more and (19/1) or less. Accordingly, the carrier-transport property of the layer 111 can be easily adjusted. A recombination region can also be controlled easily.

[Structure Example 2 of Mixed Material]

In addition, a material mixed with a phosphorescent substance can be used as the host material. When a fluorescent substance is used as the light-emitting substance, a phosphorescent substance can be used as an energy donor for supplying excitation energy to the fluorescent substance.

A mixed material containing a material to form an exciplex can be used as the host material. For example, a material in which an emission spectrum of a formed exciplex overlaps with a wavelength of the absorption band on the lowest energy side of the light-emitting substance can be used as the host material. This enables smooth energy transfer and improves emission efficiency. The driving voltage can be suppressed.

A phosphorescent substance can be used as at least one of the materials forming an exciplex. Accordingly, reverse intersystem crossing can be used. Triplet excitation energy can be efficiently converted into singlet excitation energy.

A combination of an electron-transport material and a hole-transport material having a HOMO level higher than or equal to that of the electron-transport material is preferable for forming an exciplex. The LUMO level of the hole-transport material is preferably higher than or equal to the LUMO level of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the hole-transport material and the electron-transport material are mixed is shifted to a longer wavelength side than the emission spectra of each of the materials (or has another peak on the longer wavelength side) observed in comparison of the emission spectra of the hole-transport material, the electron-transport material, and the mixed film of these materials, for example. Alternatively, the formation of an exciplex can be confirmed by a difference in transient response, such as a phenomenon in which the transient PL lifetime of the mixed film has longer lifetime components or has a larger proportion of delayed components than that of each of the materials, observed in comparison of transient photoluminescence (PL) of the hole-transport material, the electron-transport material, and the mixed film of the materials. The transient PL can be rephrased as transient electroluminescence (EL). That is, the formation of an exciplex can also be confirmed by a difference in transient response observed in comparison of the transient EL of the hole-transport material, the electron-transport material, and the mixed film of the materials.

Note that this embodiment can be combined with any of the other embodiments in this specification as appropriate.

Embodiment 5

In this embodiment, a structure of the light-emitting device 150 that can be used for a display panel of one embodiment of the present invention will be described with reference to FIG. 31. Note that the structure that can be used for the light-emitting device 150 can be employed for, for example, the light-emitting device 550B(i,j), the light-emitting device 550G(i,j), or the light-emitting device 550R(i,j) described in Embodiment 1.

<Structure Example of Light-Emitting Device 150>

The light-emitting device 150 described in this embodiment includes the electrode 101, the electrode 102, the unit 103, and the layer 104. The electrode 102 includes a region overlapping with the electrode 101, and the unit 103 includes a region sandwiched between the electrode 101 and the electrode 102. The layer 104 includes a region sandwiched between the unit 103 and the electrode 101. For example, the structure described in Embodiment 4 can be used for the unit 103. For example, the structure that can be used for the electrode 101 can be employed for the electrode 551B(i,j), the electrode 551G(i,j), or the electrode 551R(i,j) described in Embodiment 1. For example, the structure that can be used for the electrode 101 can be employed for the electrode 551B(j), the electrode 551G(j), or the electrode 551R(j) described in Embodiment 2. For example, the structure that can be used for the layer 104 can be employed for the layer 104B(j), the layer 104G(j), or the layer 104R(j) described in Embodiment 1 or 2.

<Structure Example of Electrode 101>

For example, a conductive material can be used for the electrode 101. Specifically, a single layer or a stacked layer of a metal, an alloy, or a film containing a conductive compound can be used for the electrode 101.

A film that efficiently reflects light can be used for the electrode 101, for example. Specifically, an alloy containing silver, copper, and the like, an alloy containing silver, palladium, and the like, or a metal film of aluminum or the like can be used for the electrode 101.

For example, a metal film that transmits part of light and reflects another part of light can be used for the electrode 101. Thus, a microcavity structure can be provided in the light-emitting device 150. Alternatively, light with a predetermined wavelength can be extracted more efficiently than light with the other wavelengths. Alternatively, light with a narrow spectral half-width can be extracted. Alternatively, light of a bright color can be extracted.

A film having a visible-light-transmitting property can be used for the electrode 101, for example. Specifically, a single layer or a stacked layer of a metal film that is thin enough to transmit light, an alloy film, a conductive oxide film, or the like can be used for the electrode 101.

In particular, a material having a work function higher than or equal to 4.0 eV can be suitably used for the electrode 101.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

For another example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Graphene can also be used.

Note that this embodiment can be combined with any of the other embodiments in this specification as appropriate.

Embodiment 6

In this embodiment, a structure of the light-emitting device 150 that can be used for a display panel of one embodiment of the present invention will be described with reference to FIG. 31. Note that the structure that can be used for the light-emitting device 150 can be employed for, for example, the light-emitting device 550B(i,j), the light-emitting device 550G(i,j), or the light-emitting device 550R(i,j) described in Embodiment 1.

<Structure Example of Light-Emitting Device 150>

The light-emitting device 150 described in this embodiment includes the electrode 101, the electrode 102, the unit 103, and the layer 105. The electrode 102 includes a region overlapping with the electrode 101, and the unit 103 includes a region sandwiched between the electrode 101 and the electrode 102. The layer 105 includes a region sandwiched between the unit 103 and the electrode 102. For example, the structure described in Embodiment 4 can be used for the unit 103. In addition, the structure that can be used for the electrode 102 can be employed for, for example, the electrode 552B(j), 552G(j), or 552R(j) described in Embodiment 1. The structure that can be used for the electrode 102 can be employed for, for example, the electrode 552B(i,j), 552G(i,j), or 552R(i,j) described in Embodiment 2. The material that can be used for the layer 105 can be employed for, for example, the layer 105B(j), 105G(j), or 105R(j) described in Embodiment 1 or 2.

<Structure Example of Electrode 102>

For example, a conductive material can be used for the electrode 102. Specifically, a single layer or a stacked layer of a metal, an alloy, or a material containing a conductive compound can be used for the electrode 102.

For example, the material that can be used for the electrode 101 described in Embodiment 5 can be used for the electrode 102. In particular, a material with a lower work function than the electrode 101 can be suitably used for the electrode 102. Specifically, a material having a work function lower than or equal to 3.8 eV is preferably used.

For example, an element belonging to Group 2 of the periodic table, a rare earth metal, or an alloy containing any of these elements can be used for the electrode 102.

Specifically, magnesium (Mg), calcium (Ca), strontium (Sr), europium (Eu), ytterbium (Yb), or the like or an alloy containing any of these (MgAg or AlLi) can be used for the electrode 102. Alternatively, a layered material of the alloy containing any of these and a conductive oxide can be used for the electrode 102. Specifically, a layered material of MgAg and ITO can be used for the electrode 102.

<<Structure Example of Layer 105>>

For example, an electron-injection material can be used for the layer 105. The layer 105 can also be referred to as an electron-injection layer.

Specifically, a donor substance can be used for the layer 105. Alternatively, a material in which a donor substance and an electron-transport material are combined can be used for the layer 105. Alternatively, a composite material containing a first organic compound including an unshared electron pair and a first metal can be used for the layer 105. Alternatively, electride can be used for the layer 105. This can facilitate the injection of electrons from the electrode 102, for example. Alternatively, not only a material having a low work function but also a material having a high work function can also be used for the electrode 102. Alternatively, a material used for the electrode 102 can be selected from a wide range of materials regardless of its work function. Specifically, Al, Ag, ITO, indium oxide-tin oxide containing silicon or silicon oxide, and the like can be used for the electrode 102. Alternatively, the driving voltage of the light-emitting device can be reduced.

[Donor Substance]

For example, an alkaline earth metal, a rare earth metal, or a compound thereof (an oxide, a halide, a carbonate, or the like) can be used for the donor substance. Alternatively, an organic compound such as tetrathianaphthacene (abbreviation: TTN), nickelocene, or decamethylnickelocene can be used as the donor substance.

[Structure Example of Composite Material]

A material composed of two or more kinds of substances can be used as the electron-injection material. For example, a donor substance and an electron-transport material can be used for the composite material.

[Electron-Transport Material]

For example, a metal complex or an organic compound having a π-electron deficient heteroaromatic ring skeleton can be used as the electron-transport material.

For example, an electron-transport material capable of being used for the unit 103 can be used as the composite material.

[Electride]

For example, a substance obtained by adding electrons at high concentration to an oxide where calcium and aluminum are mixed can be used, for example, as the electron-injection material.

Note that this embodiment can be combined with any of the other embodiments in this specification as appropriate.

Embodiment 7

In this embodiment, a structure of the light-emitting device 150 of one embodiment of the present invention is described with reference to FIG. 32A.

Figure 32A:
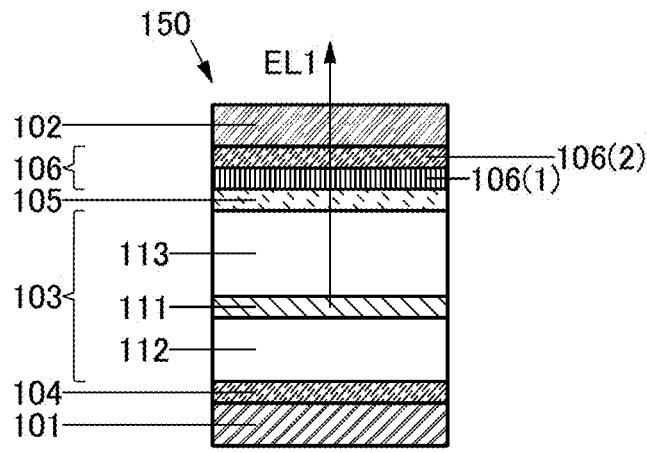
FIGS. 32A and 32B illustrate a structure of a light-emitting device in Embodiment.

FIG. 32A is a cross-sectional view illustrating a structure of a light-emitting device of one embodiment of the present invention.

<Structure Example of Light-Emitting Device 150>

The light-emitting device 150 described in this embodiment includes the electrode 101, the electrode 102, the unit 103, and the layer 106 (see FIG. 32A). The electrode 102 includes a region overlapping with the electrode 101, and the unit 103 includes a region between the electrode 101 and the electrode 102. The layer 106 includes a region between the unit 103 and the electrode 102.

<<Structure Example of Layer 106>>

The layer 106 includes a layer 106(1) and a layer 106(2). The layer 106(2) includes a region between the layer 106(1) and the electrode 102.

<<Structure Example of Layer 106(1)>>

For example, an electron-transport material can be used for the layer 106(1). The layer 106(1) can be referred to as an electron-relay layer. With the layer 106(1), a layer that is on the anode side and in contact with the layer 106(1) can be distanced from a layer that is on the cathode side and in contact with the layer 106(1). Interaction between the layer that is on the anode side and in contact with the layer 106(1) and the layer that is on the cathode side and in contact with the layer 106(1) can be reduced. Electrons can be smoothly supplied to the layer that is on the anode side and in contact with the layer 106(1).

A substance whose LUMO level is positioned between the LUMO level of the acceptor substance included in the layer that is on the anode side and in contact with the layer 106(1) and the LUMO level of the substance included in the layer that is on the cathode side and in contact with the layer 106(1) can be suitably used for the layer 106(1).

For example, a material having a LUMO level in a range higher than or equal to −5.0 eV, preferably higher than or equal to −5.0 eV and lower than or equal to −3.0 eV, can be used for the layer 106(1).

Specifically, a phthalocyanine-based material can be used for the layer 106(1). In addition, a metal complex having a metal-oxygen bond and an aromatic ligand can be used for the layer 106(1).

<<Structure Example of Layer 106(2)>>

For example, a material that supplies electrons to the anode side and supplies holes to the cathode side when voltage is applied can be used for the layer 106(2). Specifically, electrons can be supplied to the unit 103 that is positioned on the anode side. The layer 106(2) can be referred to as a charge-generation layer.

Specifically, a hole-injection material capable of being used for the layer 104 can be used for the layer 106(2). For example, a composite material can be used for the layer 106(2). Alternatively, for example, a stacked film in which a film including the composite material and a film including a hole-transport material are stacked can be used for the layer 106(2).

Note that this embodiment can be combined with any of the other embodiments in this specification as appropriate.

Embodiment 8

In this embodiment, a structure of the light-emitting device 150 of one embodiment of the present invention is described with reference to FIG. 32B.

Figure 32B:
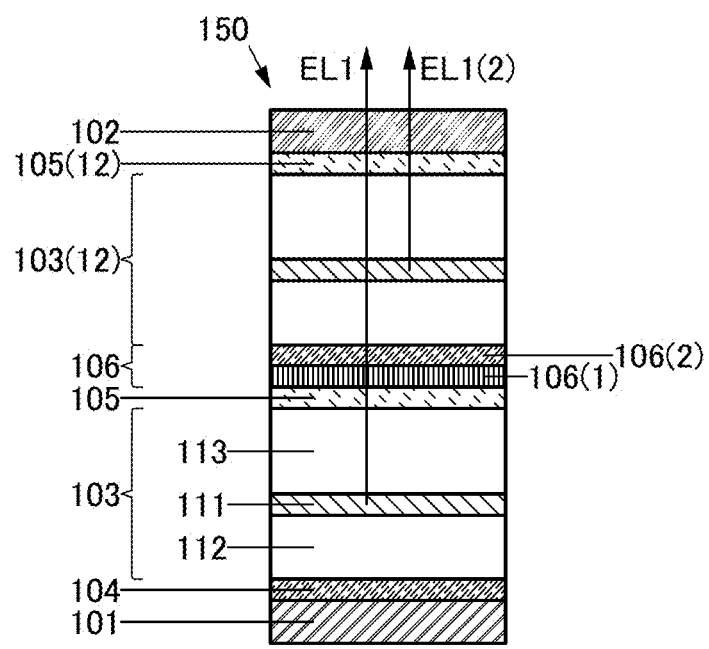

FIG. 32B is a cross-sectional view illustrating a structure of a light-emitting device of one embodiment of the present invention, which is different from that in FIG. 32A.

<Structure Example of Light-Emitting Device 150>

The light-emitting device 150 described in this embodiment includes the electrode 101, the electrode 102, the unit 103, the layer 106, and a unit 103(12) (see FIG. 32B). The electrode 102 includes a region overlapping with the electrode 101, the unit 103 includes a region between the electrode 101 and the electrode 102, and the layer 106 includes a region between the unit 103 and the electrode 102. The unit 103(12) includes a region between the layer 106 and the electrode 102, and the unit 103(12) has a function of emitting light EL1(2).

A structure including the layer 106 and a plurality of units is referred to as a stacked light-emitting device or tandem light-emitting device in some cases. This structure enables high luminance emission while the current density is kept low. Reliability can be improved. The driving voltage can be reduced in comparison with that of the light-emitting device with the same luminance. The power consumption can be reduced.

<<Structure Example of Unit 103(12)>>

The structure that can be employed for the unit 103 can also be employed for the unit 103(12). In other words, the light-emitting device 150 includes a plurality of units that are stacked. Note that the number of stacked units is not limited to two and may be three or more.

The same structure as the unit 103 can be employed for the unit 103(12). Alternatively, a structure different from the unit 103 can be employed for the unit 103(12).

For example, a structure which exhibits a different emission color from that of the unit 103 can be employed for the unit 103(12). Specifically, the unit 103 emitting red light and green light and the unit 103(12) emitting blue light can be employed. With this structure, a light-emitting device emitting light of a desired color can be provided. A light-emitting device emitting white light can be provided, for example.

<<Structure Example of Layer 106>>

The layer 106 has a function of supplying electrons to one of the unit 103 and the unit 103(12) and supplying holes to the other. For example, the layer 106 described in Embodiment 7 can be used.

<Fabrication Method for Light-Emitting Device 150>

For example, each of the electrode 101, the electrode 102, the unit 103, the layer 106, and the unit 103(12) can be formed by a dry process, a wet process, an evaporation method, a droplet discharge method, a coating method, or a printing method. A formation method may differ between components of the device.

Specifically, the light-emitting device 150 can be manufactured with a vacuum evaporation machine, an ink-jet machine, a coating machine such as a spin coater, a gravure printing machine, an offset printing machine, a screen printing machine, or the like.

For example, the electrode can be formed by a wet process or a sol-gel method using a paste of a metal material. An indium oxide-zinc oxide film can be formed by a sputtering method using a target obtained by adding zinc oxide to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

Note that this embodiment can be combined with any of the other embodiments in this specification as appropriate.

Embodiment 9

In this embodiment, a structure of a data processing device of one embodiment of the present invention will be described with reference to the drawings.

Figure 33A:
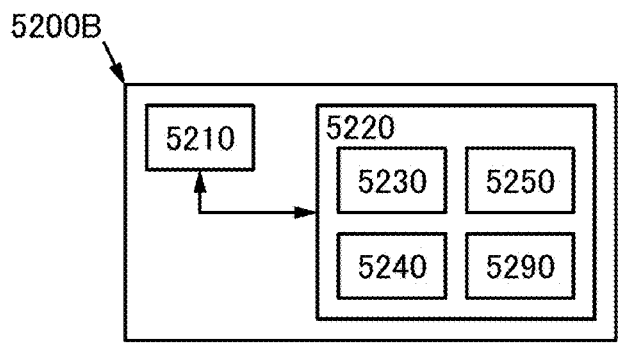
FIGS. 33A to 33E each illustrate a structure of a data processing device in Embodiment.
Figure 33B:
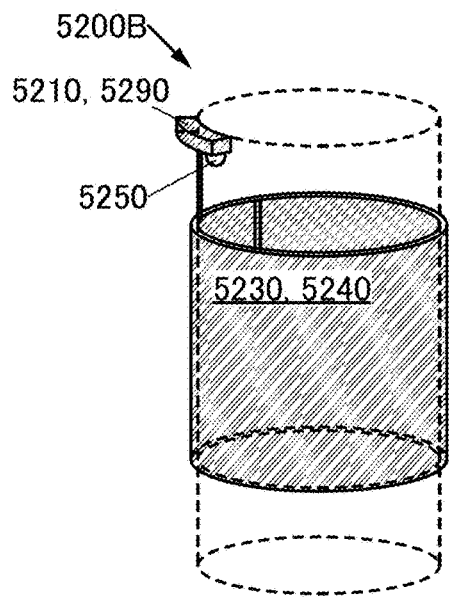
Figure 33C:
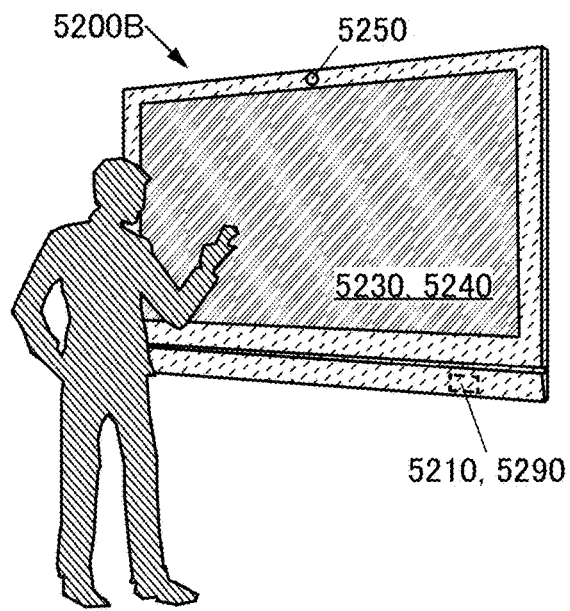
Figure 33D:
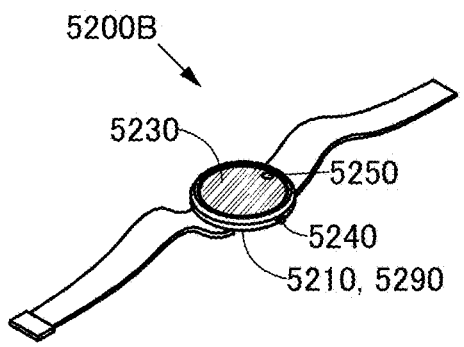
Figure 33E:
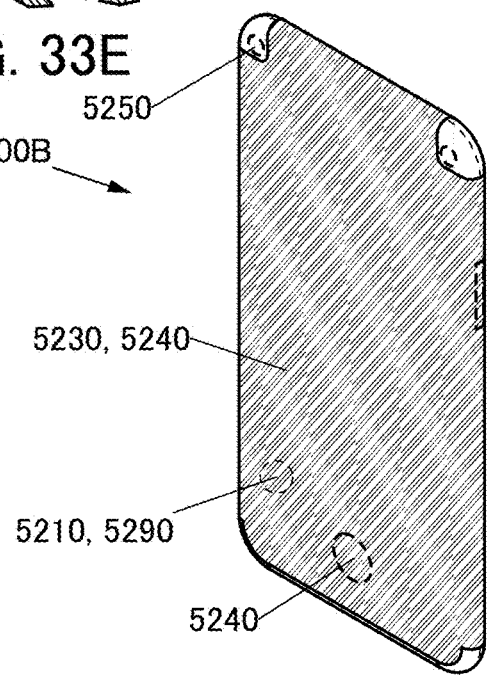
Figure 34A:
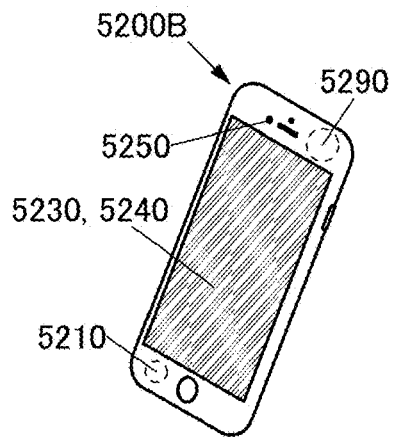
FIGS. 34A to 34E each illustrate a structure of a data processing device in Embodiment.
Figure 34B:
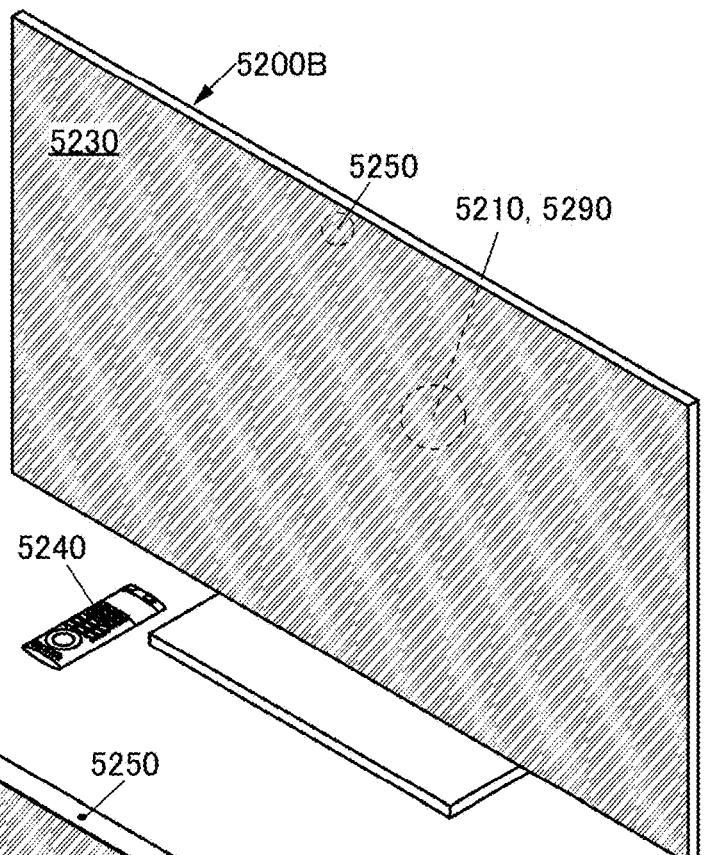
Figure 34C:
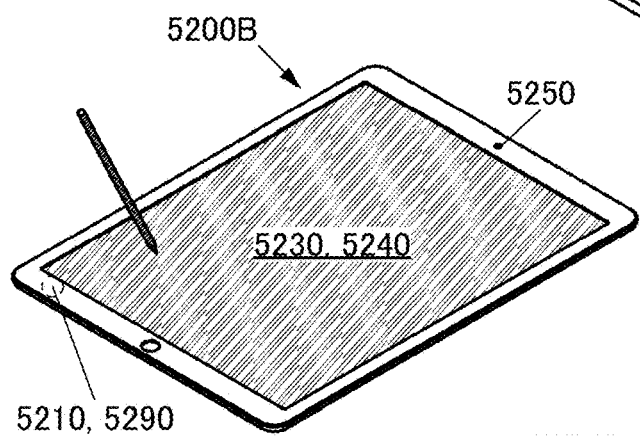
Figure 34D:
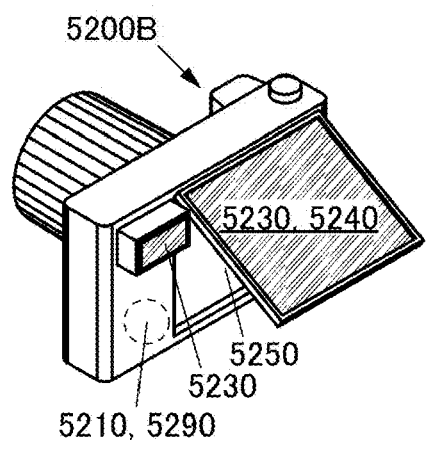
Figure 34E:
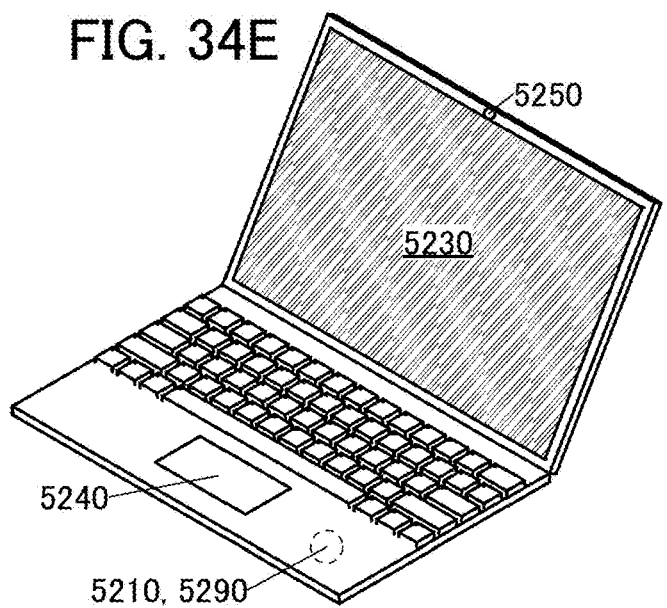
Figure 35A:
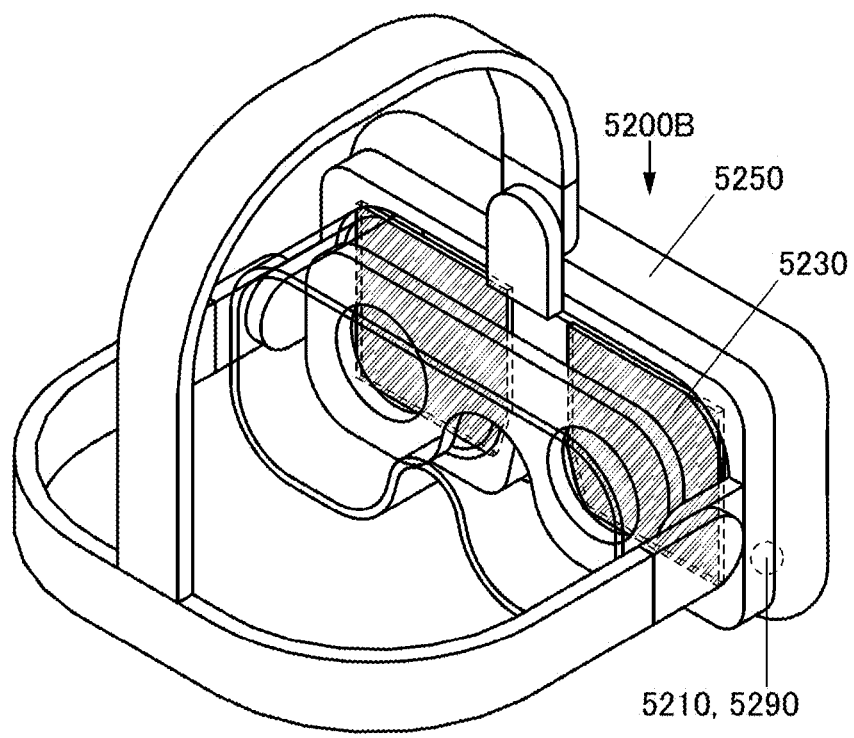
FIGS. 35A and 35B each illustrate a structure of a data processing device in Embodiment.
Figure 35B:
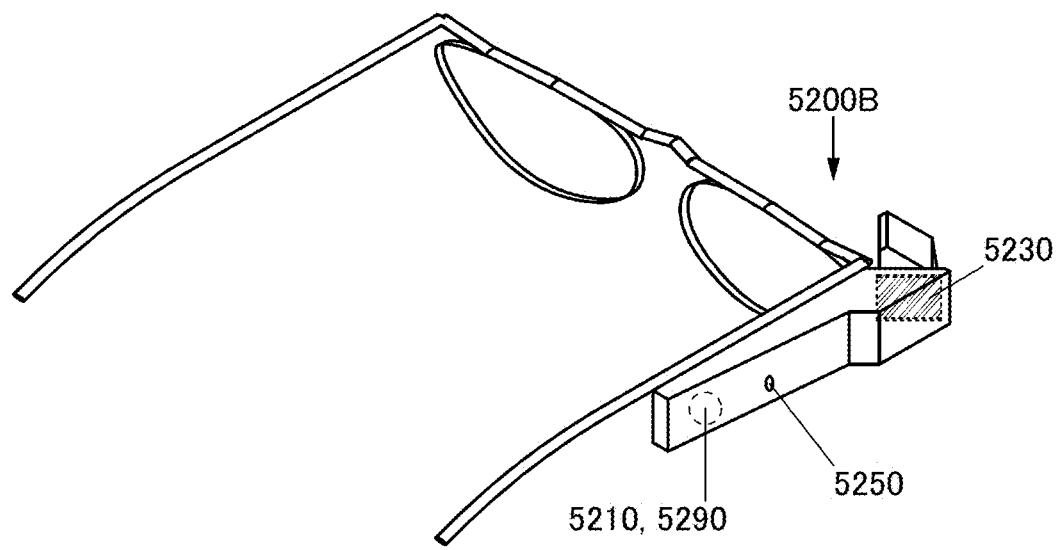

FIGS. 33A to 33E, FIGS. 34A to 34E, and FIGS. 35A and 35B illustrate structures of a data processing device of one embodiment of the present invention. FIG. 33A is a block diagram of a data processing device, and FIGS. 33B to 33E are perspective views each illustrating a structure of the data processing device. FIGS. 34A to 34E are perspective views each illustrating a structure of the data processing device. FIGS. 35A and 35B are perspective views each illustrating a structure of the data processing device.

<Data Processing Device>

A data processing device 5200B described in this embodiment includes an arithmetic device 5210 and an input/output device 5220 (see FIG. 33A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in any of Embodiment 1 can be used in the display unit 5230.

The sensor unit 5250 has a function of supplying sensing data. For example, the sensor unit 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, or near field communication, for example.

<<Structure Example 1 of Data Processing Device>>

For example, the display unit 5230 can have an outer shape along a cylindrical column (see FIG. 33B). The data processing device has a function of changing its display method in accordance with the illuminance of a usage environment. In addition, the data processing device has a function of changing the displayed content when sensing the existence of a person. This allows the data processing device to be provided on a column of a building, for example. The data processing device can display advertising, guidance, or the like. The data processing device can be used for digital signage or the like.

<<Structure Example 2 of Data Processing Device>>

For example, the data processing device has a function of generating image data on the basis of the path of a pointer used by a user (see FIG. 33C). Specifically, a display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

<<Structure Example 3 of Data Processing Device>>

The data processing device can receive data from another device, and the data can be displayed on the display unit 5230 (see FIG. 33D). Moreover, several options can be displayed. The user can choose some from the options and send a reply to the data transmitter. As another example, the data processing device has a function of changing its display method in accordance with the illuminance of a usage environment. Thus, it is possible to obtain a smartwatch with reduced power consumption, for example. As another example, it is possible to obtain a smartwatch which can display an image such that the smartwatch can be suitably used in an environment under strong external light, e.g., outdoors in fine weather.

<<Structure Example 4 of Data Processing Device>>

For example, the display unit 5230 has a surface gently curved along a side surface of a housing (see FIG. 33E). The display unit 5230 includes a display panel that is capable of displaying an image on the front surface, the side surfaces, the top surface, and the rear surface, for example. Thus, it is possible to obtain a mobile phone that can display image data on not only its front surface but also its side surfaces, top surface, and rear surface, for example.

<<Structure Example 5 of Data Processing Device>>

For example, the data processing device can receive data via the Internet and display the data on the display unit 5230 (see FIG. 34A). The user can check a created message on the display unit 5230 or send the created message to another device. As another example, the data processing device has a function of changing its display method in accordance with the illuminance of a usage environment. Thus, it is possible to obtain a smartphone with reduced power consumption. Alternatively, for example, it is possible to obtain a smartphone which can display an image such that the smartphone can be suitably used in an environment under strong external light, e.g., outdoors in fine weather.

<<Structure Example 6 of Data Processing Device>>

A remote controller can be used as the input unit 5240 (see FIG. 34B). For example, the data processing device can receive data from a broadcast station or via the Internet and display the data on the display unit 5230. Alternatively, the data processing device can take an image of the user with the sensor unit 5250 and transmit the image of the user. The data processing device can acquire a viewing history of the user and provide it to a cloud service. The data processing device can acquire recommendation data from a cloud service and display the data on the display unit 5230. A program or a moving image can be displayed on the basis of the recommendation data. As another example, the data processing device has a function of changing its display method in accordance with the illuminance of a usage environment. Accordingly, for example, it is possible to obtain a television system which can display an image such that the television system can be suitably used even when irradiated with strong external light that enters the room from the outside in fine weather.

<<Structure Example 7 of Data Processing Device>>

For example, the data processing device can receive educational materials via the Internet and display them on the display unit 5230 (see FIG. 34C). The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, the display unit 5230 can perform display using an image signal received from another data processing device. When the data processing device is placed on a stand or the like, the display unit 5230 can be used as a sub-display. Thus, for example, it is possible to obtain a tablet computer which can display an image such that the tablet computer is favorably used even in an environment under strong external light, e.g., outdoors in fine weather.

<<Structure Example 8 of Data Processing Device>>

The data processing device includes, for example, a plurality of display units 5230 (see FIG. 34D). For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The data processing device has a function of changing shooting conditions in accordance with the illuminance of a usage environment. Accordingly, for example, it is possible to obtain a digital camera that can display a subject such that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 34E). As another example, part of image data can be displayed on the display unit 5230 and another part of the image data can be displayed on a display unit of another data processing device. In addition, image signals can be supplied. Alternatively, with the communication unit 5290, data to be written can be obtained from an input unit of another data processing device. Thus, a large display region can be utilized by using a portable personal computer, for example.

<<Structure Example 10 of Data Processing Device>>

The data processing device includes, for example, the sensor unit 5250 that senses an acceleration or a direction (see FIG. 35A). The sensor unit 5250 can supply data on the position of the user or the direction in which the user faces. The data processing device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensor unit 5250 that senses an acceleration or a direction (see FIG. 35B). The sensor unit 5250 can supply data on the position of the user or the direction in which the user faces. Alternatively, the data processing device can generate image data in accordance with the position of the user or the direction in which the user faces. Accordingly, the data can be shown together with a real-world scene, for example. Alternatively, an augmented reality image can be displayed on a glasses-type data processing device.

Note that this embodiment can be combined with any of the other embodiments in this specification as appropriate.

Example 1

In this example, a structure, a fabrication method, and characteristics of a light-emitting device 1 will be described with reference to FIG. 36 to FIG. 43.

Figure 36:
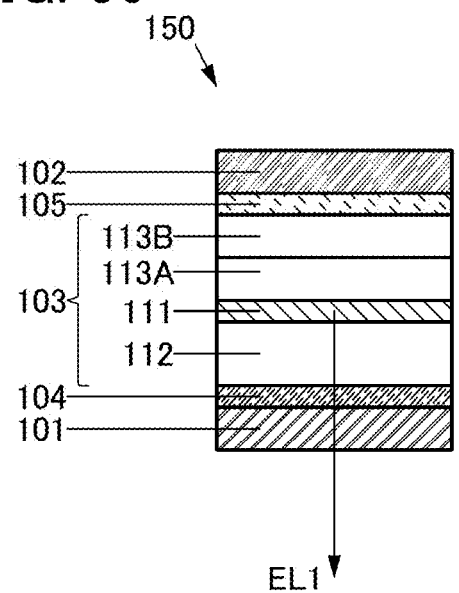
FIG. 36 is a cross-sectional view illustrating a structure of a light-emitting device in Embodiment.

FIG. 36 is a cross-sectional view illustrating a structure of a fabricated light-emitting device.

Figure 37:
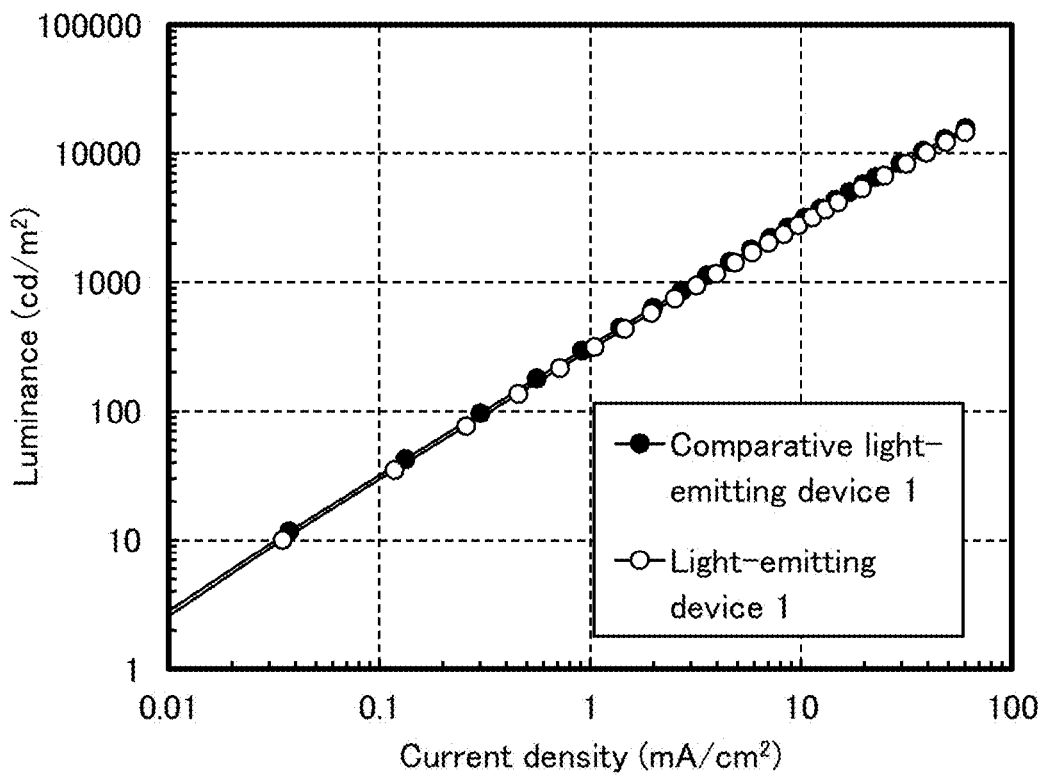
FIG. 37 shows current density-luminance characteristics of light-emitting devices in Example.

FIG. 37 shows current density-luminance characteristics of the light-emitting device 1.

Figure 38:
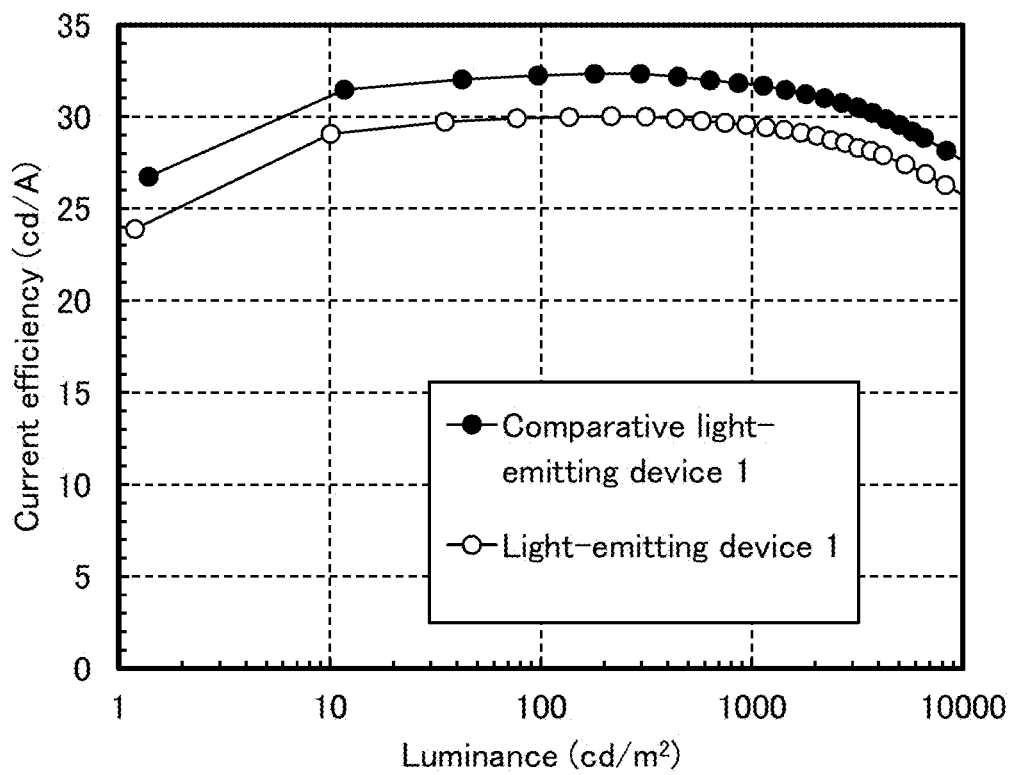
FIG. 38 shows luminance-current efficiency characteristics of light-emitting devices in Example.

FIG. 38 shows luminance-current efficiency characteristics of the light-emitting device 1.

Figure 39:
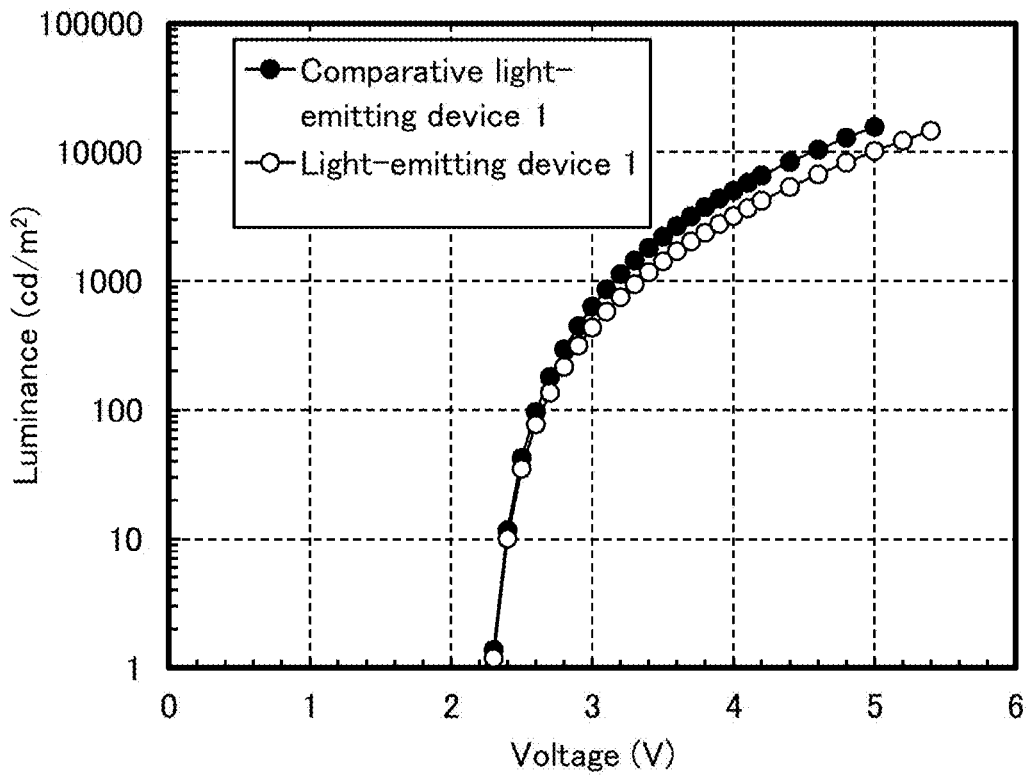
FIG. 39 shows voltage-luminance characteristics of light-emitting devices in Example.

FIG. 39 shows voltage-luminance characteristics of the light-emitting device 1.

Figure 40:
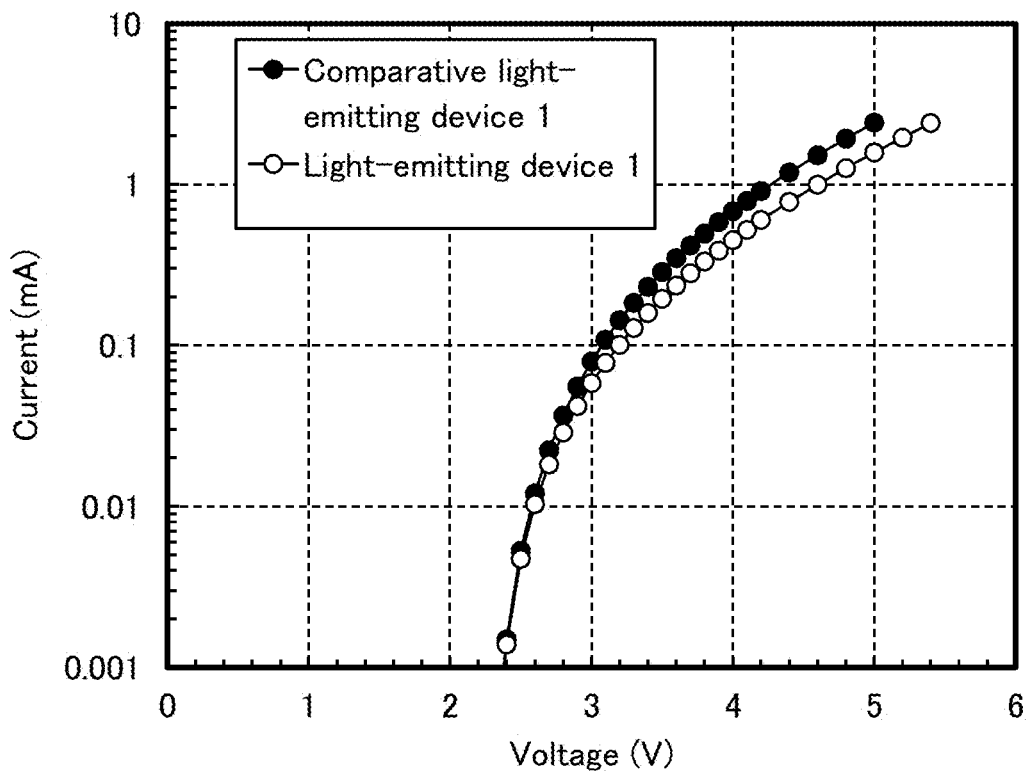
FIG. 40 shows voltage-current characteristics of light-emitting devices in Example.

FIG. 40 shows voltage-current characteristics of the light-emitting device 1.

Figure 41:
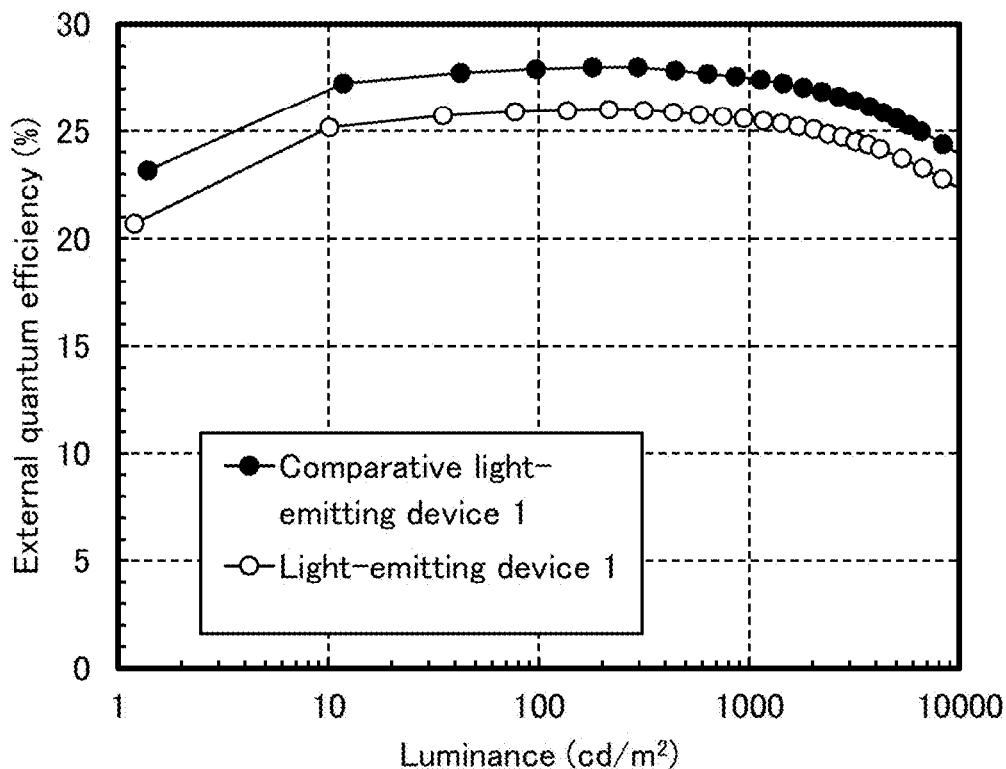
FIG. 41 shows luminance-external quantum efficiency characteristics of light-emitting devices in Example. Note that the external quantum efficiency was calculated from an emission spectrum and luminance in frontal observation assuming that the light distribution characteristics of the light-emitting devices are Lambertian type.

FIG. 41 shows luminance-external quantum efficiency characteristics of the light-emitting device 1. Note that the external quantum efficiency was calculated from an emission spectrum and luminance in frontal observation assuming that the light distribution characteristics of the light-emitting device are Lambertian type.

Figure 42:
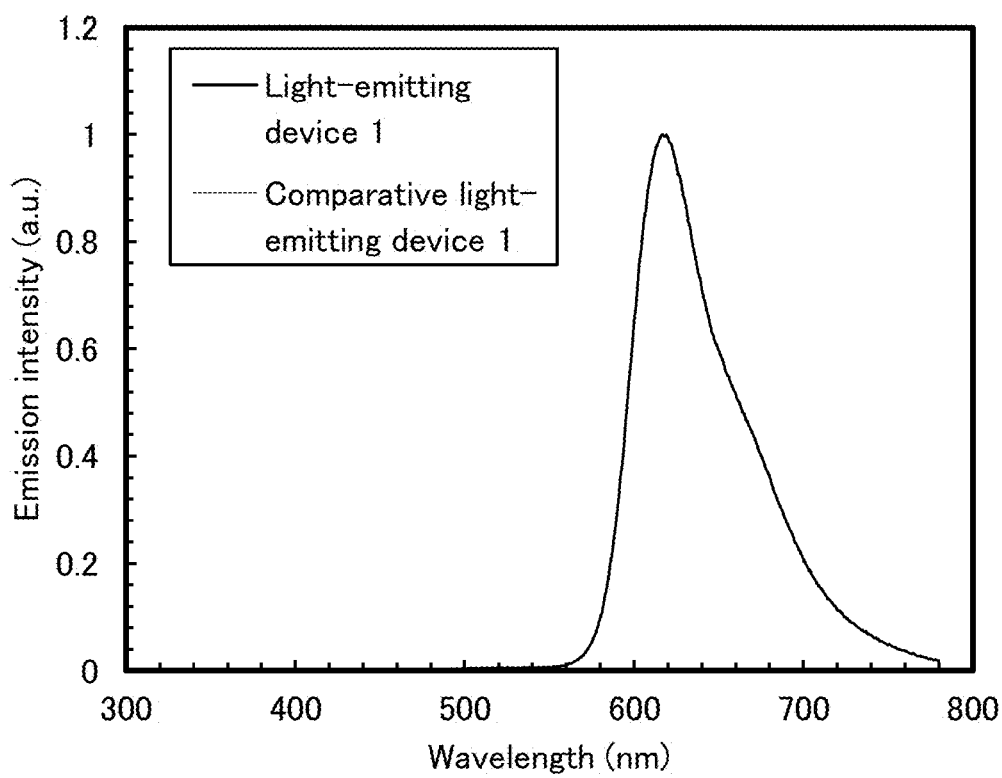
FIG. 42 shows emission spectra of light-emitting devices in Example.

FIG. 42 shows an emission spectrum of the light-emitting device 1 emitting light at a luminance of 1000 cd/m$^2$.

FIG. 43 shows optical images for explaining emission states of the light-emitting device 1 before and after 48 hour-preservation at 65° C. and a humidity of 95%.

<<Structure of Light-Emitting Device 1>>

Table 1 shows the structure of the light-emitting device 1. Structural formulae of materials used in the light-emitting devices described in this example are shown below.

TABLE 1

| Component | Reference numeral | Material | Composition ratio | Thickness/nm |
|---|---|---|---|---|
| Electrode | 102 | Al | | 200 |
| Layer | 105 | Bphen:Ag | 1:0.66 | 10 |
| Layer | 113B | Bphen | | 10 |
| Layer | 113A | 2mDBTBPDBqII | | 20 |
| Layer | 111 | 2mDBTBPDBqII: PCBBiF:Ir(dmdppr-dmp)2dpm | 0.75:0.25:0.06 | 40 |

TABLE 1-continued

| Component | Reference numeral | Material | Composition ratio | Thickness/nm |
|---|---|---|---|---|
| Layer | 112 | BPAFLP | | 20 |
| Layer | 104 | PCPPn:MoOx | 1:0.5 | 70 |
| Electrode | 101 | ITSO | | 70 |

[Chemical Formula 2]

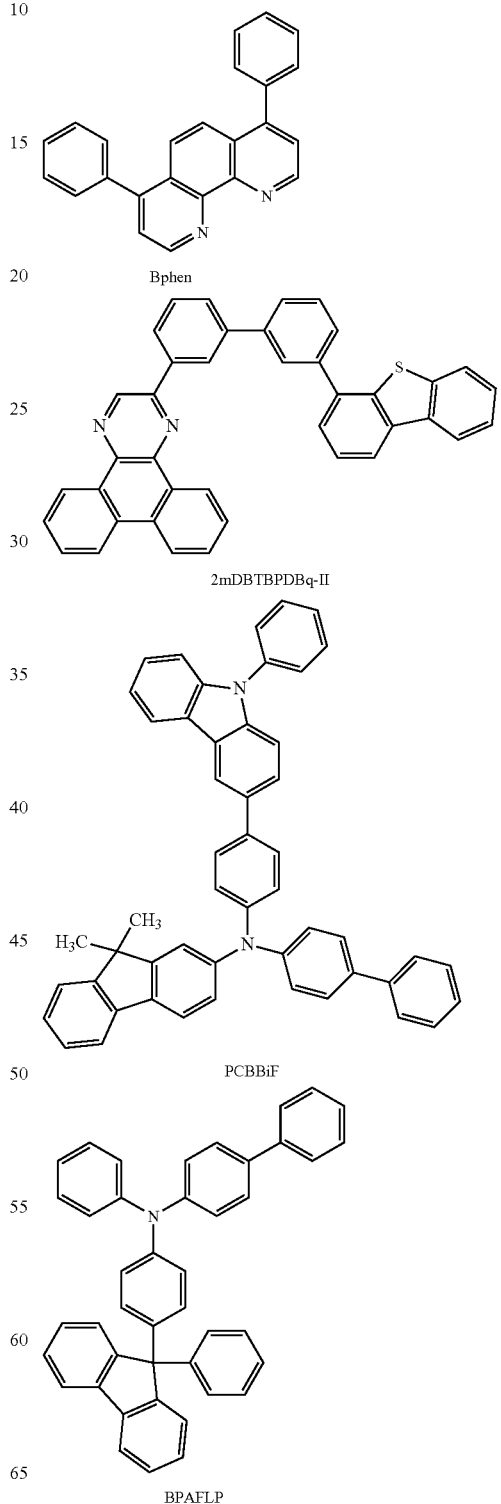

Bphen

2mDBTBPDBq-II

PCBBiF

BPAFLP

TABLE 1-continued

| Component | Reference numeral | Material | Composition ratio | Thickness/nm |
|---|---|---|---|---|

Ir(dmdppr-dmp)2(dpm)

PCPPn

<<Method for Fabricating Light-Emitting Device 1>>

The light-emitting device 1 described in this example was fabricated using a method including the following steps.

[First Step]

In the first step, the electrode 101 was formed. Specifically, the electrode 101 was formed by a sputtering method using indium oxide-tin oxide containing silicon or silicon oxide (abbreviation: ITSO) as a target.

The electrode 101 includes ITSO and has a thickness of 70 nm and an area of 4 mm² (2 mm×2 mm).

Next, a substrate over which the electrode 101 was formed was washed with water, baked at 200° C. for an hour, and then subjected to UV ozone treatment for 370 seconds. Then, the substrate was transferred into a vacuum evaporation apparatus where the pressure was reduced to approximately $10^{-4}$ Pa, and vacuum baking was performed at 170° C. for 30 minutes in a heating chamber of the vacuum evaporation apparatus. Then, the substrate was cooled down for approximately 30 minutes.

[Second Step]

In the second step, the layer 104 was formed over the electrode 101. Specifically, materials of the layer 104 were co-deposited by a resistance-heating method.

Note that the layer 104 contains 9-[4-(9-phenyl-9H-carbazol-3-yl)-phenyl]phenanthrene (abbreviation: PCPPn) and molybdenum trioxide (abbreviation: MoOx) at a weight ratio of PCPPn:MoOx=1:0.5 and has a thickness of 70 nm.

[Third Step]

In the third step, the layer 112 was formed over the layer 104. Specifically, a material was deposited by a resistance-heating method.

The layer 112 contains 4-phenyl-4'-(9-phenylfluoren-9-yl)triphenylamine (abbreviation: BPAFLP) and has a thickness of 20 nm.

[Fourth Step]

In the fourth step, the layer 111 was formed over the layer 112. Specifically, materials were co-deposited by a resistance-heating method.

The layer 111 contains 2-[3-(3'-dibenzothiophen-4-yl)biphenyl]dibenzo[f,h]quinoxaline (abbreviation: 2mDBTBPDBqII), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptanedionato-κ²O,O')iridium(III) (abbreviation: Ir(dmdppr-dmp)2 dpm) with a mass ratio of 2mDBTBPDBqII:PCBBiF:Ir(dmdppr-dmp)2 dpm=0.75: 0.25:0.06 and has a thickness of 40 nm.

[Fifth Step]

In the fifth step, a layer 113A was formed over the layer 111. Specifically, a material was deposited by a resistance-heating method.

The layer 113A contains 2mDBTBPDBqII and has a thickness of 20 nm.

[Sixth Step]

In the sixth step, a layer 113B was formed over the layer 113A. Specifically, a material was deposited by a resistance-heating method.

The layer 113B contains 4,7-diphenyl-1,10-phenanthroline (abbreviation: Bphen) and has a thickness of 10 nm.

[Seventh Step]

In the seventh step, the layer 105 was formed over the layer 113B. Specifically, materials were co-deposited by a resistance-heating method.

Note that the layer 105 contains Bphen and Ag at a weight ratio of Bphen:Ag=1:0.66 and has a thickness of 10 nm.

[Eighth Step]

In the eighth step, the electrode 102 was formed over the layer 105. Specifically, a material was deposited by a resistance-heating method.

The electrode 102 contains Al and has a thickness of 200 nm.

<<Operation Characteristics of Light-Emitting Device 1>>

The light-emitting device 1 emitted light EL1 when electric power was supplied (see FIG. 36). Operation characteristics of the light-emitting device 1 were measured (see FIG. 37 to FIG. 42). Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.) at a room temperature.

Table 2 shows main initial characteristics of the light-emitting device 1 emitting light at a luminance of approximately 1000 cd/m². Note that the initial characteristics of another light-emitting device are also shown in Table 2, and the structure is described later.

TABLE 2

|  | Voltage (V) | Current (mA) | Current density (mA/cm2) | Chromaticity x | Chromaticity y | Current efficiency (cd/A) | External quantum efficiency (%) |
|---|---|---|---|---|---|---|---|
| Light-emitting device 1 | 3.3 | 0.13 | 3.2 | 0.66 | 0.33 | 29.5 | 25.6 |
| Comparative light-emitting device 1 | 3.2 | 0.14 | 3.6 | 0.67 | 0.33 | 31.7 | 27.4 |

The light-emitting device 1 was preserved for 48 hours at 65° C. and a humidity of 95%. In the preservation period, the electrode 102 of the light-emitting device 1 was exposed to an environmental atmosphere. The emission states before and after the preservation were recorded as optical images, and a change in emission area caused between before and after the preservation was converted to numeric values using an area ratio (see FIG. 43).

It was found that the light-emitting device 1 exhibited favorable characteristics in the initial state. The light-emitting device 1 showed characteristics comparable to those of the comparative light-emitting device 1. At 65° C. and a humidity of 95%, the light-emitting device 1 had higher preservation stability than the comparative light-emitting device.

Reference Example 1

The fabricated comparative light-emitting device 1 described in this example is different in the structure of the layer 105 from the light-emitting device 1. Specifically, instead of the layer containing Bphen and Ag, a stacked structure of a layer containing Bphen and a layer containing LiF was employed for the layer 105. Specifically, a 10 nm-thick layer containing Bphen and a 1 nm-thick layer containing LiF were stacked and the layer containing LiF was positioned between the layer containing Bphen and the electrode 102.

<<Method for Fabricating Comparative Light-Emitting Device 1>>

The comparative light-emitting device 1 was fabricated by a method including steps described below.

The method for fabricating the comparative light-emitting device 1 is different from the method for fabricating the light-emitting device 1 in that a layer containing Bphen and a layer containing lithium fluoride (abbreviation: LiF) are stacked instead of the layer containing Bphen and Ag in the step of forming the layer 105. Different portions will be described in detail below, and the above description is referred to for portions where a method similar to the above was employed.

[Seventh Step]

In the seventh step, the layer 105 was formed over the layer 113B. Specifically, materials were co-deposited by a resistance-heating method.

The layer 105 has a stacked structure of a 10 nm-thick layer containing Bphen and a 1 nm-thick layer containing LiF.

Table 2 shows main initial characteristics of the comparative light-emitting device 1.

This application is based on Japanese Patent Application Serial No. 2020-202050 filed with Japan Patent Office on Dec. 4, 2020, Japanese Patent Application Serial No. 2020-216796 filed with Japan Patent Office on Dec. 25, 2020, and Japanese Patent Application Serial No. 2020-219814 filed with Japan Patent Office on Dec. 29, 2020, the entire contents of which are hereby incorporated by reference.

What is claimed is:

1. A display panel comprising:
a first light-emitting device;
a second light-emitting device;
a partition wall; and
an insulating film,
wherein the first light-emitting device comprises a first electrode, a second electrode, a first layer, a first unit, and a third layer,
wherein the second electrode overlaps with the first electrode,
wherein the first layer comprises a region sandwiched between the second electrode and the first electrode,
wherein the first unit comprises a region sandwiched between the first layer and the first electrode,
wherein the third layer comprises a region sandwiched between the first unit and the first electrode,
wherein the first layer comprises a first organic compound and a first metal,
wherein the first organic compound comprises an unshared electron pair,
wherein the first metal belongs to Group 5, Group 7, Group 9, Group 11, or Group 13,
wherein the third layer comprises a first sidewall,
wherein the second light-emitting device comprises a third electrode, a fourth electrode, a second layer, a second unit, and a fourth layer,
wherein the second unit comprises a region sandwiched between the second layer and the third electrode,
wherein the fourth layer comprises a region sandwiched between the second unit and the third electrode,
wherein the fourth electrode overlaps with the third electrode,
wherein the second layer comprises a region sandwiched between the fourth electrode and the third electrode,
wherein the second layer comprises the first organic compound and the first metal,
wherein the fourth layer comprises a second sidewall facing the first sidewall,
wherein a first space is provided between the second layer and the first layer,
wherein a second space is provided between the third layer and the fourth layer,
wherein the partition wall comprises a first opening and a second opening,
wherein the first opening overlaps with the first electrode,
wherein the second opening overlaps with the third electrode,
wherein the partition wall overlaps with the first space and the second space between the first opening and the second opening, and wherein the insulating film is in contact with the partition wall, the first sidewall, and the second sidewall.

2. The display panel according to claim 1,
wherein the third layer comprises a first hole-transport material and a first acceptor substance,
wherein the third layer has an electrical resistivity greater than or equal to $1\times10^2$ [Ω·cm] and less than or equal to $1\times10^8$ [Ω·cm], and
wherein the fourth layer comprises the first hole-transport material and the first acceptor substance.

3. The display panel according to claim 2,
wherein the first light-emitting device comprises a third unit and a first intermediate layer,
wherein the third unit comprises a region sandwiched between the second electrode and the first unit,
wherein the first intermediate layer comprises a region sandwiched between the third unit and the first unit,
wherein the first intermediate layer comprises a second hole-transport material and a second acceptor substance,
wherein the first intermediate layer has an electrical resistivity greater than or equal to $1\times10^2$ [Ω·cm] and less than or equal to $1\times10^8$[Ω·cm],
wherein the second light-emitting device comprises a fourth unit and a second intermediate layer,
wherein the fourth unit comprises a region sandwiched between the fourth electrode and the second unit,
wherein the second intermediate layer comprises a region sandwiched between the fourth unit and the second unit,
wherein the second intermediate layer comprises the second hole-transport material and the second acceptor substance,
wherein a third space is provided between the second intermediate layer and the first intermediate layer, and
wherein the partition wall overlaps with the third space between the first opening and the second opening.

4. The display panel according to claim 3,
wherein the first light-emitting device comprises a fifth layer,
wherein the fifth layer comprises a region sandwiched between the first intermediate layer and the first unit,
wherein the fifth layer comprises a second organic compound and a second metal,
wherein the second organic compound comprises an unshared electron pair,
wherein the second metal belongs to Group 5, Group 7, Group 9, Group 11, or Group 13,
wherein the second light-emitting device comprises a sixth layer,
wherein the sixth layer comprises a region sandwiched between the second intermediate layer and the second unit,
wherein the sixth layer comprises the second organic compound and the second metal,
wherein a fourth space is provided between the sixth layer and the fifth layer, and
wherein the partition wall overlaps with the fourth space between the first opening and the second opening.

5. The display panel according to claim 2,
wherein the insulating film fills the first space, and
wherein the insulating film fills a space between the first unit and the second unit.

6. The display panel according to claim 1, wherein a concentration of an alkali metal in the first layer is lower than a concentration of the first metal in the first layer.

7. The display panel according to claim 1,
wherein the first organic compound comprises an electron deficient heteroaromatic ring, and
wherein the first metal is silver.

8. The display panel according to claim 1, further comprising:
a first coloring layer; and
a second coloring layer,
wherein the first light-emitting device is configured to emit white light,
wherein the second light-emitting device is configured to emit white light,
wherein the first coloring layer overlaps with the first light-emitting device,
wherein the second coloring layer overlaps with the second light-emitting device,
wherein the first coloring layer is configured to transmit a first light,
wherein the second coloring layer is configured to transmit a second light, and
wherein a color of the first light is different from a color of the second light.

9. A data processing device comprising:
at least one of a keyboard, a hardware button, a pointing device, a touch sensor, an illuminance sensor, an imaging device, an audio input device, an eye-gaze input device, and an attitude sensing device; and
the display panel according to claim 1.

10. The display panel according to claim 1, wherein the first organic compound does not have a metal.

11. A display panel comprising:
a first light-emitting device;
a second light-emitting device;
a partition wall; and
an insulating film,
wherein the first light-emitting device comprises a first electrode, a second electrode, a first layer, a first unit, and a third layer,
wherein the second electrode overlaps with the first electrode,
wherein the first layer comprises a region sandwiched between the second electrode and the first electrode,
wherein the first unit comprises a region sandwiched between the first layer and the first electrode,
wherein the third layer comprises a region sandwiched between the first unit and the first electrode,
wherein the first layer comprises a first organic compound and a first metal,
wherein the first organic compound and the first metal form a singly occupied molecular orbital,
wherein the first organic compound comprises an unshared electron pair,
wherein the first metal belongs to Group 5, Group 7, Group 9, Group 11, or Group 13,
wherein the third layer comprises a first sidewall,
wherein the second light-emitting device comprises a third electrode, a fourth electrode, and a second layer, a second unit, and a fourth layer,
wherein the second unit comprises a region sandwiched between the second layer and the third electrode,
wherein the fourth layer comprises a region sandwiched between the second unit and the third electrode,
wherein the fourth electrode overlaps with the third electrode,
wherein the second layer comprises a region sandwiched between the fourth electrode and the third electrode,
wherein the second layer comprises the first organic compound and the first metal, wherein the fourth layer comprises a second sidewall facing the first sidewall, wherein a first space is provided between the second layer and the first layer, wherein a second space is provided between the third layer and the fourth layer, wherein the partition wall comprises a first opening and a second opening, wherein the first opening overlaps with the first electrode, wherein the second opening overlaps with the third electrode, wherein the partition wall overlaps with the first space and the second space between the first opening and the second opening, and wherein the insulating film is in contact with the partition wall, the first sidewall, and the second sidewall.

12. The display panel according to claim 11, wherein the third layer comprises a first hole-transport material and a first acceptor substance, wherein the third layer has an electrical resistivity greater than or equal to $1\times10^2$ [Ω·cm] and less than or equal to $1\times10^8$ [Ω·cm], and wherein the fourth layer comprises the first hole-transport material and the first acceptor substance.

13. The display panel according to claim 12, wherein the first light-emitting device comprises a third unit and a first intermediate layer, wherein the third unit comprises a region sandwiched between the second electrode and the first unit, wherein the first intermediate layer comprises a region sandwiched between the third unit and the first unit, wherein the first intermediate layer comprises a second hole-transport material and a second acceptor substance, wherein the first intermediate layer has an electrical resistivity greater than or equal to $1\times10^2$ [Ω·cm] and less than or equal to $1\times10^8$ [Ω·cm], wherein the second light-emitting device comprises a fourth unit and a second intermediate layer, wherein the fourth unit comprises a region sandwiched between the fourth electrode and the second unit, wherein the second intermediate layer comprises a region sandwiched between the fourth unit and the second unit, wherein the second intermediate layer comprises the second hole-transport material and the second acceptor substance, wherein a third space is provided between the second intermediate layer and the first intermediate layer, and wherein the partition wall overlaps with the third space between the first opening and the second opening.

14. The display panel according to claim 13, wherein the first light-emitting device comprises a fifth layer, wherein the fifth layer comprises a region sandwiched between the first intermediate layer and the first unit, wherein the fifth layer comprises a second organic compound and a second metal, wherein the second organic compound comprises an unshared electron pair, wherein the second metal belongs to Group 5, Group 7, Group 9, Group 11, or Group 13, wherein the second light-emitting device comprises a sixth layer, wherein the sixth layer comprises a region sandwiched between the second intermediate layer and the second unit, wherein the sixth layer comprises the second organic compound and the second metal, wherein a fourth space is provided between the sixth layer and the fifth layer, and wherein the partition wall overlaps with the fourth space between the first opening and the second opening.

15. The display panel according to claim 11, wherein an energy level of the singly occupied molecular orbital is lower than an energy level of a lowest unoccupied molecular orbital of the first organic compound within a range greater than or equal to −1.5 eV and less than 0 eV.

16. The display panel according to claim 11, wherein the first organic compound does not have a metal.

* * * * *